US012684770B2

(12) United States Patent
Nagashima et al.

(10) Patent No.: US 12,684,770 B2
(45) Date of Patent: Jul. 14, 2026

(54) SEMICONDUCTOR MEMORY DEVICE

(71) Applicant: Kioxia Corporation, Tokyo (JP)

(72) Inventors: Satoshi Nagashima, Yokkaichi Mie (JP); Hidenori Miyagawa, Yokkaichi Mie (JP); Atsushi Takahashi, Yokkaichi Mie (JP); Shota Kashiyama, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 747 days.

(21) Appl. No.: 17/692,711

(22) Filed: Mar. 11, 2022

(65) Prior Publication Data

US 2023/0091827 A1 Mar. 23, 2023

(30) Foreign Application Priority Data

Sep. 21, 2021 (JP) ................................. 2021-153521

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC .. H10B 43/00–50; H10B 41/27; H10B 41/35; H10B 41/00–70; H10B 69/00; H01L 2924/1451; H01L 29/4234–42352; H01L 29/42324–42336; H01L 29/788–7889;
H01L 2924/14511; H01L 2924/1438; H01L 29/518; H01L 29/792–7926; G11C 16/02; G11C 16/0466–0475; G11C 16/0408–0458;
(Continued)

(56) References Cited

U.S. PATENT DOCUMENTS 9,536,970 B2 * 1/2017 Seol ....................... H10B 43/20
9,768,233 B1 9/2017 Fukuda et al.
(Continued)

FOREIGN PATENT DOCUMENTS

| CN | 111293166 A | * | 6/2020 | ........... H01L 21/822 |
| TW | 202147553 A | * | 12/2021 | ............. G11C 5/025 |
| WO | WO 2020/188775 | * | 9/2020 | ........ H01L 27/11556 |

*Primary Examiner* — Jeff W Natalini
*Assistant Examiner* — Andrew John Zabel
(74) *Attorney, Agent, or Firm* — Holtz, Holtz & Volek PC

(57) ABSTRACT

A semiconductor memory device includes a substrate, a semiconductor layer extending in a first direction, a first conductive layer extending in a second direction and opposed to the semiconductor layer, an electric charge accumulating layer disposed between the semiconductor layer and the first conductive layer, and a first contact electrode extending in the first direction and connected to the first conductive layer. The first contact electrode has one end in the first direction farther from the substrate than the first conductive layer, the other end in the first direction closer to the substrate than the first conductive layer. The first conductive layer includes a first part opposed to the semiconductor layer and a second part connected to the first contact electrode. The second part has a thickness in the first direction larger than a thickness in the first direction of the first part.

8 Claims, 85 Drawing Sheets

(51) Int. Cl.

| | |
|---|---|
| *H10B 41/27* | (2023.01) |
| *H10B 41/35* | (2023.01) |
| *H10B 43/10* | (2023.01) |
| *H10B 43/35* | (2023.01) |

(58) Field of Classification Search
CPC ............. G11C 16/0483; G11C 27/005; G11C 11/5671; G11C 11/5621–5642; G11C 2216/06–10; G11C 2216/12–30; G11C 14/0018

See application file for complete search history.

(56) References Cited

U.S. PATENT DOCUMENTS

| | | | | |
|---|---|---|---|---|
| 11,563,026 | B2 * | 1/2023 | Iguchi .................... | H10B 43/10 |
| 2002/0036308 | A1 * | 3/2002 | Endoh .................... | H10B 10/00 |
| | | | | 257/305 |
| 2016/0322368 | A1 * | 11/2016 | Sun ........................ | H10B 51/20 |
| 2017/0053913 | A1 * | 2/2017 | Min .................... | H01L 29/7843 |
| 2017/0200735 | A1 * | 7/2017 | Konagai ................ | H10B 41/20 |
| 2017/0271348 | A1 * | 9/2017 | Arai .................. | H01L 21/31051 |
| 2017/0271349 | A1 * | 9/2017 | Miyagawa ............ | H10B 41/27 |
| 2019/0067319 | A1 * | 2/2019 | Yoshimizu ............ | H01L 23/528 |
| 2021/0151461 | A1 * | 5/2021 | Shim ...................... | H10B 41/35 |
| 2021/0288058 | A1 * | 9/2021 | Nishimura ............ | H10B 43/10 |
| 2022/0093636 | A1 * | 3/2022 | Murakami ............ | H10B 41/27 |
| 2022/0130754 | A1 * | 4/2022 | Nakatsuka ......... | H01L 23/5226 |
| 2022/0271054 | A1 * | 8/2022 | Nagashima ............ | H10B 43/10 |
| 2023/0082844 | A1 * | 3/2023 | Okumura .............. | H10B 43/50 |
| | | | | 257/314 |

* cited by examiner 110A
101
110A
101
110A
101
110A
101
110A
101
110A
101
110A
101
110A 101
110A
101
110A
101
110A
101
110A
101
110A
101
110A
101
110A
101
110A
101

SEMICONDUCTOR MEMORY DEVICE

CROSS-REFERENCE TO RELATED APPLICATIONS

This application is based upon and claims the benefit of Japanese Patent Application No. 2021-153521, filed on Sep. 21, 2021, the entire contents of which are incorporated herein by reference.

BACKGROUND

Field

Embodiments described herein relate generally to a semiconductor memory device.

Description of the Related Art

There has been known a semiconductor memory device that includes a substrate, a semiconductor layer extending in a direction intersecting with a surface of this substrate, a conductive layer opposed to this semiconductor layer, and an electric charge accumulating layer disposed between the semiconductor layer and the conductive layer.

BRIEF DESCRIPTION OF THE DRAWINGS

FIG. 84 is a schematic plan view illustrating a configuration of a part of the semiconductor memory device according to the twelfth embodiment.

DETAILED DESCRIPTION

Figure 1:
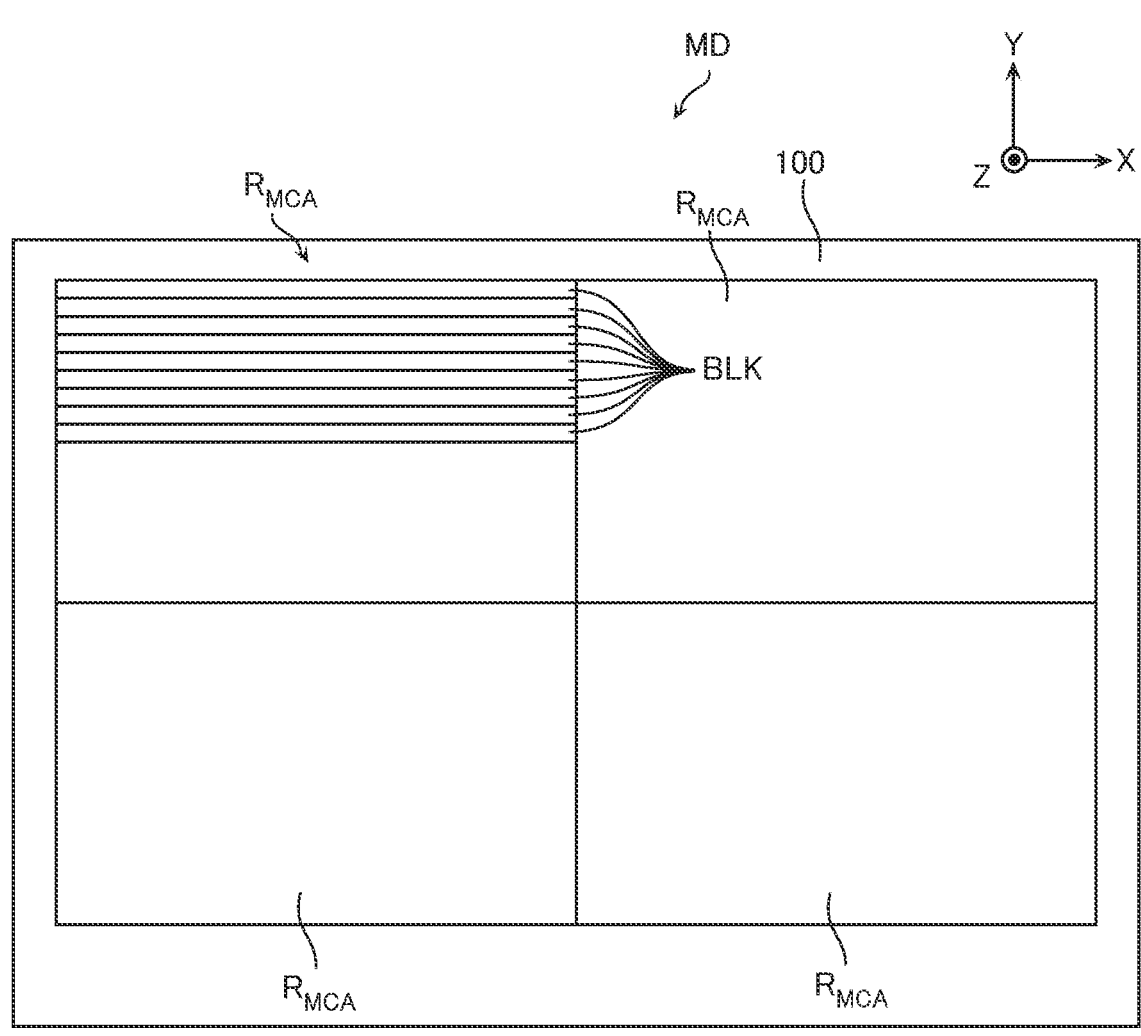
FIG. 1 is a schematic plan view illustrating a part of a configuration of a semiconductor memory device according to a first embodiment.

A semiconductor memory device according to one embodiment comprises a substrate, a semiconductor layer, a first conductive layer, an electric charge accumulating layer, and a first contact electrode. The semiconductor layer extends in a first direction intersecting with a surface of the substrate. The first conductive layer extends in a second direction intersecting with the first direction and is opposed to the semiconductor layer. The electric charge accumulating layer is disposed between the semiconductor layer and the first conductive layer. The first contact electrode extends in the first direction and is connected to the first conductive layer. The first contact electrode has one end in the first direction farther from the substrate than the first conductive layer. The first contact electrode has the other end in the first direction closer to the substrate than the first conductive layer. The first conductive layer includes a first part opposed to the semiconductor layer and a second part connected to the first contact electrode. The second part has a thickness in the first direction larger than a thickness in the first direction of the first part.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at aside opposite to the substrate of this configuration. A surface intersecting with the X-direction or the Y-direction is referred to as a side surface and the like.

In this specification, when referring to a "width", a "length", a "thickness", or the like in a predetermined direction of a configuration, a member, or the like, this may mean a width, a length, a thickness, or the like in a cross-sectional surface or the like observed with a Scanning electron microscopy (SEM), a Transmission electron microscopy (TEM), or the like.

First Embodiment

[Structure]

Figure 2:
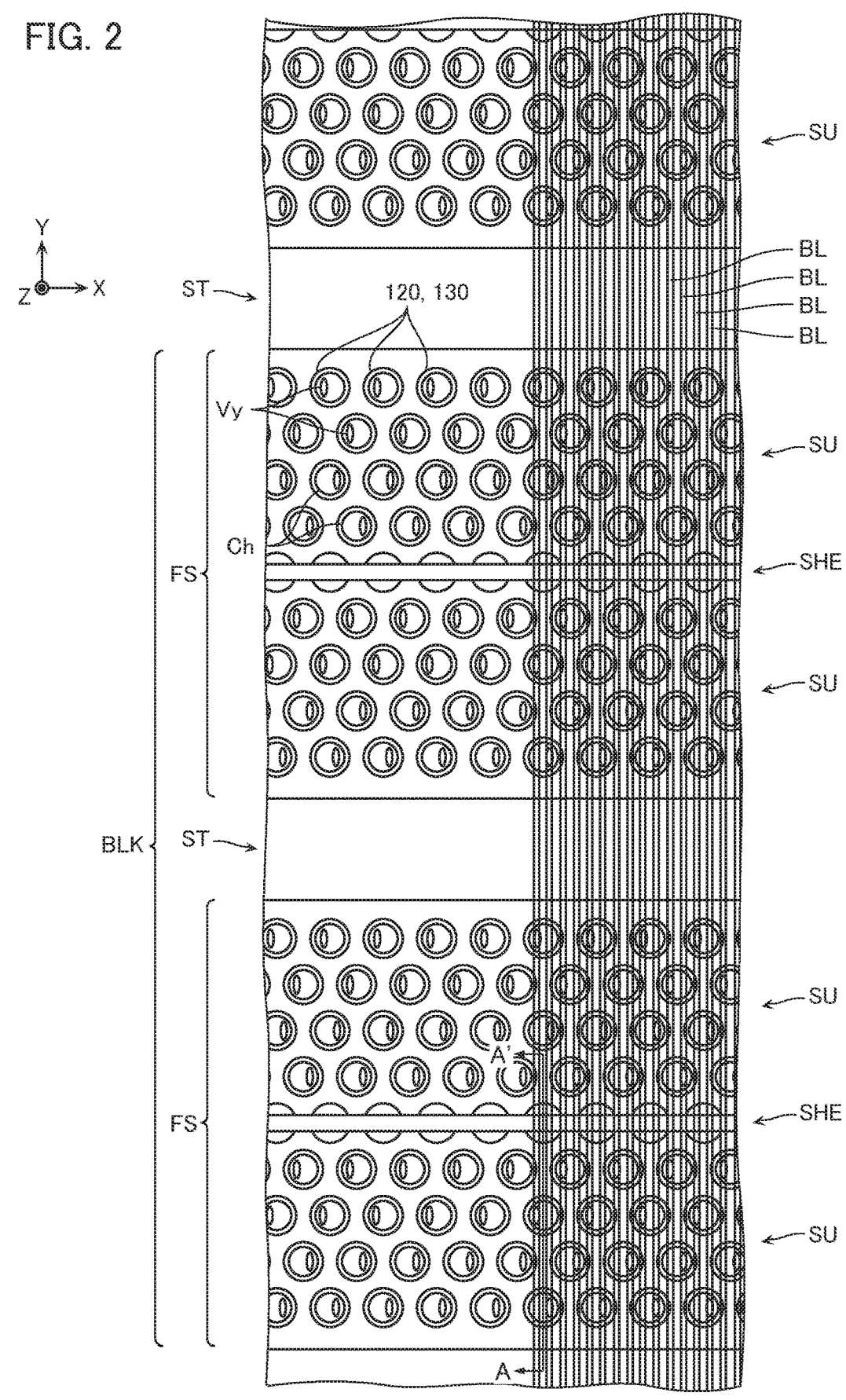
FIG. 2 is a schematic plan view illustrating an enlarged part of FIG. 1.
Figure 3:
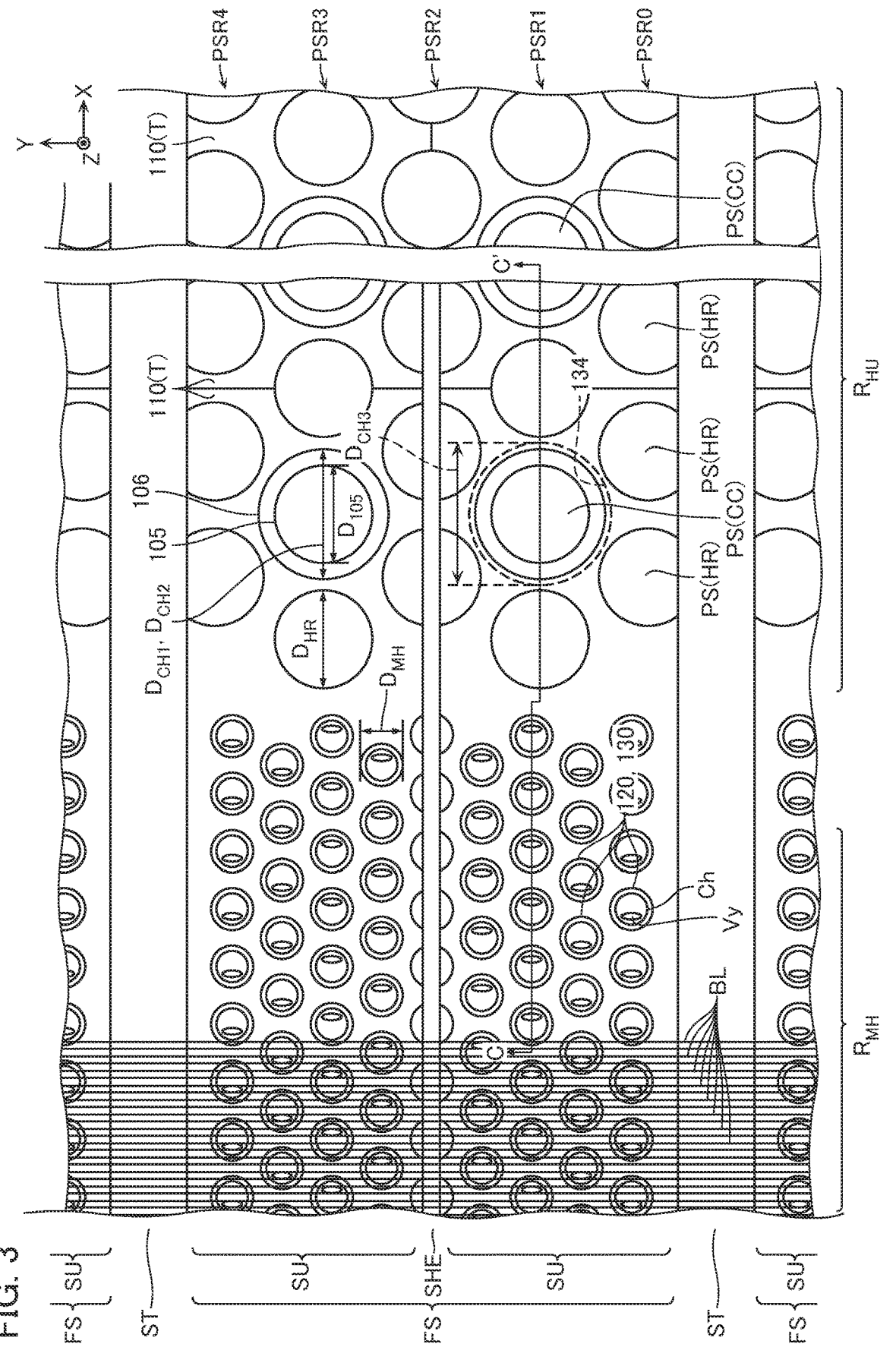
FIG. 3 is a schematic plan view illustrating an enlarged part of FIG. 1.
Figure 4:
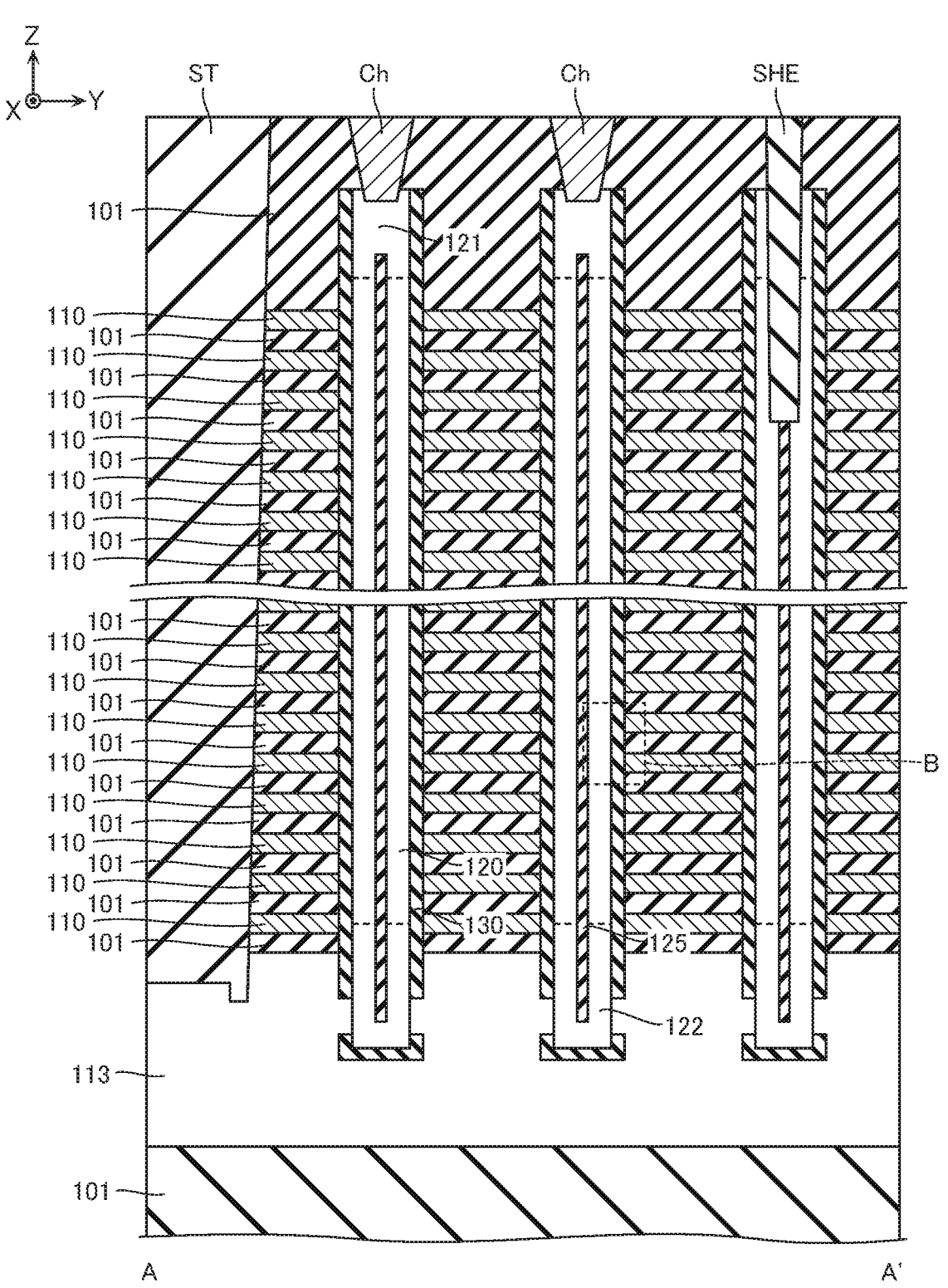
FIG. 4 is a schematic cross-sectional view taking the structure illustrated in FIG. 2 along the line A-A' and viewed in the arrow direction.
Figure 5:
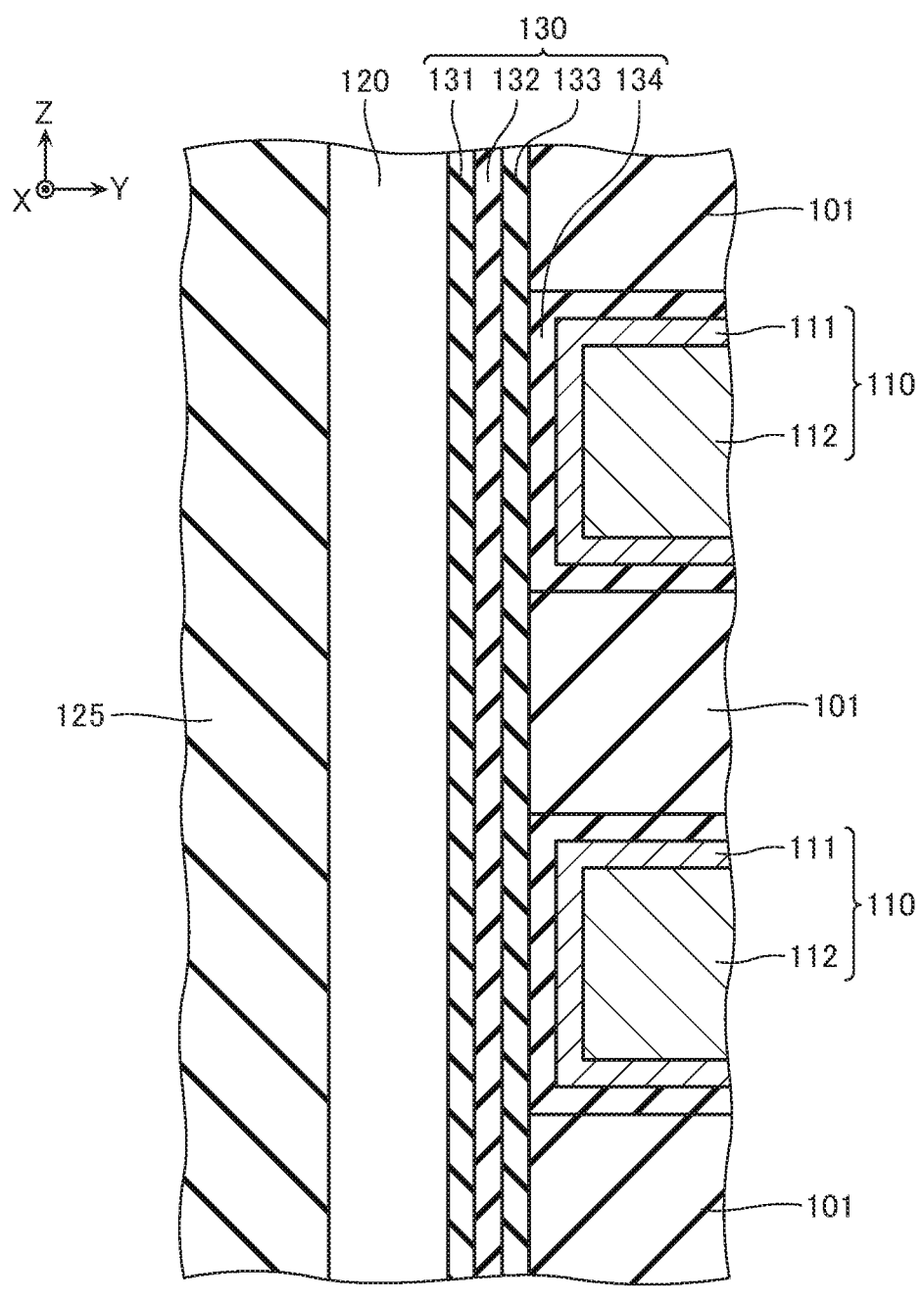
FIG. 5 is a schematic enlarged view of a part indicated by B in FIG. 4.

FIG. 1 is a schematic plan view illustrating a part of a configuration of a semiconductor memory device according to the first embodiment. FIG. 2 is a schematic plan view illustrating an enlarged part of FIG. 1. FIG. 3 is a schematic plan view illustrating an enlarged part of FIG. 1. FIG. 4 is a schematic cross-sectional view taking the structure illustrated in FIG. 2 along the line A-A' and viewed in the arrow direction. FIG. 5 is a schematic enlarged view of a part indicated by B in FIG. 4. Note that while FIG. 5 illustrates the YZ cross-sectional surface, when a cross-sectional surface taken along a center axis of a semiconductor layer 120

Figure 6:
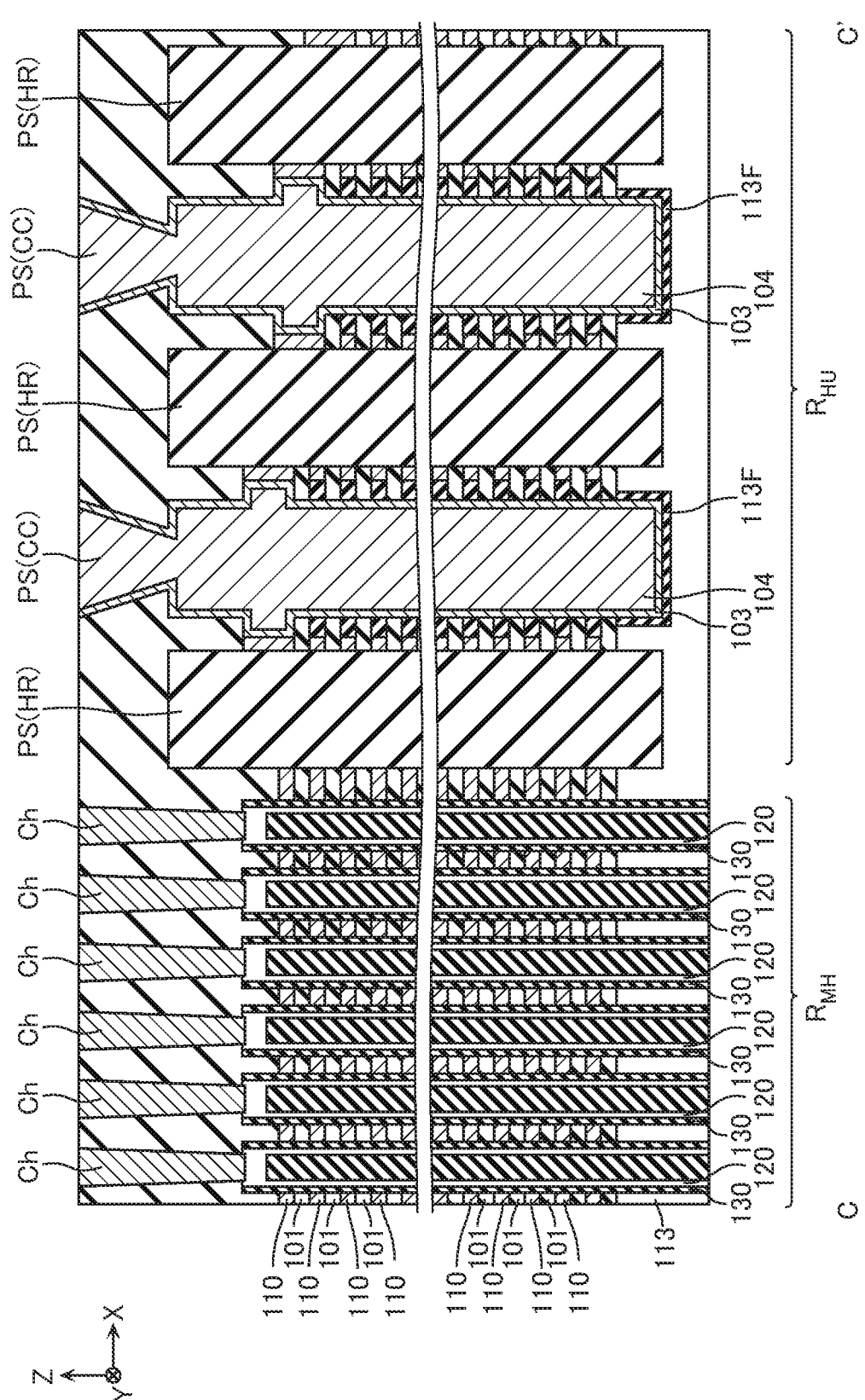
FIG. 6 is a schematic cross-sectional view taking the structure illustrated in FIG. 3 along the line C-C' and viewed in the arrow direction.
Figure 7:
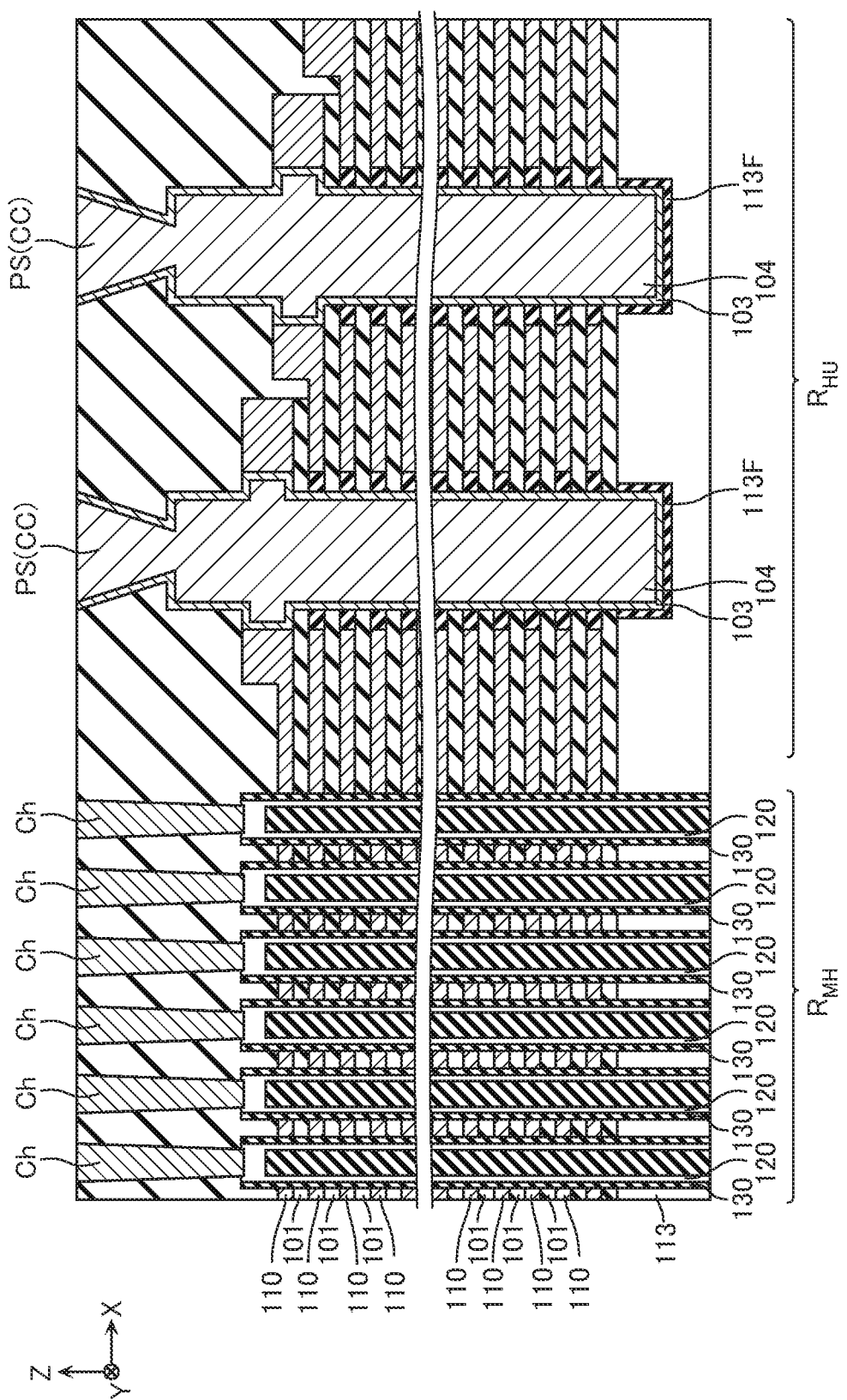
FIG. 7 is a schematic cross-sectional view illustrated with a part of a configuration omitted from FIG. 6.
Figure 8:
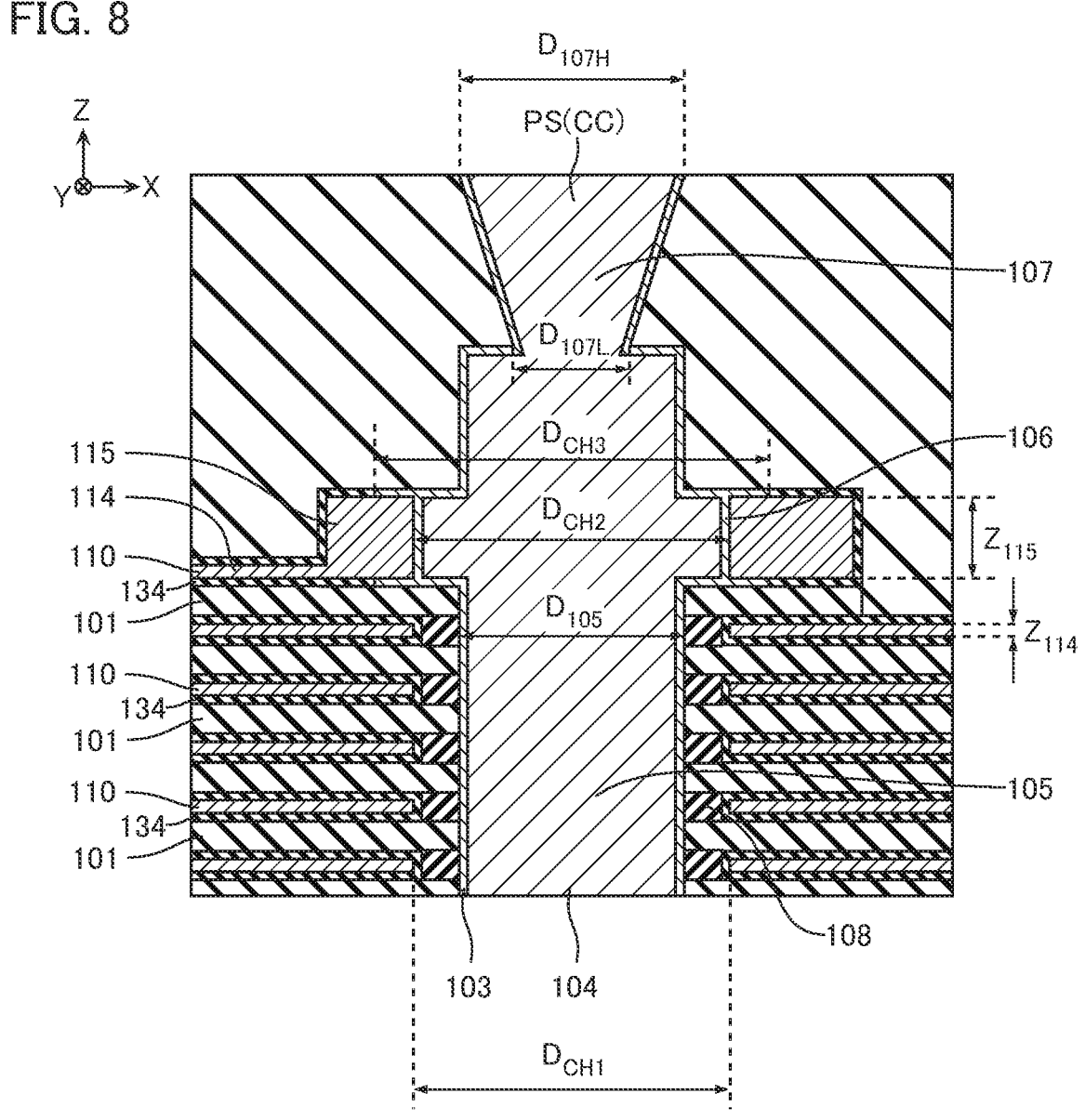
FIG. 8 is a schematic cross-sectional view illustrating an enlarged part of FIG. 7.

(for example, an XZ cross-sectional surface) other than the YZ cross-sectional surface is observed, the structure similar to FIG. 5 is observed. FIG. 6 is a schematic cross-sectional view taking the structure illustrated in FIG. 3 along the line C-C' and viewed in the arrow direction. FIG. 7 is a schematic cross-sectional view illustrated with a part of a configuration (supporting structures HR described later) omitted from FIG. 6. FIG. 8 is a schematic cross-sectional view illustrating an enlarged part of FIG. 7.

The semiconductor memory device according to the first embodiment includes a memory die MD. For example, as illustrated in FIG. 1, the memory die MD includes a semiconductor substrate 100. In the illustrated example, the semiconductor substrate 100 includes four memory cell array regions $R_{MCA}$ arranged in the X-direction and the Y-direction. Each of the memory cell array regions $R_{MCA}$ includes a plurality of memory blocks BLK arranged in the Y-direction.

For example, as illustrated in FIG. 2, the memory block BLK includes two finger structures FS arranged in the Y-direction. The finger structure FS includes two string units SU arranged in the Y-direction. Between the two finger structures FS adjacent in the Y-direction, an inter-finger structure insulating layer ST of, for example, silicon oxide ($SiO_2$) extending in the X-direction is disposed. Between the two string units SU adjacent in the Y-direction, an inter-string unit insulating layer SHE of, for example, silicon oxide ($SiO_2$) extending in the X-direction is disposed.

For example, as illustrated in FIG. 3, the finger structure FS includes a memory hole region $R_{MH}$ and a hook-up region $R_{HU}$ arranged in the X-direction.

For example, as illustrated in FIG. 4, the memory hole region $R_{MH}$ in the finger structure FS includes a plurality of conductive layers 110 arranged in the Z-direction, a plurality of semiconductor layers 120 extending in the Z-direction, and a respective plurality of gate insulating layers 130 disposed between the plurality of conductive layers 110 and the plurality of semiconductor layers 120.

The conductive layer 110 is an approximately plate-shaped conductive layer extending in the X-direction. For example, as illustrated in FIG. 5, the conductive layer 110 may include, for example, a stacked film of a barrier conductive layer 111 of, for example, titanium nitride (TiN) and a metal layer 112 of, for example, tungsten (W). Additionally, the conductive layer 110 may include the metal layer 112 of, for example, molybdenum (Mo) and ruthenium (Ru). For example, when the conductive layer 110 includes the metal layer 112 of, for example, molybdenum (Mo), the conductive layer 110 may include the barrier conductive layer 111 of, for example, titanium nitride (TiN) or need not include it. The conductive layer 110 may contain, for example, polycrystalline silicon containing impurities, such as phosphorus (P) or boron (B). Between the plurality of conductive layers 110 arranged in the Z-direction, an insulating layer 101 of, for example, silicon oxide ($SiO_2$) is disposed.

For example, as illustrated in FIG. 4, a conductive layer 113 is disposed below the conductive layers 110. The conductive layer 113, for example, may contain polycrystalline silicon containing N-type impurities, such as phosphorus (P), or P-type impurities, such as boron (B). On a lower surface of the conductive layer 113, a conductive layer containing, for example, a metal, such as tungsten (W), or tungsten silicide, or another conductive layer may be disposed. Between the conductive layer 113 and the conductive layers 110, the insulating layers 101 of, for example, silicon oxide ($SiO_2$) are disposed.

For example, the conductive layer 113 functions as a source line of a NAND flash memory. The source line is, for example, disposed in common for all of the memory blocks BLK included in the memory cell array region $R_{MCA}$ (FIG. 1).

Among the plurality of conductive layers 110, the one or plurality of conductive layers 110 positioned as the lowermost layers function as, for example, a select gate line at a source side and gate electrodes of a plurality of select transistors at the source side of the NAND flash memory. The one or plurality of conductive layers 110 are electrically independent in every memory block BLK.

The plurality of conductive layers 110 positioned above them function as word lines and gate electrodes of a plurality of memory transistors (memory cells) of the NAND flash memory. These plurality of conductive layers 110 are each electrically independent in every memory block BLK.

The one or plurality of conductive layers 110 positioned above them function as a select gate line at a drain side and gate electrodes of a plurality of select transistors at the drain side of the NAND flash memory. These plurality of conductive layers 110 have widths in the Y-direction smaller than those of the other conductive layers 110. Between the two conductive layers 110 adjacent in the Y-direction, the inter-string unit insulating layer SHE is disposed. These plurality of conductive layers 110 are each electrically independent in every string unit SU.

For example, as illustrated in FIG. 3, the semiconductor layers 120 are arranged in a predetermined pattern in the X-direction and in the Y-direction. The semiconductor layers 120 function as channel regions of the plurality of memory transistors (memory cells) and the select transistor connected in series. The semiconductor layer 120 includes, for example, polycrystalline silicon (Si) or the like. For example, as illustrated in FIG. 4, the semiconductor layer 120 has an approximately cylindrical shape and includes an insulating layer 125 of, for example, silicon oxide at the center part. The semiconductor layers 120 have outer peripheral surfaces each surrounded by the conductive layers 110 and opposed to the conductive layers 110.

The semiconductor layer 120 includes an impurity region 121 containing N-type impurities, such as phosphorus (P), at the upper end portion. In the example of FIG. 4, boundary lines between the upper end portions of the semiconductor layers 120 and the lower end portions of the impurity regions 121 are indicated by dashed lines. The impurity regions 121 are connected to bit lines BL (FIG. 3) via contact electrodes Ch and contact electrodes Vy (FIG. 3).

At the lower end portion of the semiconductor layer 120, an impurity region 122 containing N-type impurities, such as phosphorus (P), or P-type impurities, such as boron (B), is disposed. In the example of FIG. 4, boundary lines between the lower end portions of the semiconductor layers 120 and the upper end portions of the impurity regions 122 are indicated by the dashed lines. The impurity regions 122 are connected to the conductive layer 113.

The gate insulating layer 130 has an approximately cylindrical shape that covers the outer peripheral surface of the semiconductor layer 120. For example, as illustrated in FIG. 5, the gate insulating layer 130 includes a tunnel insulating layer 131, an electric charge accumulating layer 132, a block insulating layer 133, and a part of a plurality of high-dielectric-constant insulating layers 134 stacked between the semiconductor layer 120 and the conductive layers 110. The tunnel insulating layer 131 and the block insulating layer 133 are, for example, insulating films of, for example, silicon oxide ($SiO_2$). The electric charge accumulating layer 132 is, for example, a film that can accumulate an electric charge of, for example, silicon nitride ($Si_3N_4$). The high-dielectric-constant insulating layer 134 is, for example, a film of alumina ($Al_2O_3$) or another metal oxide. The tunnel insulating layer 131, the electric charge accumulating layer 132, and the block insulating layer 133 have approximately cylindrical shapes, and extend in the Z-direction along the outer peripheral surface of the semiconductor layer 120. The plurality of high-dielectric-constant insulating layers 134 are disposed corresponding to the plurality of conductive layers 110 and are disposed on the upper surfaces, the lower surfaces, and the opposed surfaces to the semiconductor layer 120 of the conductive layers 110. In the high-dielectric-constant insulating layer 134, the part disposed on the opposed surface to the semiconductor layer 120 of the conductive layer 110 functions as a part of the gate insulating layer 130.

Note that FIG. 5 illustrates an example of the gate insulating layer 130 including the insulating electric charge accumulating layer 132 of, for example, silicon nitride. However, the gate insulating layer 130 may include, for example, a floating gate of, for example, polycrystalline silicon containing N-type or P-type impurities.

For example, as illustrated in FIG. 3, terrace regions T of the plurality of conductive layers 110 are disposed in the hook-up region $R_{HU}$ of the finger structure FS. For example, the terrace region T is a region not overlapping with the other conductive layers 110 among the conductive layers 110 viewed from above. The terrace region T includes a contact surface with a contact electrode CC described later. In the illustrated example, each of the terrace regions T is disposed at the end portion in the X-direction of the conductive layer 110. The hook-up region $R_{HU}$ in the finger structure FS includes a plurality of (five in the illustrated example) columnar structure regions PSR arranged in the Y-direction. Note that FIG. 3 illustrates these five columnar structure regions PSR as columnar structure regions PSR0 to PSR4 in the order of disposed at the negative side in the Y-direction.

Each of the plurality of columnar structure regions PSR includes a plurality of columnar structures PS arranged in the X-direction at a predetermined pitch. For example, as illustrated in FIG. 6, these plurality of columnar structures PS extend in the Z-direction.

In the example of FIG. 3, positions in the X-direction of the columnar structures PS corresponding to the odd-numbered columnar structure regions PSR0, PSR2, and PSR4 counted from one side in the Y-direction (for example, the negative side in the Y-direction) differ from positions in the X-direction of the columnar structures PS corresponding to the even-numbered columnar structure regions PSR1 and PSR3 counted from the one side in the Y-direction by the half of the predetermined pitch. Additionally, in the example of FIG. 3, the plurality of columnar structures PS are arranged in the X-direction, the direction of +40° to +80° (for example, the direction of +60°) with respect to the X-direction, and the direction of −40° to −80° (for example, the direction of −60°) with respect to the X-direction.

Hereinafter, a part of the plurality of columnar structures PS are referred to as the contact electrodes CC. Moreover, apart of the plurality of columnar structures PS are referred to as the supporting structures HR. The contact electrode CC electrically connects the conductive layer 110 and a peripheral circuit (not illustrated), and a plurality of the contact electrodes CC are disposed corresponding to the plurality of conductive layers 110. The contact electrode CC and the supporting structure HR support the configuration in the finger structure FS in a manufacturing process described later.

Next, respective structures disposed in the hook-up region $R_{HU}$ in the finger structure FS, that is, the plurality of conductive layers 110, the contact electrodes CC, and the supporting structures HR will be described.

FIG. 8 illustrates an end portion 115 in the X-direction of the conductive layer 110 and another part 114. The end portion 115, for example, may match the above-described terrace region T. The end portion 115 has a thickness $Z_{115}$ in the Z-direction larger than a thickness $Z_{114}$ in the Z-direction of the part 114.

The part 114 has a plurality of through-holes disposed corresponding to the plurality of contact electrodes CC. FIG. 8 illustrates a diameter of these plurality of through-holes as a diameter $D_{CH1}$. Additionally, the end portion 115 has a through-hole disposed corresponding to the contact electrode CC. FIG. 8 illustrates a diameter of this through-hole as a diameter $D_{CH2}$. In the illustrated diagram, the diameter $D_{CH1}$ and the diameter $D_{CH2}$ have nearly equal sizes.

The upper surface and the lower surface of the part 114 and the inner peripheral surfaces of the through-holes are covered with the high-dielectric-constant insulating layer 134 across the entire surface. Meanwhile, in the high-dielectric-constant insulating layer 134 on the upper surface and the lower surface of the end portion 115, the through-hole disposed corresponding to the contact electrode CC is disposed. FIG. 8 illustrates a diameter of this through-hole as a diameter $D_{CH3}$. In the illustrated example, the diameter $D_{CH3}$ is larger than the diameters $D_{CH1}$ and $D_{CH2}$. However, the diameter $D_{CH3}$ may be same extent to the diameters $D_{CH1}$ and $D_{CH2}$. Note that the upper surface and the lower surface of the end portion 115 are covered with a barrier conductive layer 103 described later in the region inside this through-hole. Additionally, the inner peripheral surface of the through-hole disposed in the end portion 115 is also covered with the barrier conductive layer 103 described later.

Note that the diameters $D_{CH1}$ and $D_{CH2}$, for example, can be defined by the method as follows. For example, the XY cross-sectional surface corresponding to any of the plurality of conductive layers 110 arranged in the Z-direction is observed with SEM, TEM, or the like (see FIG. 3). Next, in this XY cross-sectional surface, a circle is applied along the through-hole corresponding to the contact electrode CC of the conductive layer 110. Among these through-holes, a diameter of the circle applied to the through-hole not in contact with the contact electrode CC may be the diameter $D_{CH1}$. Additionally, among these through-holes, a diameter of the circle applied to the through-hole in contact with the contact electrode CC may be the diameter $D_{CH2}$.

To define the diameters $D_{CH1}$ and $D_{CH2}$ by this method, a height position of the XY cross-sectional surface corresponding to the diameter $D_{CH2}$ is preferably close to a height position of the XY cross-sectional surface corresponding to the diameter $D_{CH1}$. For example, when the diameter $D_{CH2}$ is defined based on the XY cross-sectional surface corresponding to the conductive layer 110 disposed at a certain height position, the diameter $D_{CH1}$ is preferably defined based on the XY cross-sectional surface corresponding to the conductive layer 110 adjacent to this conductive layer 110 in the Z-direction. However, it is possible to define the diameters $D_{CH1}$ and $D_{CH2}$ based on the XY cross-sectional surface corresponding to another height position.

The diameter $D_{CH3}$, for example, can be defined by the method as follows. For example, the XY cross-sectional surface corresponding to the high-dielectric-constant insulating layer 134 is observed with SEM, TEM, or the like (see FIG. 3). Next, in this XY cross-sectional surface, a circle is applied along the through-hole corresponding to the contact electrode CC of the high-dielectric-constant insulating layer 134. The diameter of this through-hole may be the diameter $D_{CH3}$.

To define the diameter $D_{CH3}$ by this method, a height position of the XY cross-sectional surface corresponding to the diameter $D_{CH2}$ is preferably close to a height position of the XY cross-sectional surface corresponding to the diameter $D_{CH3}$. For example, when the diameter $D_{CH2}$ is defined based on the XY cross-sectional surface corresponding to the conductive layer 110 disposed at a certain height position, the diameter $D_{CH3}$ is preferably defined based on the XY cross-sectional surface corresponding to the high-dielectric-constant insulating layer 134 covering the upper surface or the lower surface of this conductive layer 110. However, it is possible to define the diameter $D_{CH3}$ based on the XY cross-sectional surface corresponding to another height position.

The contact electrode CC may include, for example, a stacked film of the barrier conductive layer 103 of, for example, titanium nitride (TiN) and the metal layer 104 of, for example, tungsten (W), molybdenum (Mo), and ruthenium (Ru).

The contact electrode CC includes an approximately columnar shaped part 105 extending in the Z-direction, an approximately disk-shaped part 106 connected to this part 105, and an approximately conical shaped part 107 connected to the upper end of the part 105.

The part 105 extends in the Z-direction. The upper end of the part 105 is disposed above the upper surface of the conductive layer 110 disposed as the uppermost layer among the plurality of conductive layers 110. For example, as illustrated in FIG. 6, the lower end of the part 105 is disposed downward of the lower surface of the conductive layer 110 disposed as the lowermost layer among the plurality of conductive layers 110. Note that between the lower end of the part 105 and the conductive layer 113, an insulating layer 113F of, for example, silicon oxide ($SiO_2$) is disposed. The outer peripheral surface of the part 105 is in contact with the plurality of insulating layers 101 arranged in the Z-direction and a plurality of insulating layers 108 arranged in the Z-direction corresponding to the plurality of conductive layers 110. The insulating layers 108 are disposed between the part 105 and the conductive layers 110 and contains, for example, silicon oxide ($SiO_2$). Note that in the illustrated example, a diameter $D_{105}$ of the part 105 is smaller than the diameter $D_{CH2}$ of the through-hole of the end portion 115. Note that the diameter $D_{105}$ of the part 105 is equal to or larger than a diameter $D_{MH}$ (FIG. 3) of the gate insulating layer 130.

Note that the diameter $D_{105}$, for example, can be defined by the method as follows. For example, the XY cross-sectional surface corresponding to any of the plurality of conductive layers 110 arranged in the Z-direction is observed with SEM, TEM, or the like (see FIG. 3). This cross-sectional surface may be, for example, same as or different from the XY cross-sectional surface that defines the diameter $D_{CH1}$. Next, in this XY cross-sectional surface, a circle is applied along the outer peripheral surface of the contact electrode CC (the part 105). The diameter of this circle may be the diameter $D_{105}$.

The part 106 is disposed corresponding to the end portion 115 in the X-direction of the conductive layer 110. For example, as illustrated in FIG. 3, the outer peripheral surface of the part 106 is connected to the through-holes provided in the conductive layers 110 across the whole circumference. For example, as illustrated in FIG. 8, a width in the Z-direction of the part 106 has a size around the sum of a width $Z_{115}$ in the Z-direction of the end portion 115 and the thickness of the two high-dielectric-constant insulating layers 134. The height position of the lower surface of the part 106 matches the height position of the lower surface of the high-dielectric-constant insulating layer 134 covering the lower surface of the end portion 115. The height position of the upper surface of the part 106 matches the height position of the upper surface of the high-dielectric-constant insulating layer 134 covering the upper surface of the end portion 115.

A diameter $D_{107L}$ at the lower end of the part 107 is smaller than a diameter $D_{107H}$ at the upper end of the part 107. The diameter $D_{107L}$ differs from the diameter $D_{105}$ of the part 105. In the illustrated example, the diameter $D_{107L}$ is smaller than the diameter $D_{105}$.

Note that the diameters $D_{107L}$ and $D_{107H}$, for example, can be defined by the method as follows. For example, two XY cross-sectional surfaces including the part 107 and having different height positions are observed with SEM, TEM, or the like. Next, in these two XY cross-sectional surfaces, circles are applied along the outer peripheral surface of the part 107. The diameters of these two circles may be the diameters $D_{107L}$ and $D_{107H}$.

In the illustrated example, the barrier conductive layer 103 is continuously formed along the outer peripheral surfaces of the parts 105, 106, and 107. The metal layer 104 is continuously formed across the parts 105, 106, and 107. Note that the contact electrode CC need not include the barrier conductive layer 103. In this case, the parts 105, 106, and 107 may be formed of the metal layer 104.

The supporting structure HR may include an insulating layer of, for example, silicon oxide ($SiO_2$). As illustrated in FIG. 6, the supporting structure HR extends in the Z-direction. The upper end of the supporting structure HR is disposed above the upper surface of the conductive layer 110 disposed as the uppermost layer among the plurality of conductive layers 110. The lower end of the supporting structure HR is disposed downward of the lower surface of the conductive layer 110 disposed as the lowermost layer among the plurality of conductive layers 110. Note that the lower ends of the supporting structures HR are connected to the conductive layer 113. The outer peripheral surface of the supporting structure HR is in contact with the plurality of conductive layers 110 arranged in the Z-direction and the plurality of insulating layers 101 arranged in the Z-direction. Note that as illustrated in FIG. 3, a diameter $D_{HR}$ of the supporting structure HR may be equal to the diameter $D_{105}$ of the part 105 of the contact electrode CC. The diameter $D_{HR}$ of the supporting structure HR is larger than the diameter $D_{MH}$ of the gate insulating layer 130.

Note that the diameters $D_{MH}$ and $D_{HR}$, for example, can be defined by the method as follows. For example, the XY cross-sectional surface corresponding to any of the plurality of conductive layers 110 arranged in the Z-direction is observed with SEM, TEM, or the like (see FIG. 3). This cross-sectional surface may be, for example, same as or different from the XY cross-sectional surface that defines the diameters $D_{CH1}$ and $D_{CH2}$. Next, in this XY cross-sectional surface, a circle is applied along the outer peripheral surface of the gate insulating layer 130. The diameter of this circle may be the diameter $D_{MH}$. Additionally, in this XY cross-sectional surface, a circle is applied along the outer peripheral surface of the supporting structure HR. The diameter of this circle may be the diameter $D_{HR}$.

[Manufacturing Method]

Figure 38:
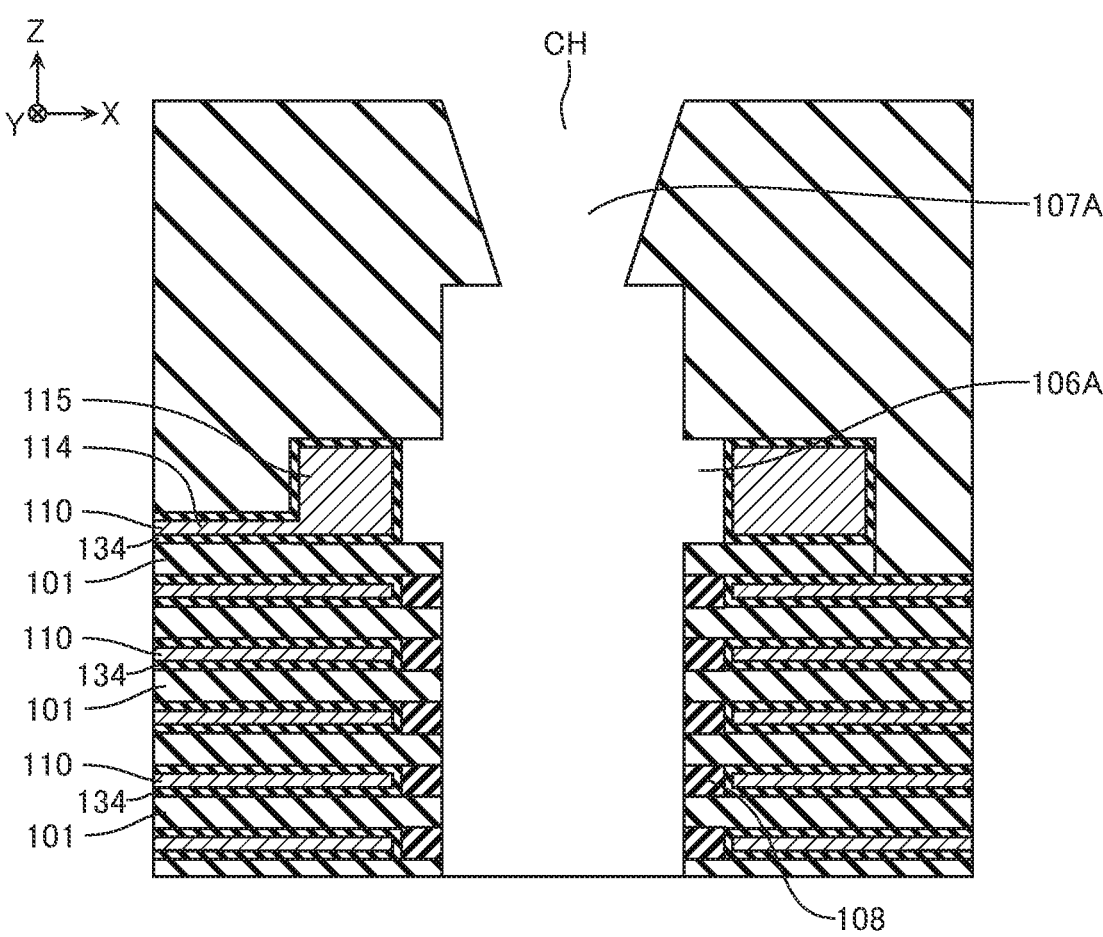
FIG. 38 is a schematic cross-sectional view to describe the manufacturing method.
Figure 39:
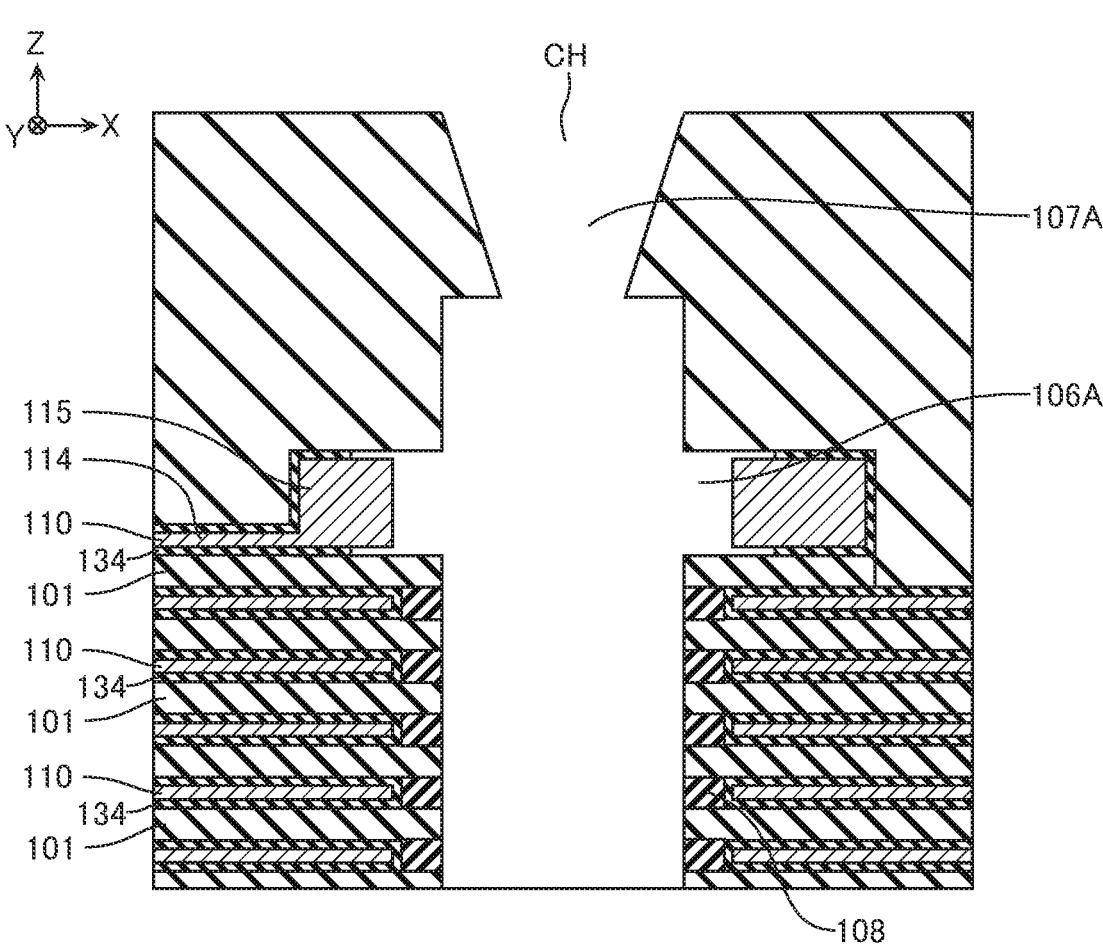
FIG. 39 is a schematic cross-sectional view to describe the manufacturing method.

Next, with reference to FIG. 9 to FIG. 39, the manufacturing method of the semiconductor memory device according to the first embodiment will be described. FIG. 9, FIG. 15 to FIG. 17, and FIG. 26 to FIG. 33 are schematic cross-sectional views to describe the manufacturing method and illustrate the cross-sectional surfaces corresponding to FIG. 4. FIG. 10 to FIG. 14, FIG. 18 to FIG. 25, and FIG. 34 to FIG. 37 are schematic cross-sectional views to describe the manufacturing method and illustrate the cross-sectional surfaces corresponding to FIG. 6. FIG. 38 and FIG. 39 are schematic cross-sectional views to describe the manufacturing method and illustrate the cross-sectional surfaces corresponding to FIG. 8.

To manufacture the semiconductor memory device according to this embodiment, first, wirings, transistor, and the like (not illustrated) constituting the peripheral circuit (not illustrated) are formed on the semiconductor substrate 100 (FIG. 1). The insulating layer 101 is formed on the upper surfaces of these structures.

Figure 9:
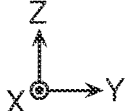
FIG. 9 is a schematic cross-sectional view to describe a manufacturing method of the semiconductor memory device according to the first embodiment.

Next, for example, as illustrated in FIG. 9, on the insulating layer 101, a semiconductor layer 113A of, for example, silicon, a sacrifice layer 113B of, for example, silicon oxide, a sacrifice layer 113C of, for example, silicon, a sacrifice layer 113D of, for example, silicon oxide, and a semiconductor layer 113E of, for example, silicon are formed. The plurality of insulating layers 101 and a plurality of sacrifice layers 110A are formed in alternation. The sacrifice layer 110A contains, for example, silicon nitride ($Si_3N_4$). This process is performed by a method, such as Chemical Vapor Deposition (CVD).

Figure 10:
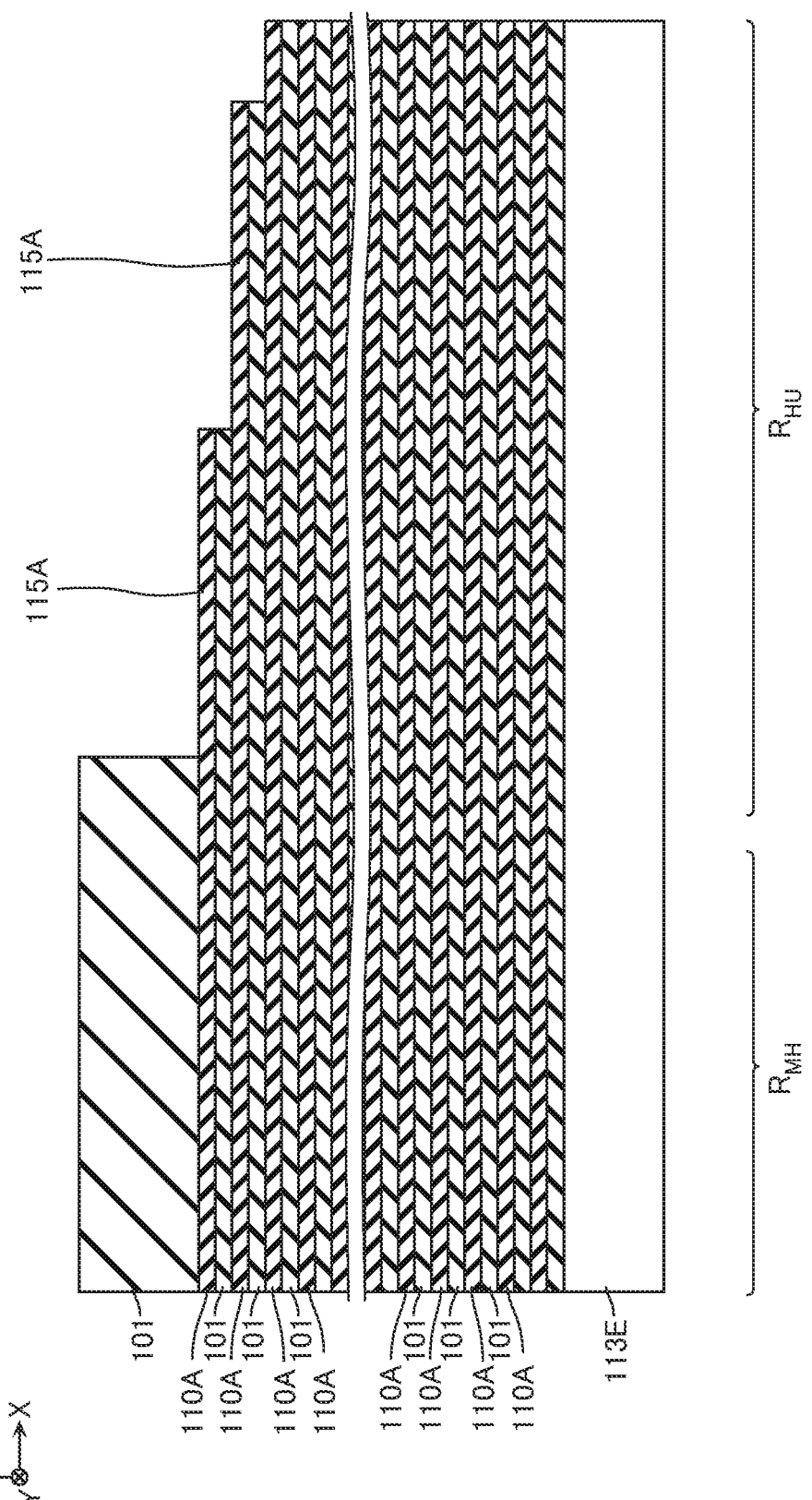
FIG. 10 is a schematic cross-sectional view to describe the manufacturing method.

Next, for example, as illustrated in FIG. 10, a structure of an approximately staircase pattern is formed in the hook-up region $R_{HU}$. In this process, for example, a resist is formed on the upper surface of the structure described with reference to FIG. 9, and patterning is performed on this resist by a method, such as photolithography. Additionally, a step of selectively removing the sacrifice layer 110A, a step of selectively removing the insulating layer 101, and a step of isotropically removing the resist are repeatedly performed. Note that in the example of FIG. 10, exposed parts of the upper surfaces of the respective sacrifice layers 110A are denoted as surfaces 115A.

Figure 11:
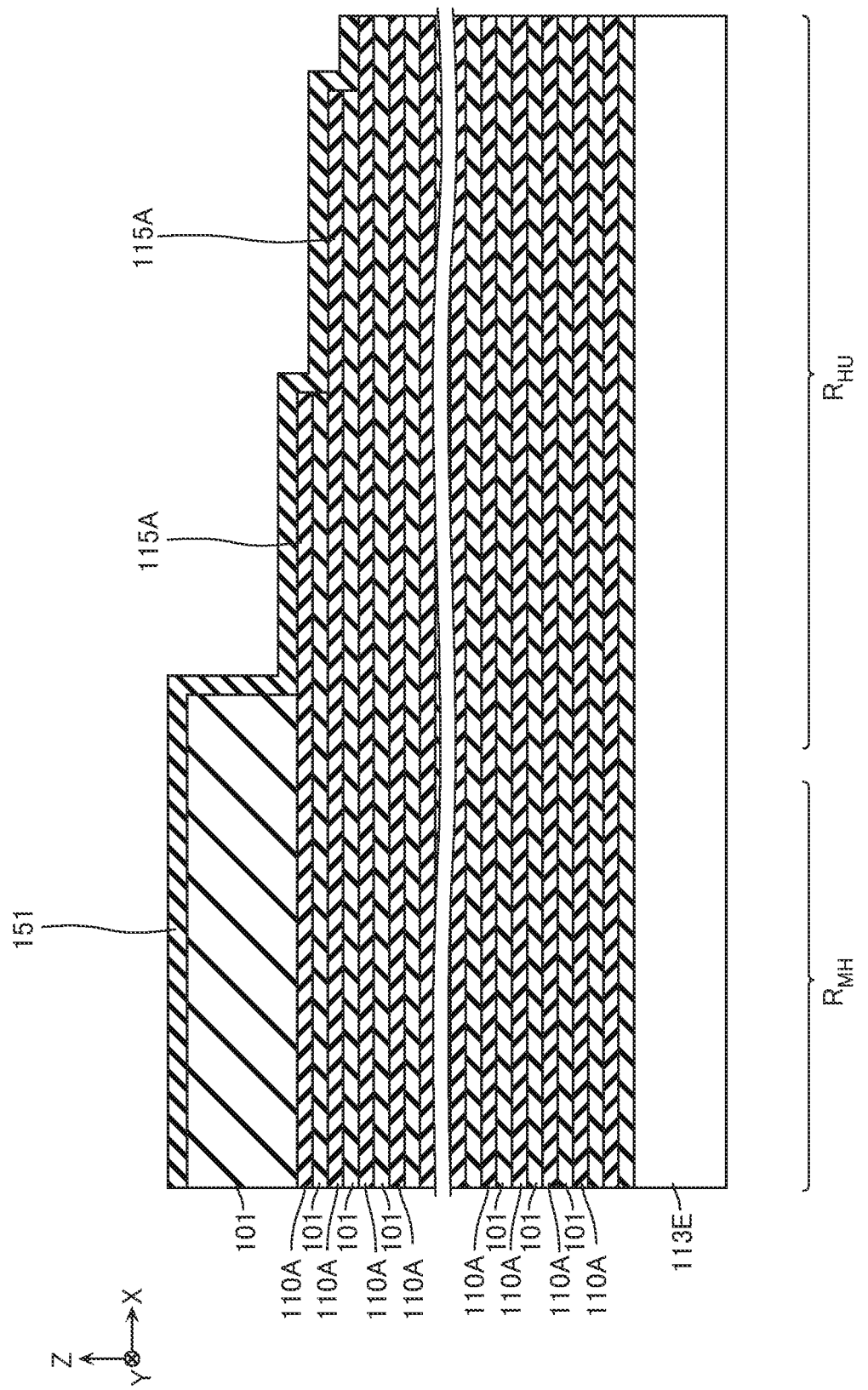
FIG. 11 is a schematic cross-sectional view to describe the manufacturing method.

Next, for example, as illustrated in FIG. 11, a hard mask 151 is formed on the structure described with reference to FIG. 10. The hard mask 151 covers the plurality of surfaces 115A, the sacrifice layers 110A, and the side surfaces of the insulating layers 101. This process is performed by a method, such as CVD.

Figure 12:
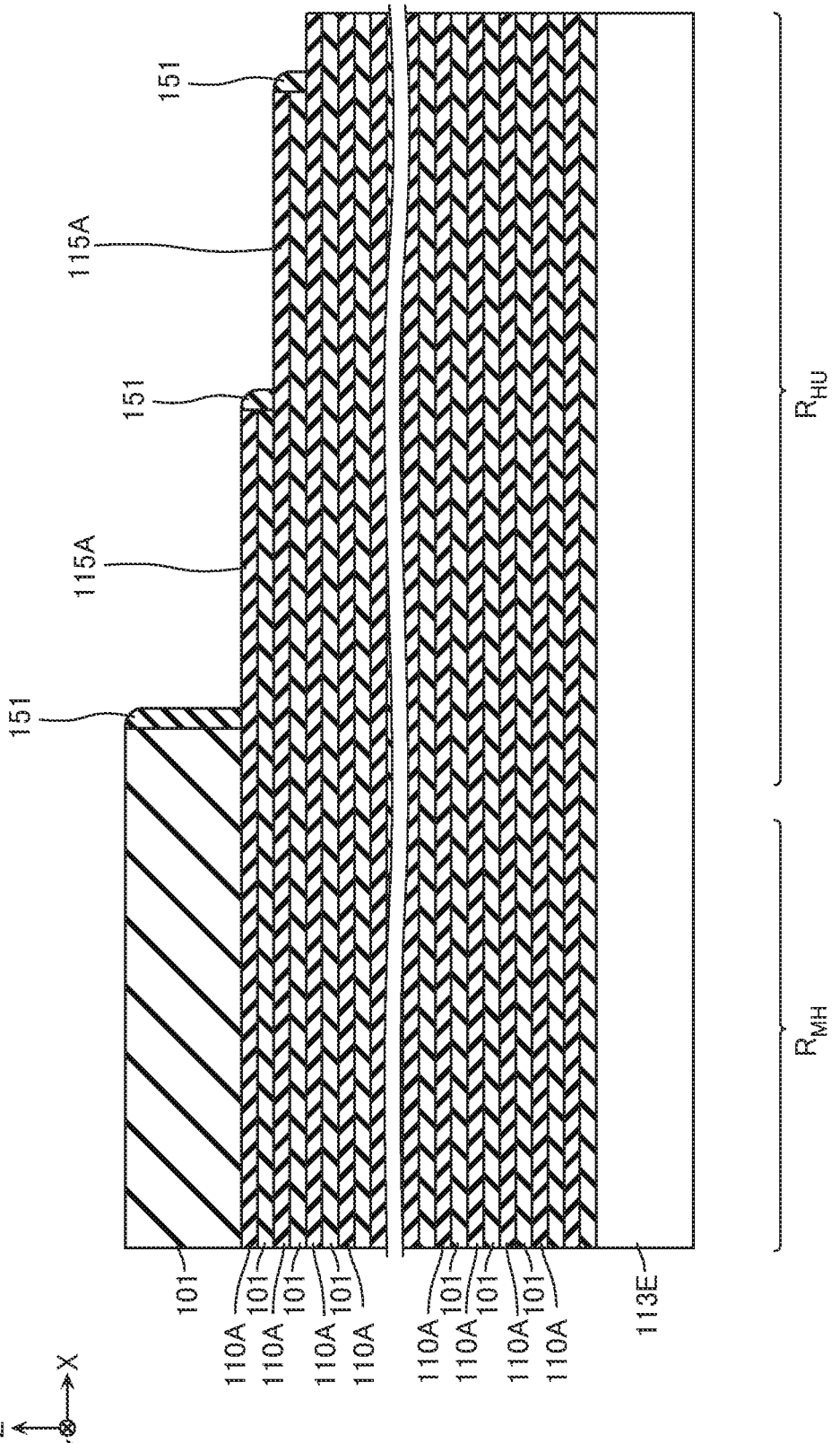
FIG. 12 is a schematic cross-sectional view to describe the manufacturing method.

Next, for example, as illustrated in FIG. 12, in the hard mask 151, the parts formed on the sacrifice layers 110A and the side surfaces of the insulating layers 101 are left, and the parts covering the plurality of surfaces 115A are selectively removed. This process is performed by a method, such as Reactive Ion Etching (RIE).

Figure 13:
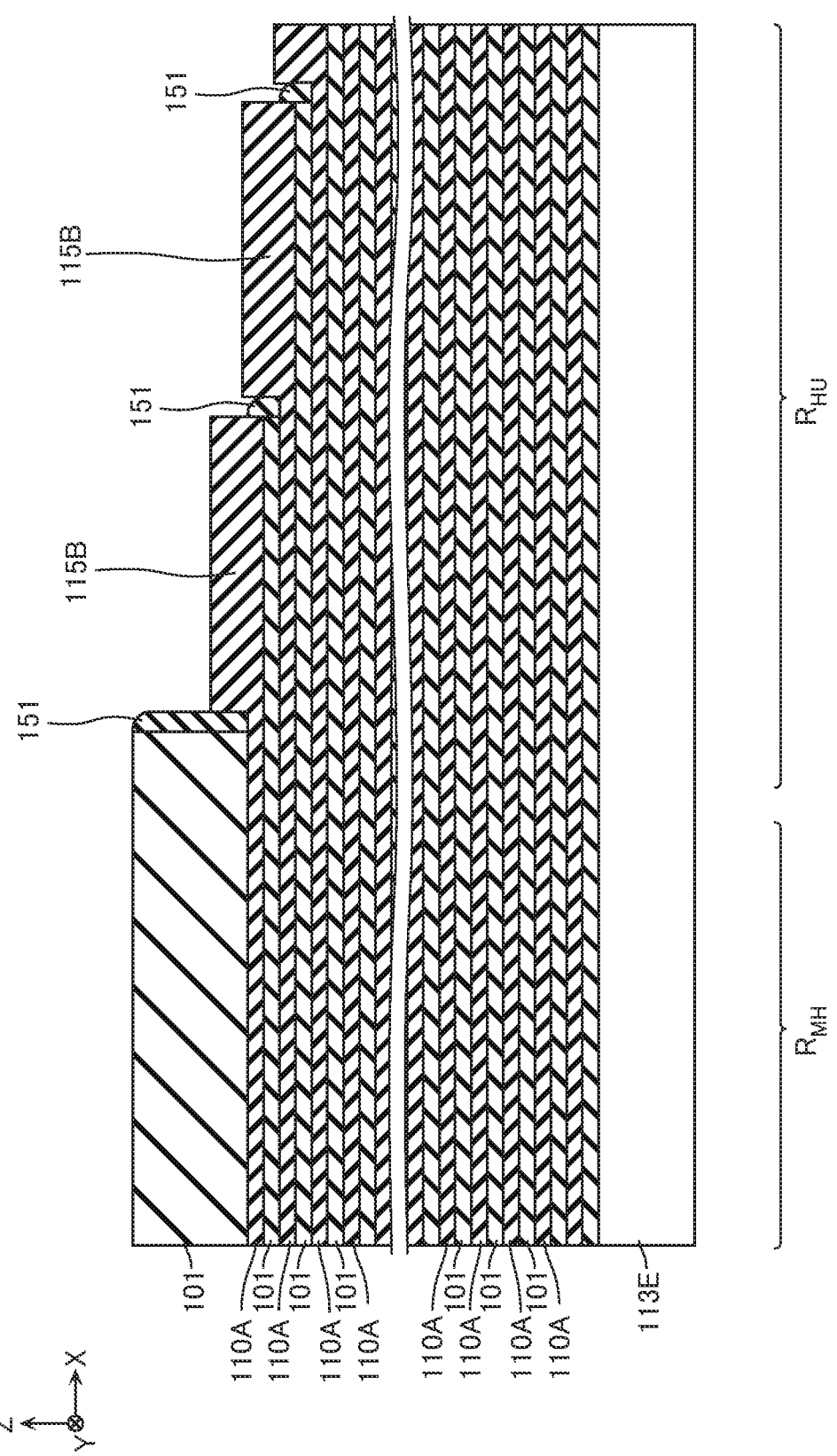
FIG. 13 is a schematic cross-sectional view to describe the manufacturing method.

Next, for example, as illustrated in FIG. 13, silicon nitride ($Si_3N_4$) is caused to grow from the plurality of surfaces 115A. Thus, thick film portions 115B of the sacrifice layers 110A are formed at positions corresponding to the end portions 115 in the X-direction of the conductive layers 110.

Figure 14:
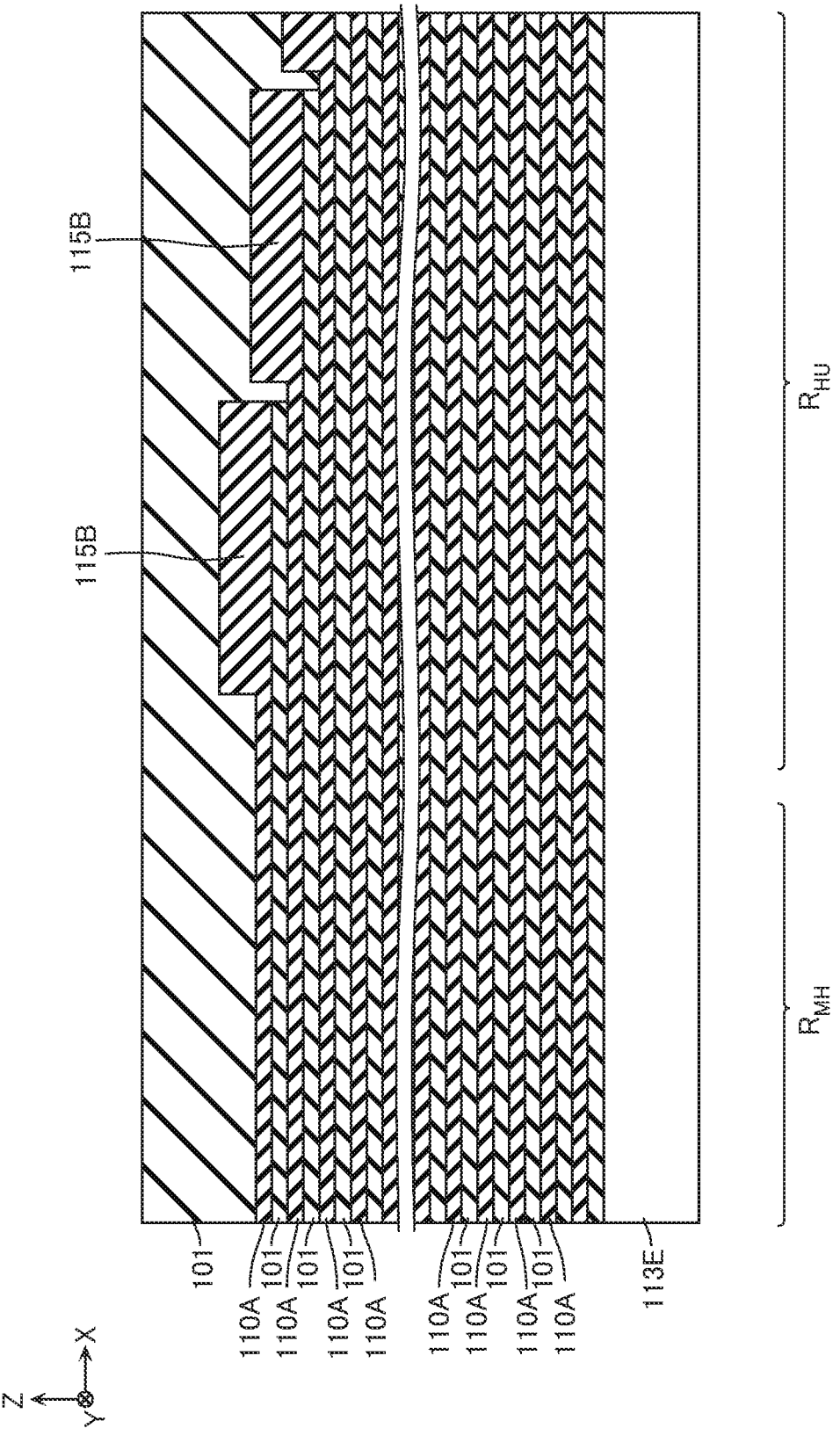
FIG. 14 is a schematic cross-sectional view to describe the manufacturing method.

Next, for example, as illustrated in FIG. 14, the insulating layer 101 is formed on the upper surface of the structure described with reference to FIG. 13. This process is performed by a method, such as CVD.

Figure 15:
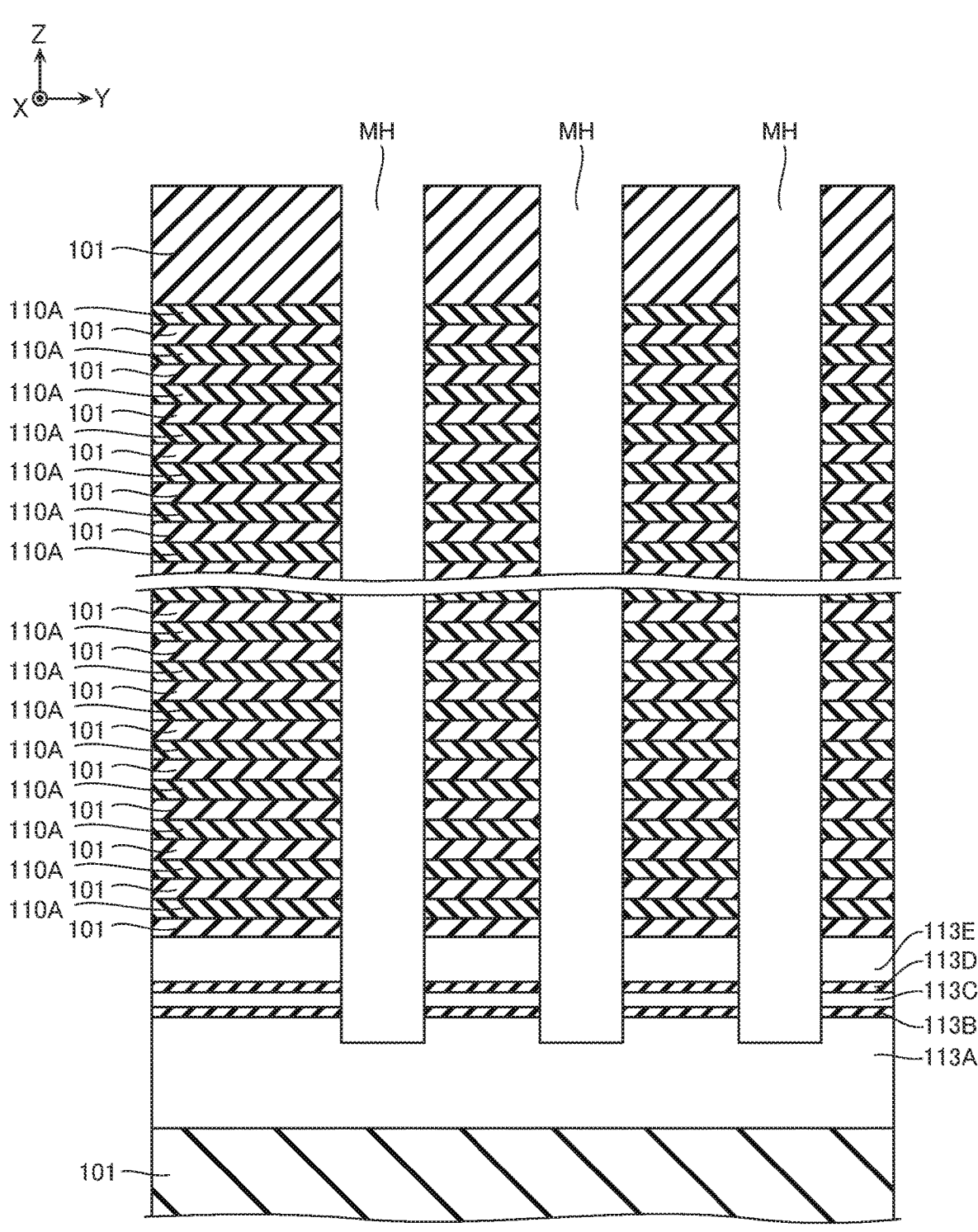
FIG. 15 is a schematic cross-sectional view to describe the manufacturing method.

Next, for example, as illustrated in FIG. 15, a plurality of memory holes MH are formed at positions corresponding to the semiconductor layers 120. The memory hole MH is a through-hole that extends in the Z-direction, penetrates the insulating layers 101 and the sacrifice layers 110A, the semiconductor layer 113E, the sacrifice layer 113D, the sacrifice layer 113C, and the sacrifice layer 113B to expose the upper surface of the semiconductor layer 113A. For example, this process is performed by a method such as RIE.

Figure 16:
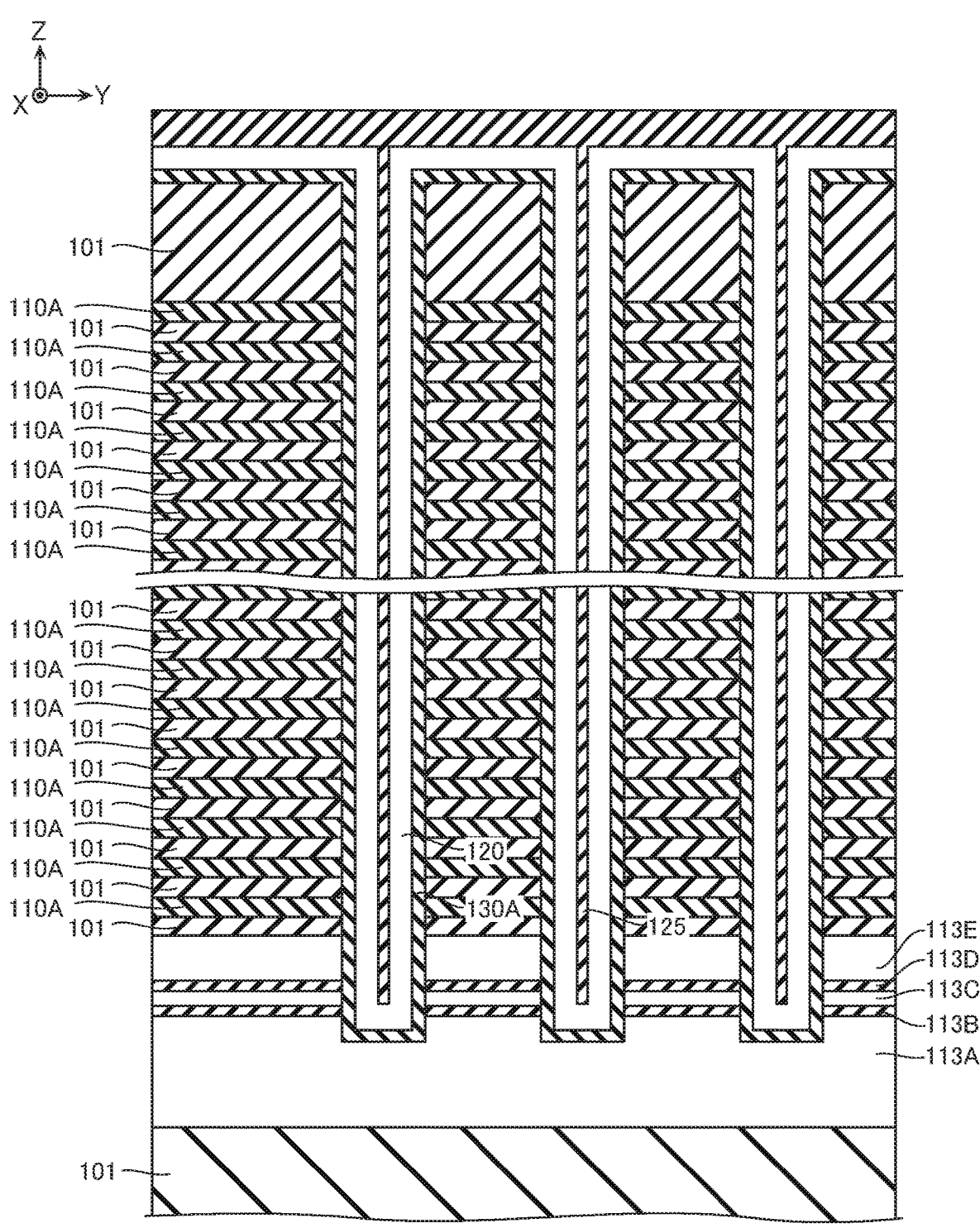
FIG. 16 is a schematic cross-sectional view to describe the manufacturing method.

Next, for example, as illustrated in FIG. 16, the insulating layers 130A, the semiconductor layers 120, and the insulating layers 125 are formed on the upper surfaces of the insulating layers 101 as the uppermost layers and the inner peripheral surfaces of the memory holes MH. The insulating layer 130A, for example, includes the above-described tunnel insulating layer 131, electric charge accumulating layer 132, and block insulating layer 133. In this process, for example, the films are formed by CVD or the like, and amorphous silicon films are formed inside the memory holes MH. For example, a crystalline structure of this amorphous silicon film is modified by annealing process or the like.

Figure 17:
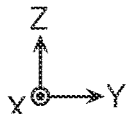
FIG. 17 is a schematic cross-sectional view to describe the manufacturing method.

Next, for example, as illustrated in FIG. 17, a part of the insulating layers 125, the semiconductor layers 120, and the insulating layers 130A are removed. The impurity regions 121 are formed in the upper end parts of the semiconductor layers 120. This process is performed by a method, such as RIE and CVD.

Figure 18:
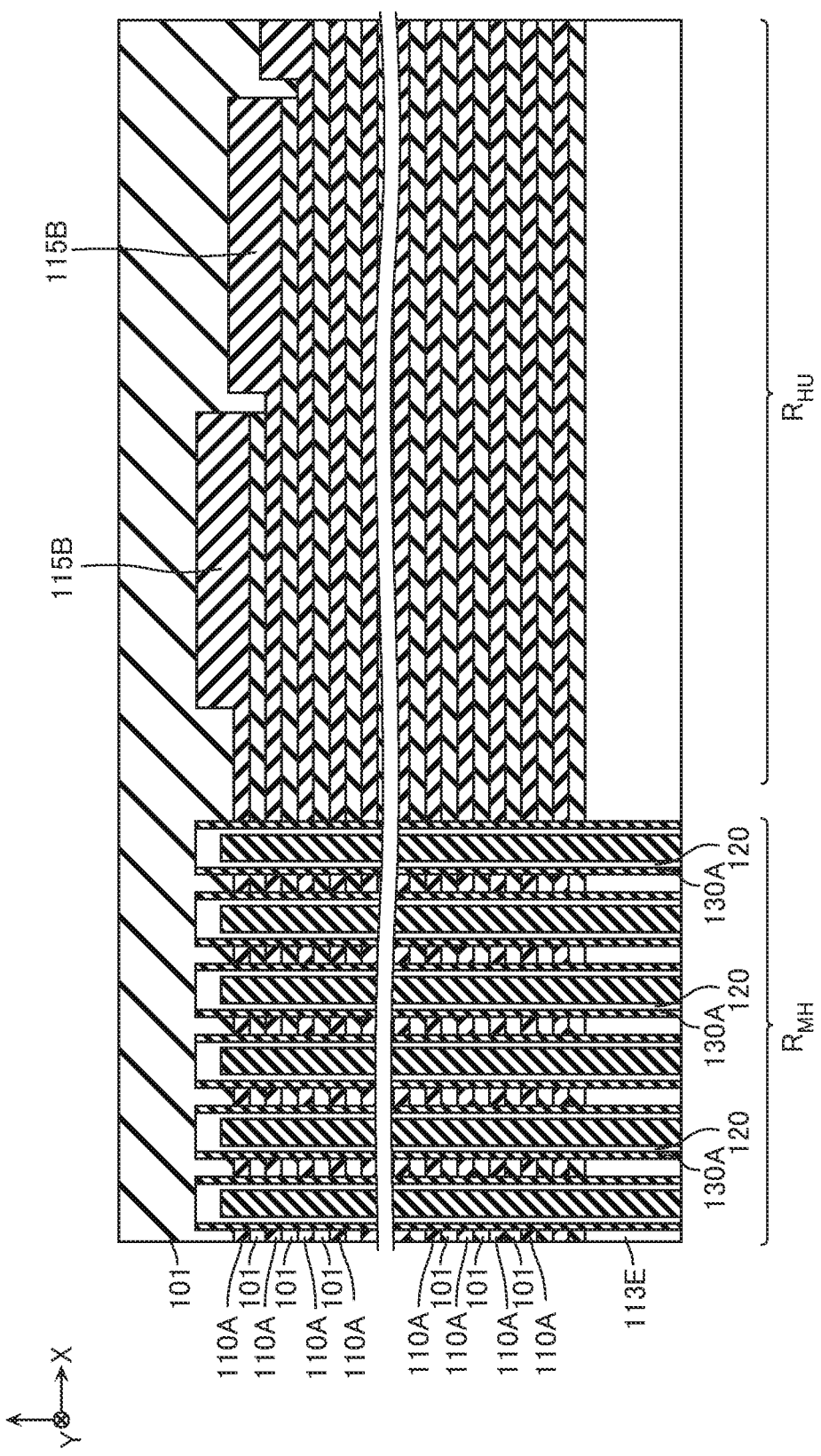
FIG. 18 is a schematic cross-sectional view to describe the manufacturing method.
Figure 19:
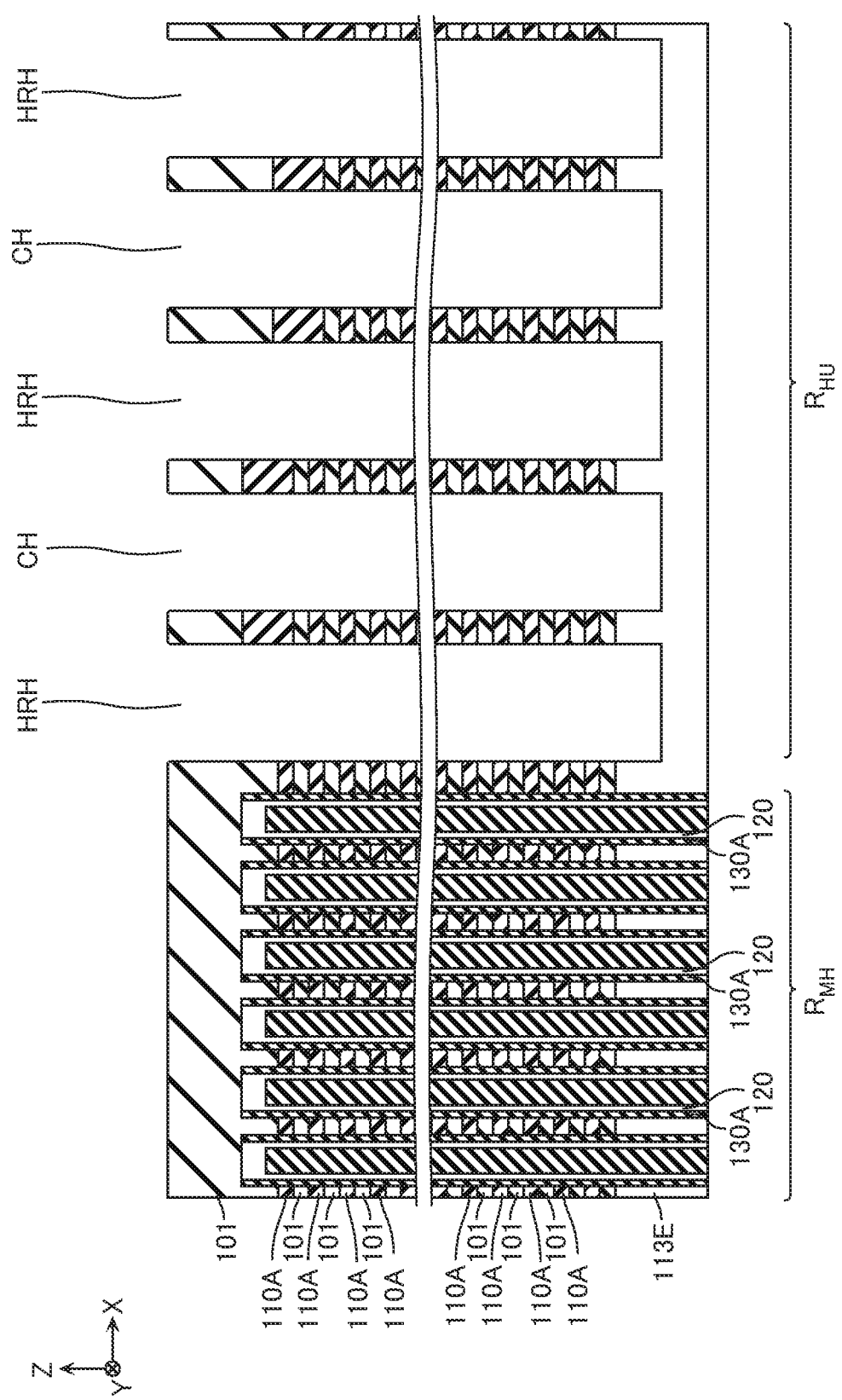
FIG. 19 is a schematic cross-sectional view to describe the manufacturing method.

Next, for example, as illustrated in FIG. 18 and FIG. 19, contact holes CH are formed at positions corresponding to the contact electrodes CC, and through-holes HRH are formed at positions corresponding to the supporting structures HR. The contact hole CH and the through-hole HRH are through-holes that extend in the Z-direction and pass through the insulating layers 101 and the sacrifice layers 110A to expose the upper surface of the semiconductor layer 113E. This process is performed by a method, such as RIE.

Figure 20:
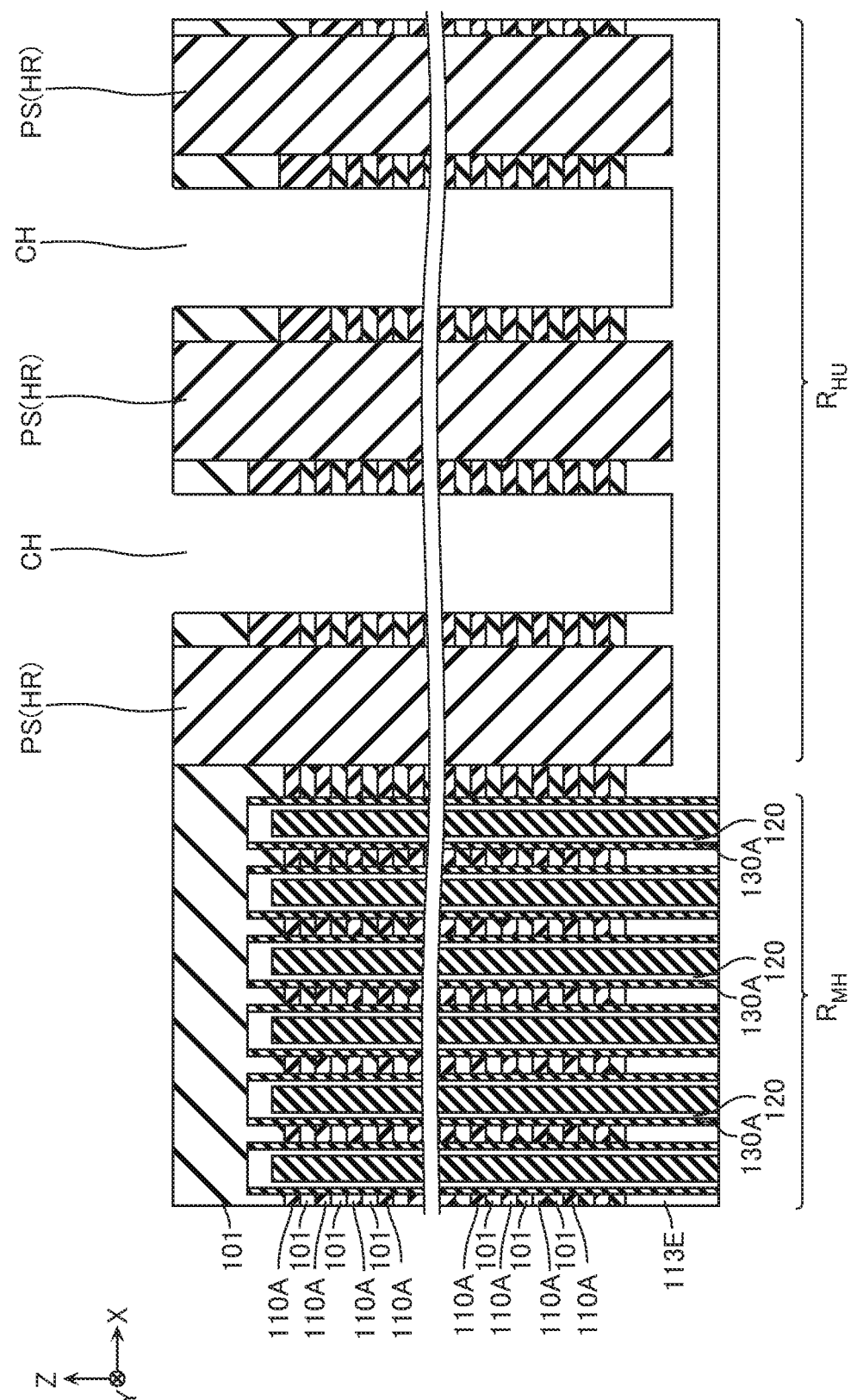
FIG. 20 is a schematic cross-sectional view to describe the manufacturing method.

Next, for example, as illustrated in FIG. 20, the supporting structures HR are formed inside the through-holes HRH. In this process, for example, the contact holes CH are covered with resists and the like. In this state, the supporting structures HR are formed inside the through-holes HRH by a method, such as CVD. Afterwards, the resists and the like that cover the contact holes CH are removed.

Figure 21:
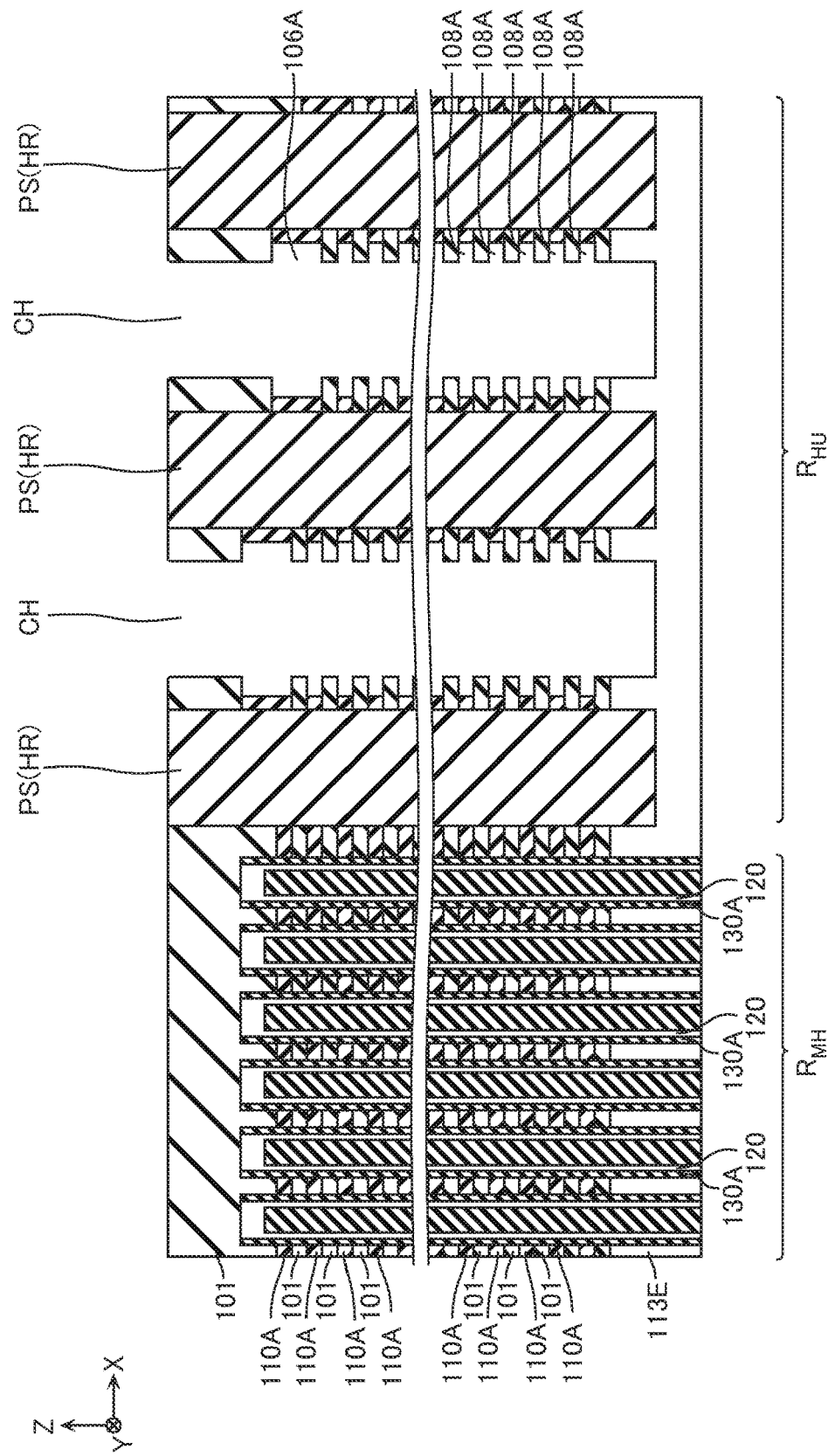
FIG. 21 is a schematic cross-sectional view to describe the manufacturing method.

Next, for example, as illustrated in FIG. 21, a part of the sacrifice layers 110A are removed in the inner peripheral surfaces of the contact holes CH. Thus, a plurality of recessed portions 108A are formed at positions corresponding to the plurality of insulating layers 108. Recessed portions 106A are formed at positions corresponding to the parts 106 (FIG. 8) of the contact electrodes CC. This process is performed by wet etching or the like.

Figure 22:
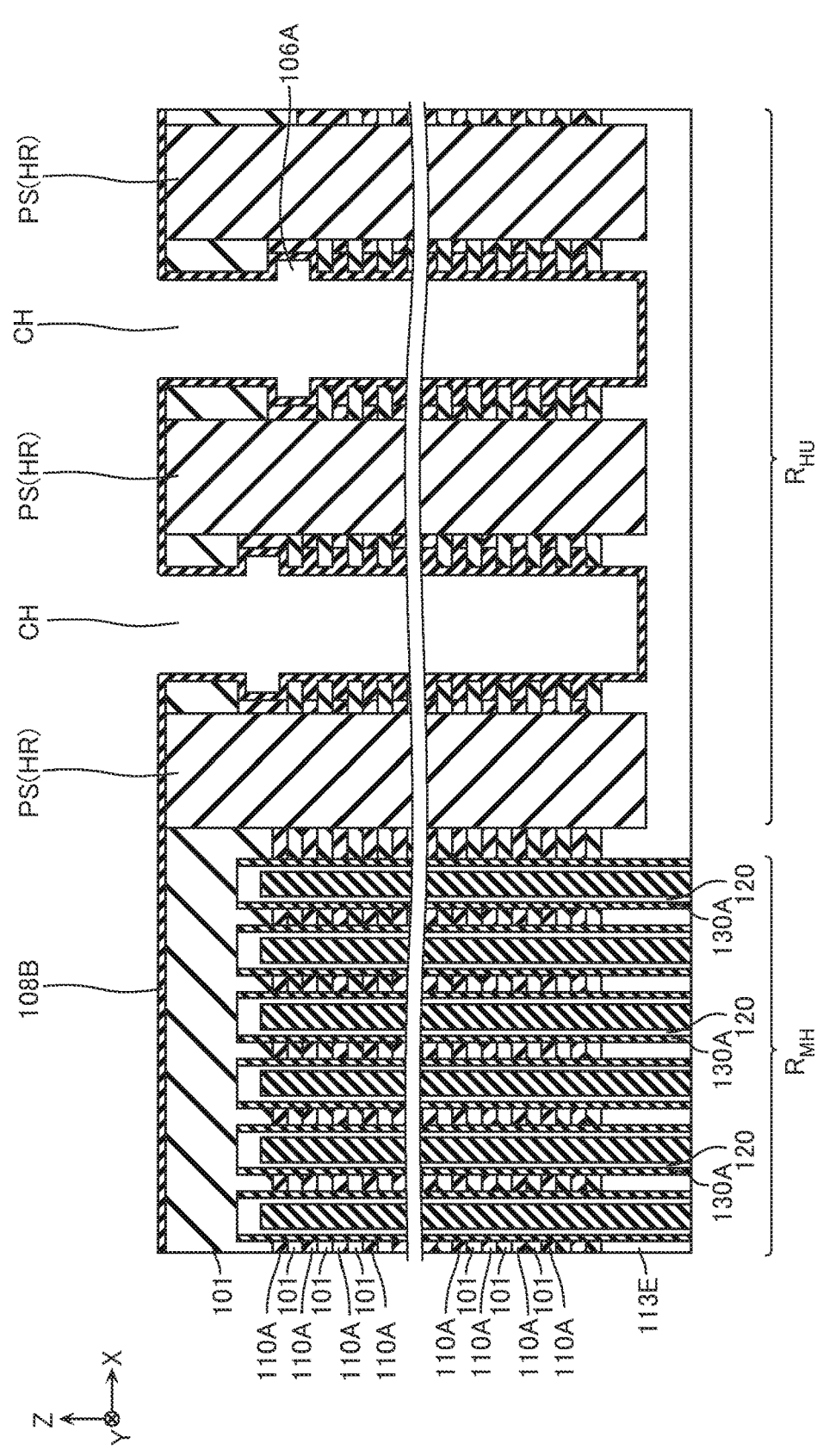
FIG. 22 is a schematic cross-sectional view to describe the manufacturing method.

Next, for example, as illustrated in FIG. 22, an insulating layer 108B is formed on the upper surface of the structure described with reference to FIG. 21 and the inner peripheral surfaces of the plurality of contact holes CH. In this respect, the insulating layer 108B has a film thickness larger than the size of the half of the width in the Z-direction of the recessed portion 108A (the thickness in the Z-direction of the sacrifice layer 110A). Therefore, the recessed portions 108A are embedded by the insulating layer 108B. Meanwhile, the film thickness of the insulating layer 108B is smaller than the size half of the width in the Z-direction of the recessed portion 106A (the thickness in the Z-direction of the thick film portion 115B of the sacrifice layer 110A). Therefore, the recessed portions 106A are not embedded by the sacrifice layer 106B. The film thickness of the insulating layer 108B is smaller than a radius of the contact hole CH. Accordingly, the contact holes CH are not embedded by the sacrifice layer 106B as well. This process is performed by a method, such as CVD.

Figure 23:
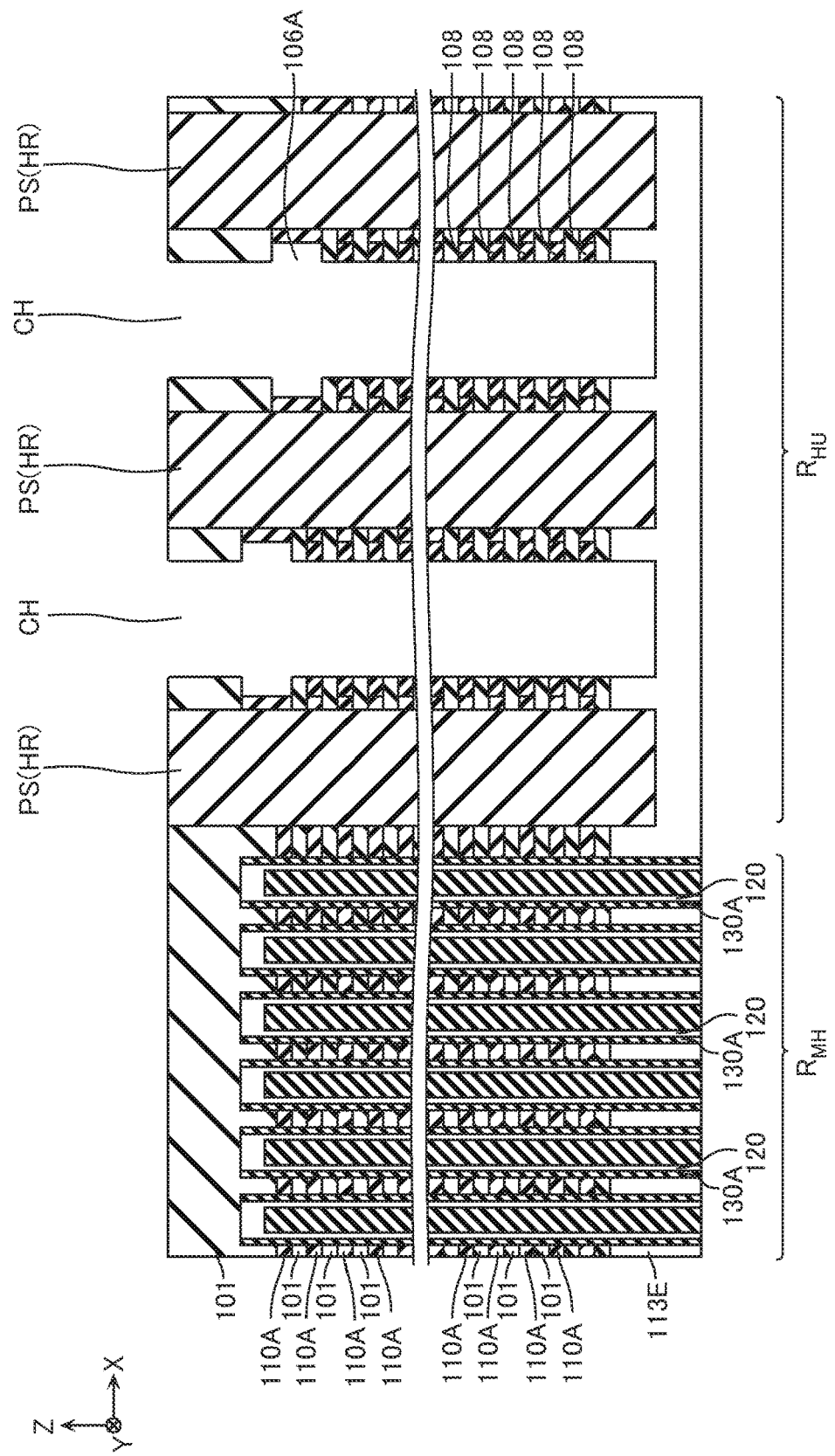
FIG. 23 is a schematic cross-sectional view to describe the manufacturing method.

Next, for example, as illustrated in FIG. 23, a part of the insulating layer 108B is removed. In this process, in the insulating layer 108B, the upper surface of the structure described with reference to FIG. 21, the side surfaces of the plurality of insulating layers 101, the thick film portions 115B of the sacrifice layers 110A, and the parts formed on the upper surface of the semiconductor layers 113E are removed. Thus, the thick film portions 115B of the sacrifice layers 110A and the upper surface of the semiconductor layer 113E are exposed. This process is performed by wet etching or the like.

Figure 24:
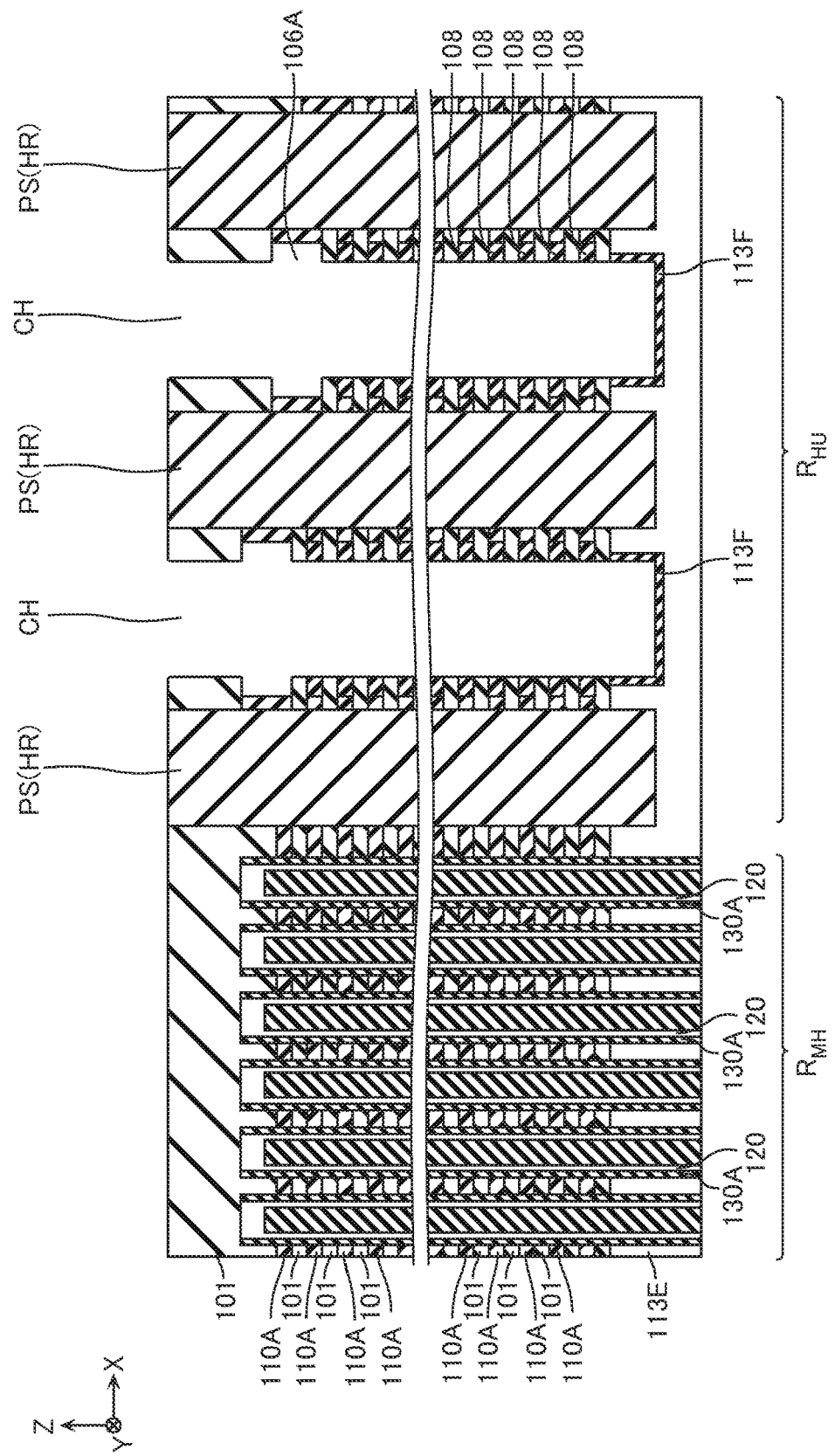
FIG. 24 is a schematic cross-sectional view to describe the manufacturing method.

Next, for example, as illustrated in FIG. 24, insulating layers 113F are formed on the upper surface of the semiconductor layer 113E. This process is, for example, performed by oxidation process.

Figure 25:
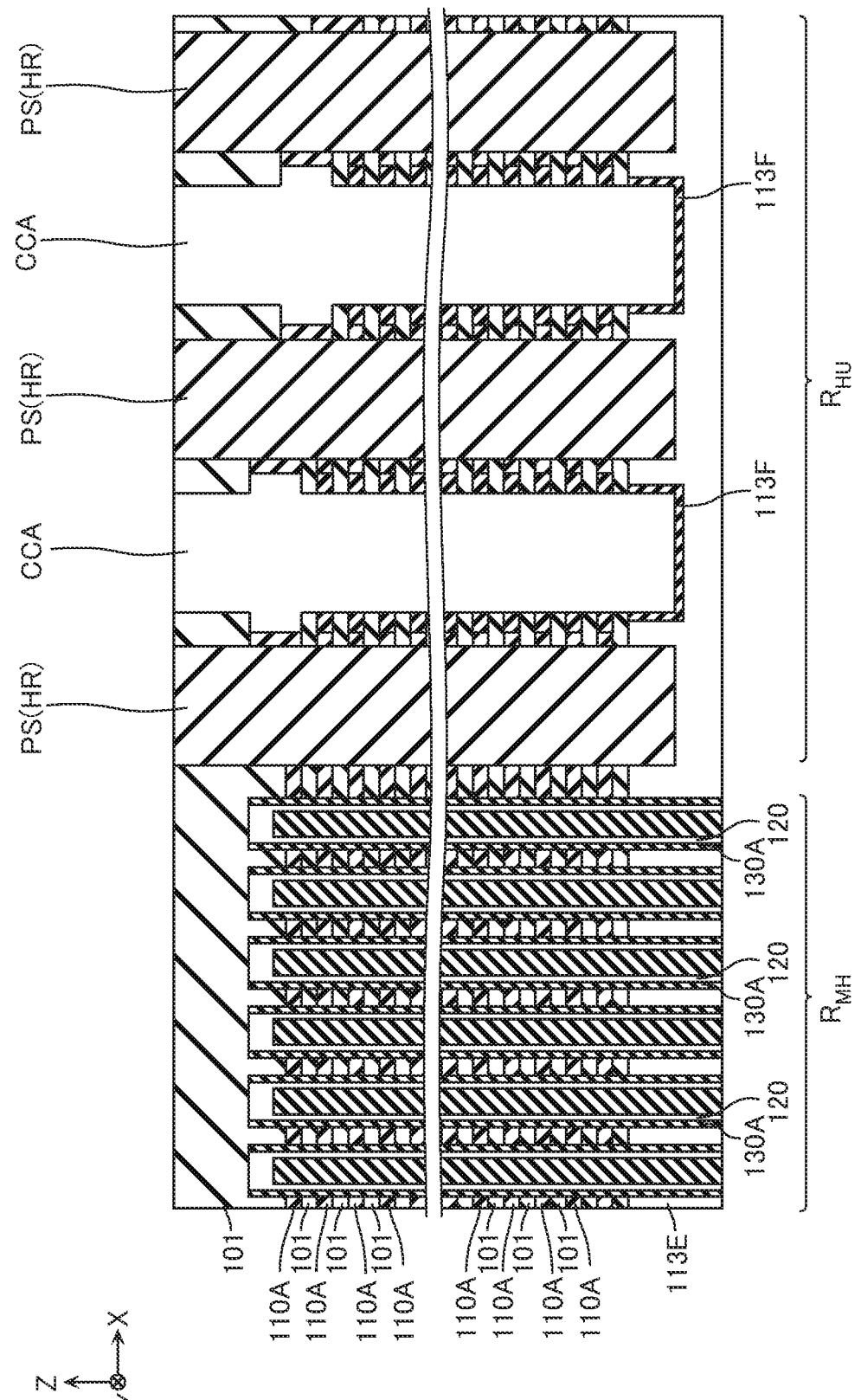
FIG. 25 is a schematic cross-sectional view to describe the manufacturing method.

Next, for example, as illustrated in FIG. 25, sacrifice layers CCA are formed inside the contact holes CH. This process is performed by a method, such as CVD.

Figure 26:
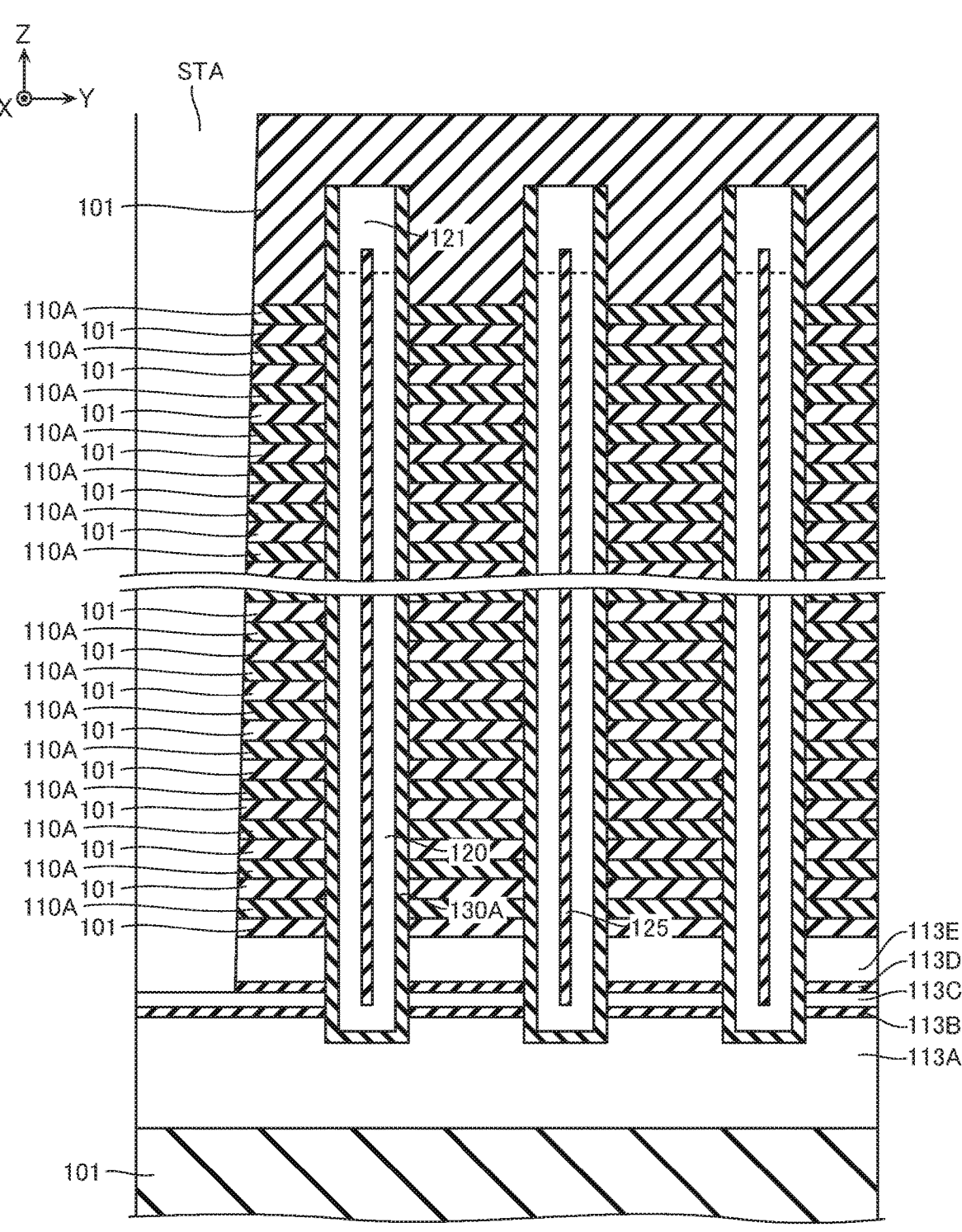
FIG. 26 is a schematic cross-sectional view to describe the manufacturing method.

Next, for example, as illustrated in FIG. 26, a trench STA is formed. The trench STA that extends in the Z-direction and the X-direction and separates the insulating layers 101, the sacrifice layers 110A, the semiconductor layer 113E, and the sacrifice layer 113D in the Y-direction to expose the upper surface of the sacrifice layer 113C. This process is performed by a method, such as RIE.

Figure 27:
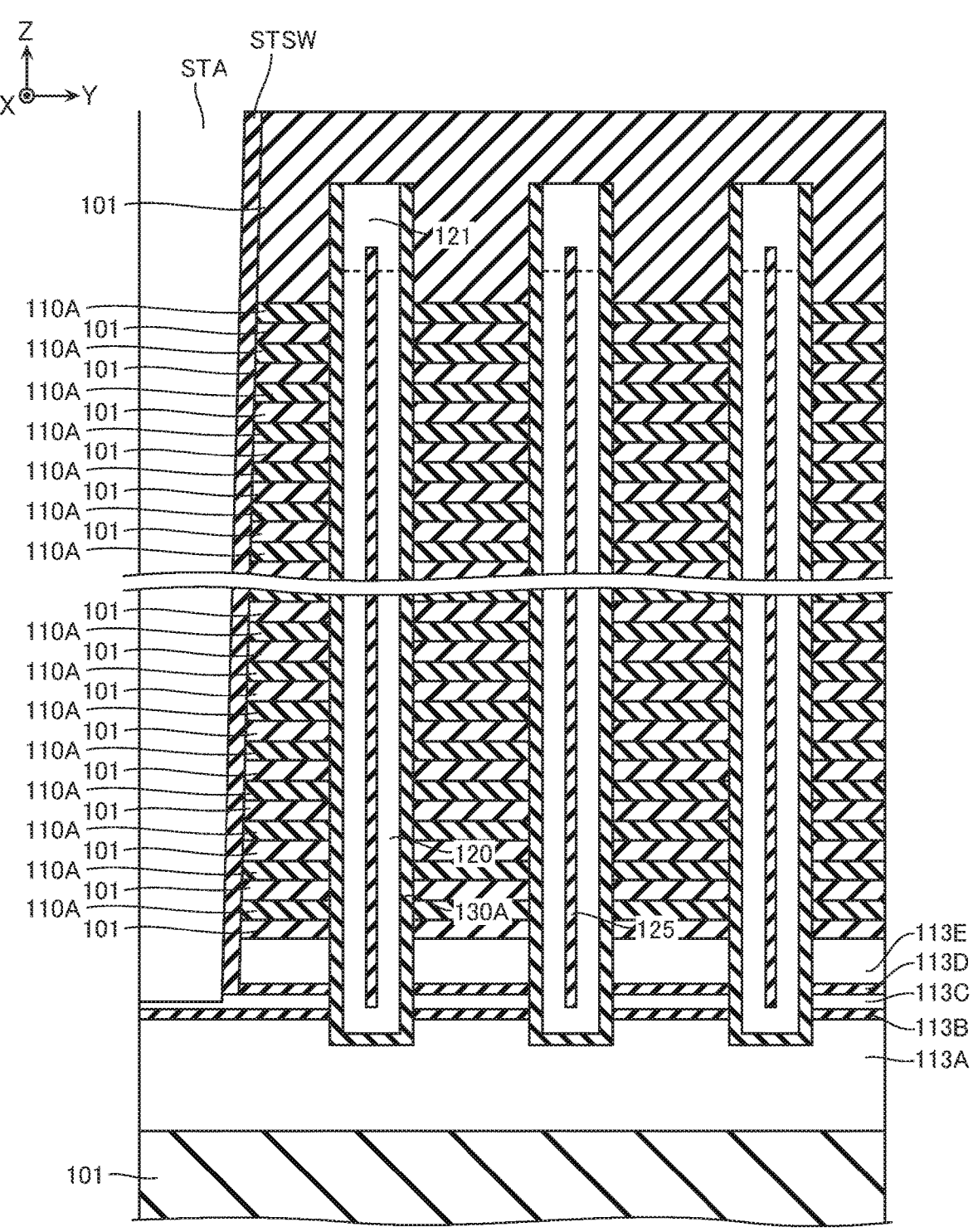
FIG. 27 is a schematic cross-sectional view to describe the manufacturing method.

Next, for example, as illustrated in FIG. 27, a protective film STSW of, for example, silicon nitride is formed on the side surface in the Y-direction of the trench STA. In this process, for example, by a method, such as CVD, an insulating film of, for example, silicon nitride is formed on the side surface in the Y-direction and the bottom surface of the trench STA. By a method, such as RIE, the part of covering the bottom surface of the trench STA is removed in this insulating film.

Figure 28:
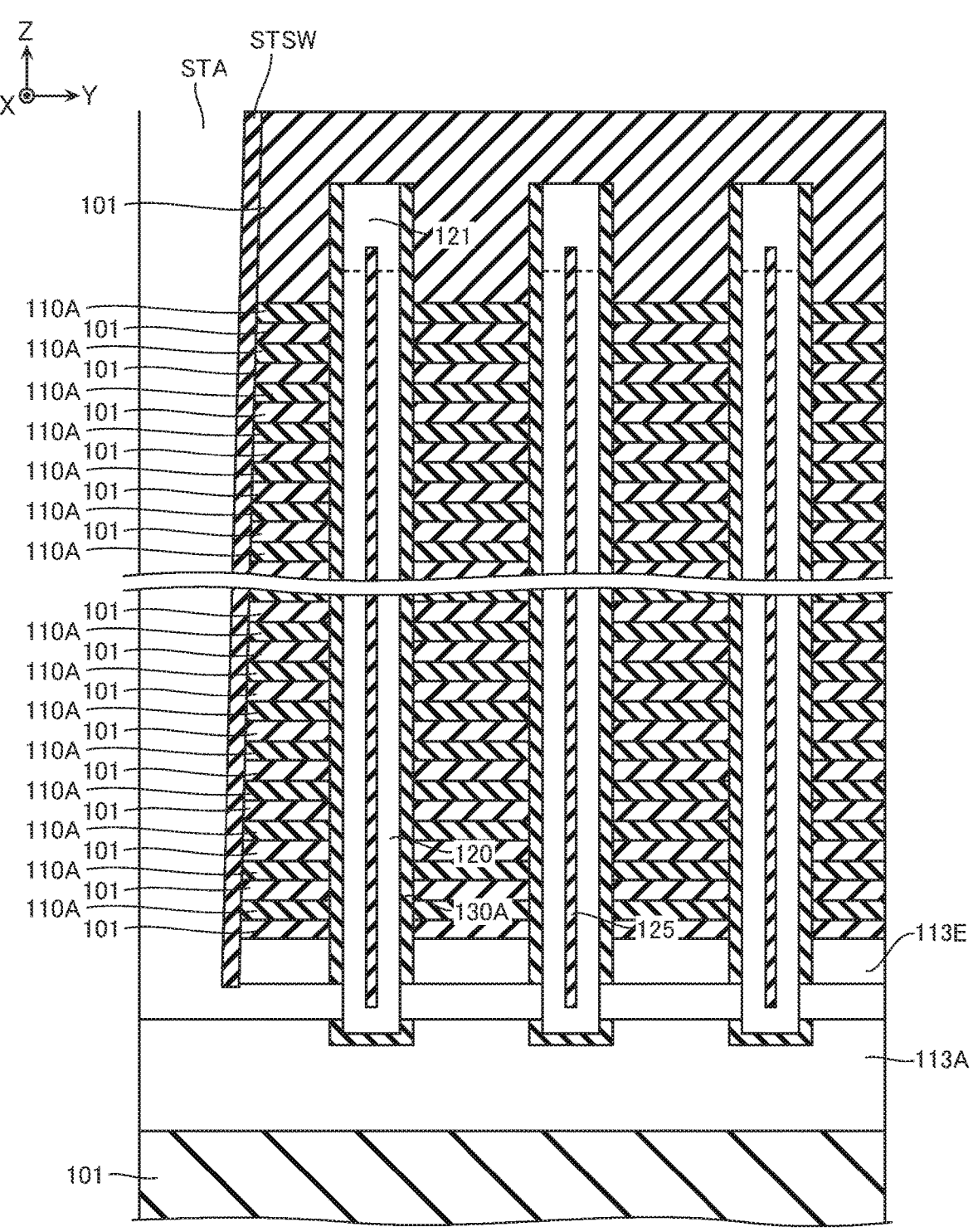
FIG. 28 is a schematic cross-sectional view to describe the manufacturing method.

Next, for example, as illustrated in FIG. 28, the sacrifice layers 113B, 113C, and 113D and a part of the insulating layers 130A are removed to expose a part of the semiconductor layers 120. This process is performed by a method, such as wet etching.

Figure 29:
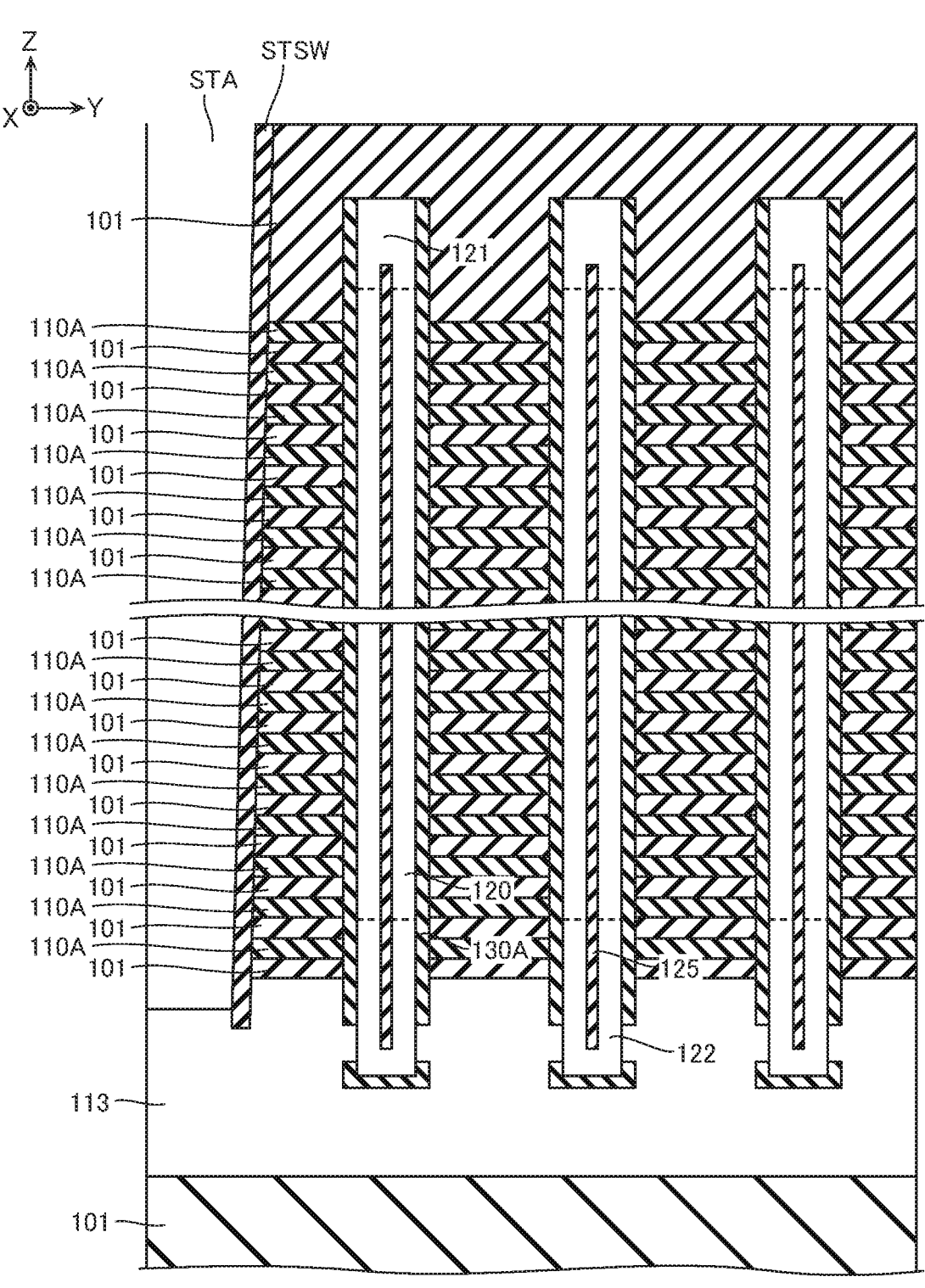
FIG. 29 is a schematic cross-sectional view to describe the manufacturing method.

Next, for example, as illustrated in FIG. 29, the conductive layer 113 is formed. This process is performed by a method, such as epitaxial growth.

Figure 30:
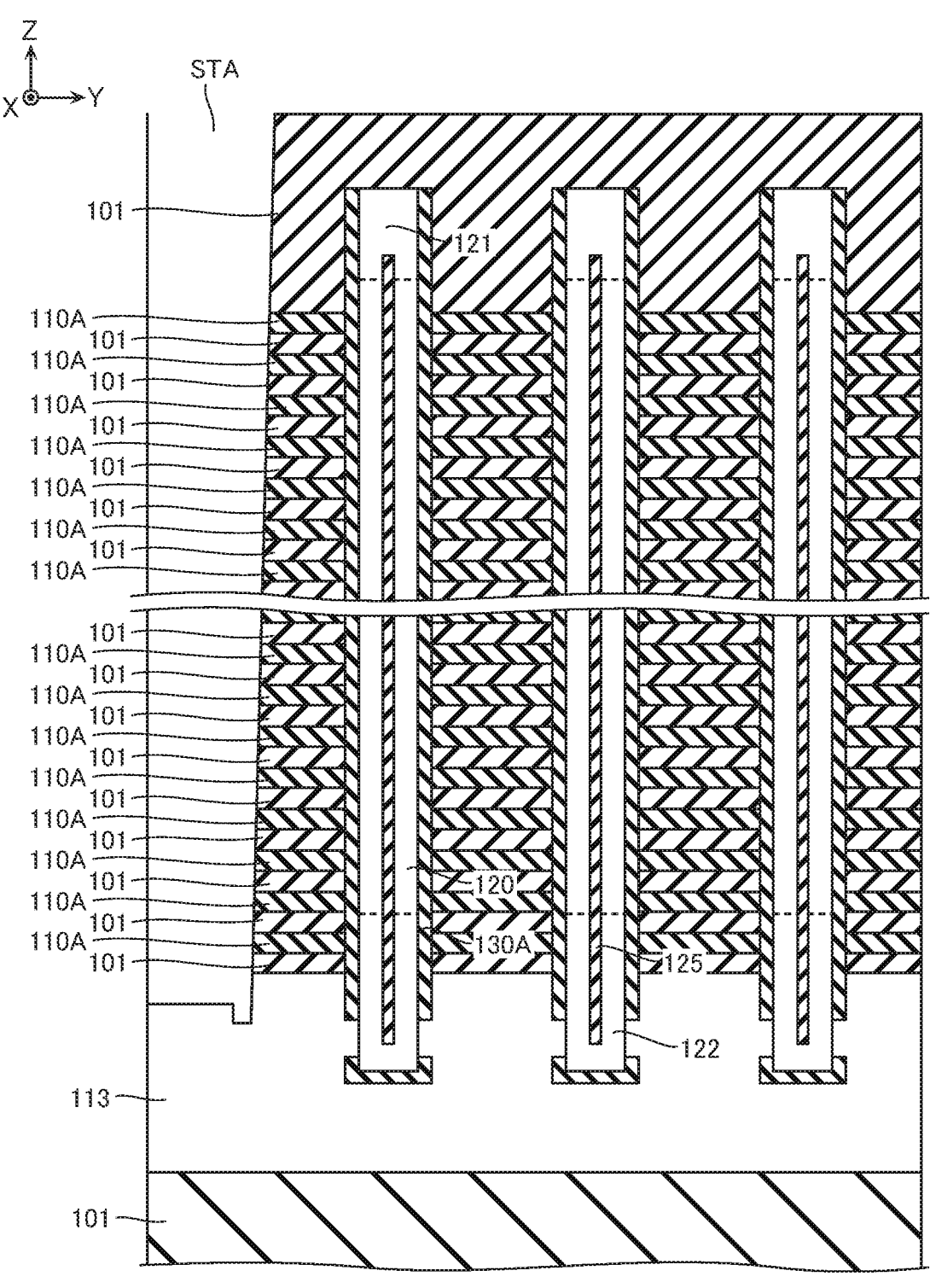
FIG. 30 is a schematic cross-sectional view to describe the manufacturing method.

Next, for example, as illustrated in FIG. 30, the protective film STSW is removed. This process is performed by a method, such as wet etching.

Figure 31:
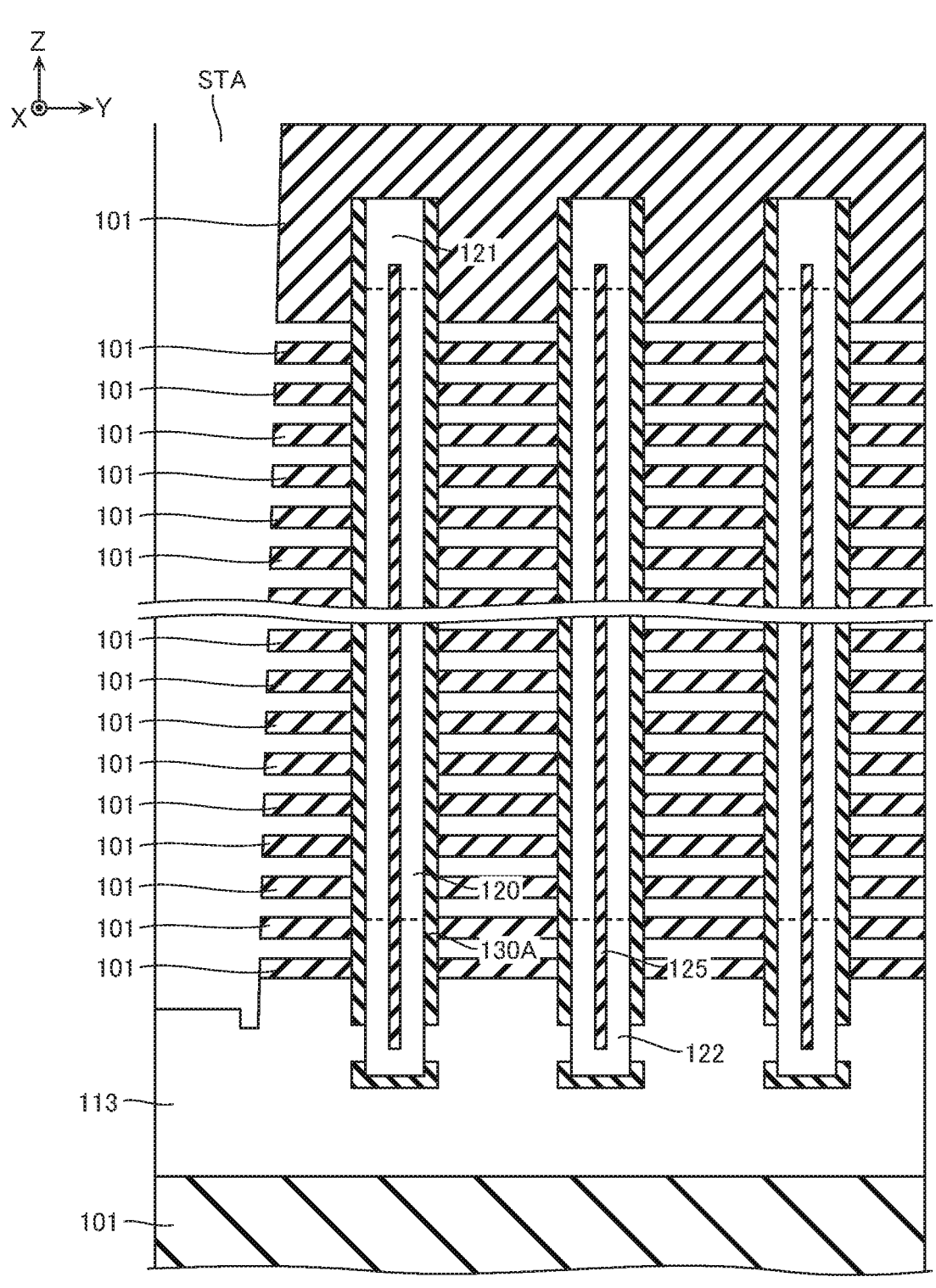
FIG. 31 is a schematic cross-sectional view to describe the manufacturing method.

Next, for example, as illustrated in FIG. 31, the sacrifice layers 110A are removed via the trench STA. Thus, a hollow structure including the plurality of insulating layers 101 disposed in the Z-direction, the structures in the memory holes MH supporting these insulating layers 101 (the semiconductor layers 120, the insulating layers 130A, and the insulating layers 125), the sacrifice layers CCA (FIG. 25), and the supporting structures HR (FIG. 25) is formed. This process is performed by a method, such as wet etching.

Figure 32:
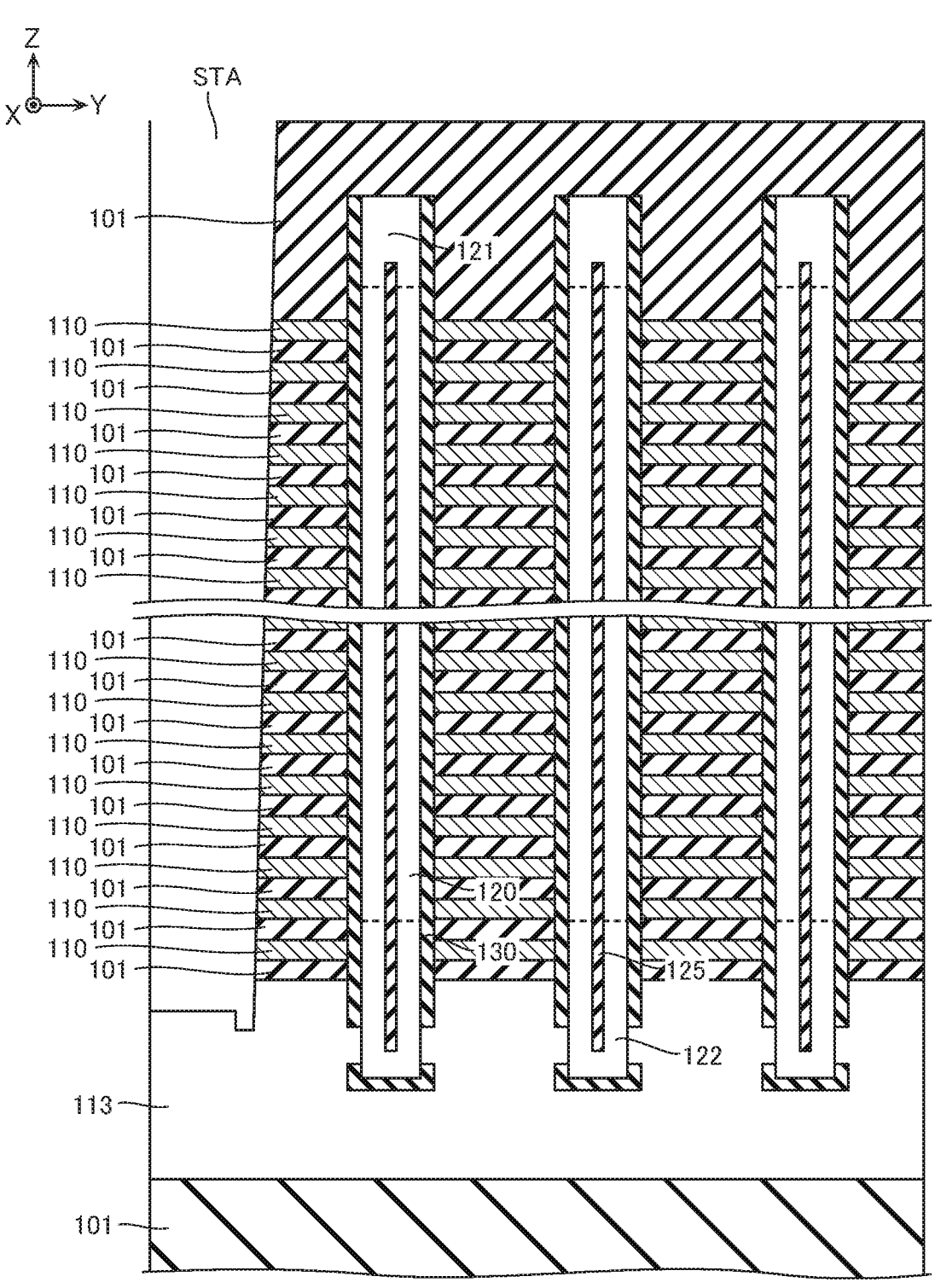
FIG. 32 is a schematic cross-sectional view to describe the manufacturing method.

Next, for example, as illustrated in FIG. 32, the conductive layers 110 are formed. This process is performed by a method, such as CVD. Note that in this process, before the conductive layers 110 are formed, the high-dielectric-constant insulating layers 134 (FIG. 5) are also formed.

Figure 33:
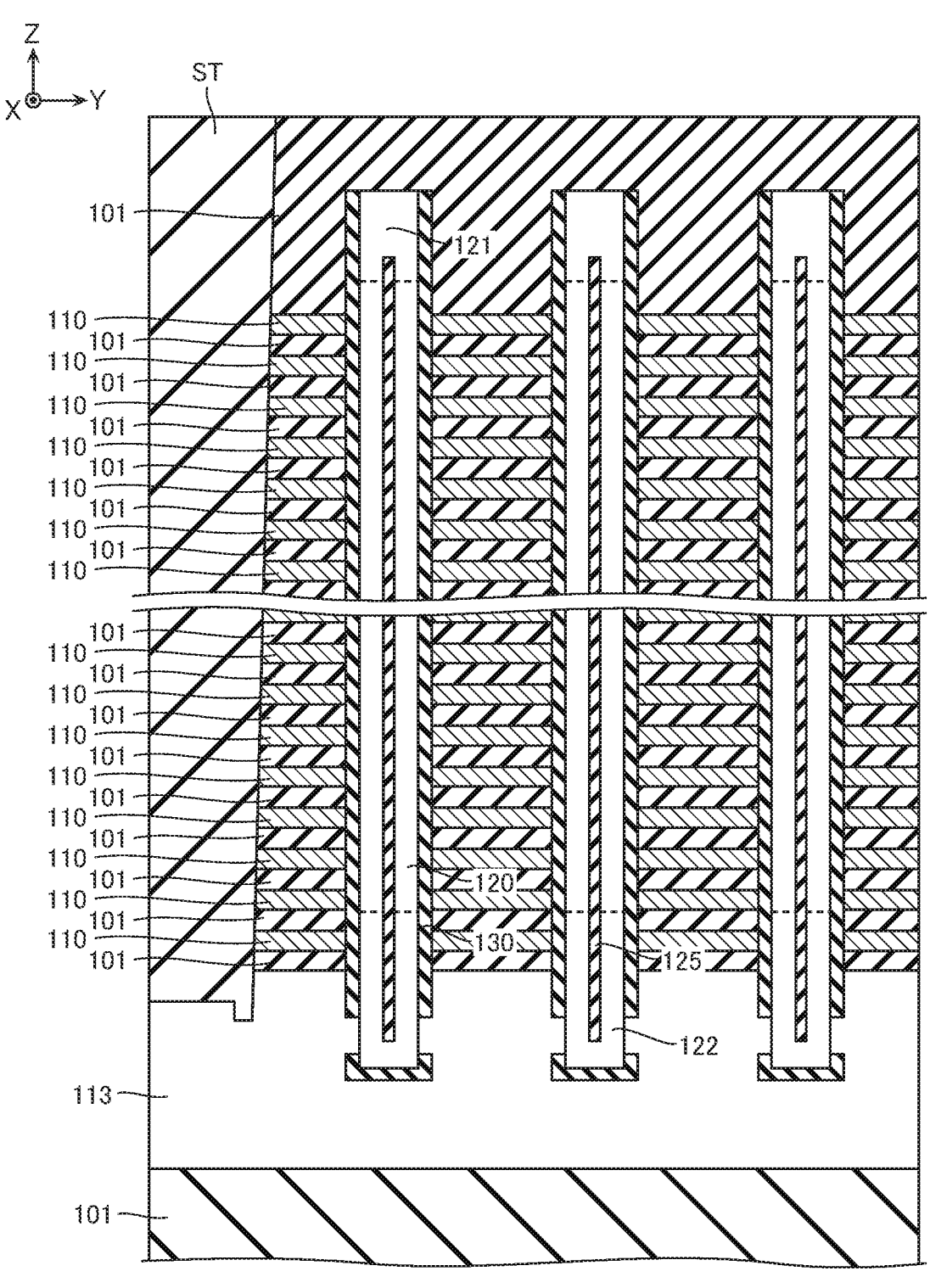
FIG. 33 is a schematic cross-sectional view to describe the manufacturing method.

Next, for example, as illustrated in FIG. 33, the inter-finger structure insulating layer ST is formed inside the trench STA. This process is performed by a method, such as CVD and RIE.

Figure 34:
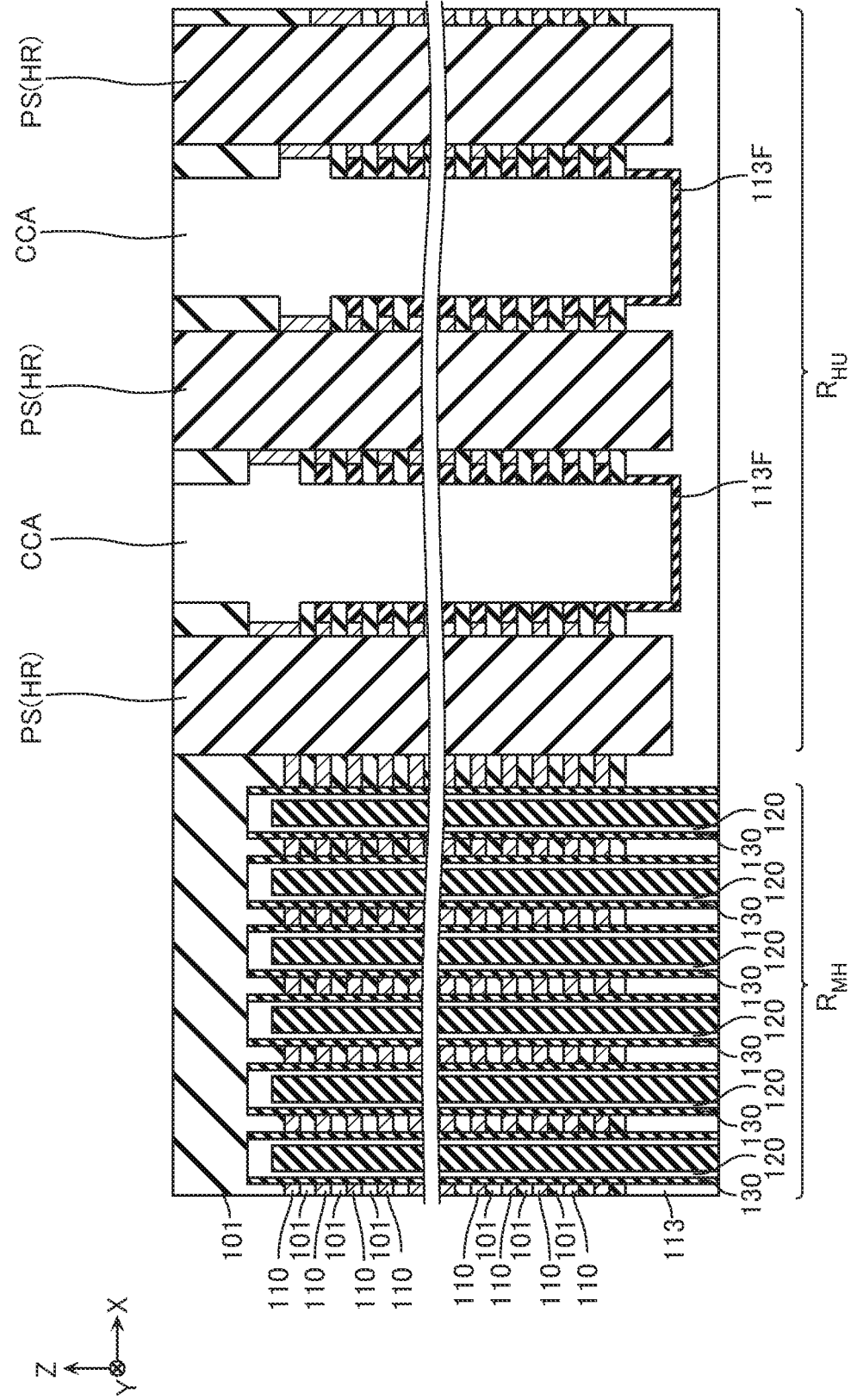
FIG. 34 is a schematic cross-sectional view to describe the manufacturing method.
Figure 35:
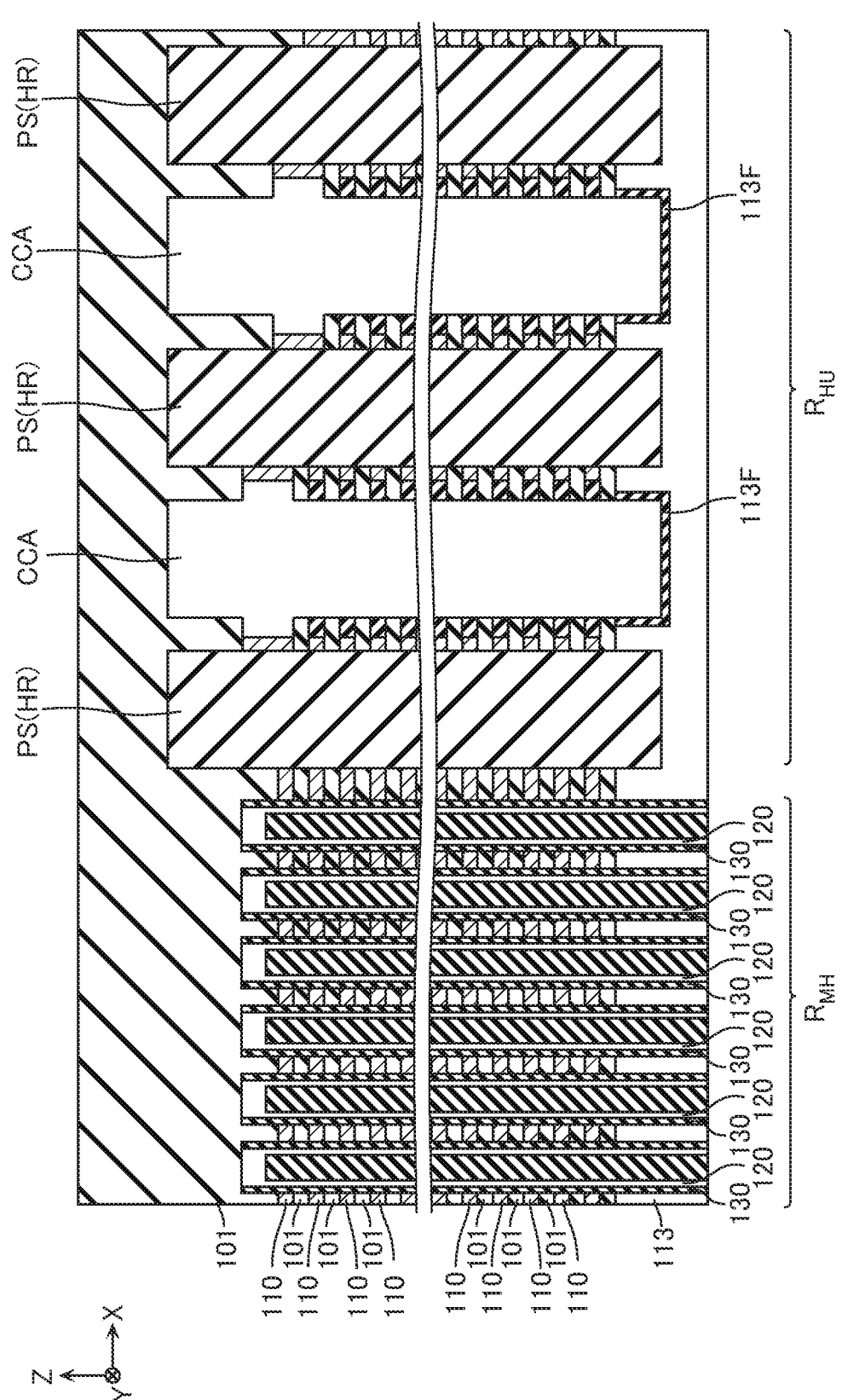
FIG. 35 is a schematic cross-sectional view to describe the manufacturing method.

Next, for example, as illustrated in FIG. 34 and FIG. 35, on the upper surface of the structure described with reference to FIG. 33, the insulating layer 101 is formed. This process is performed by a method, such as CVD.

Figure 36:
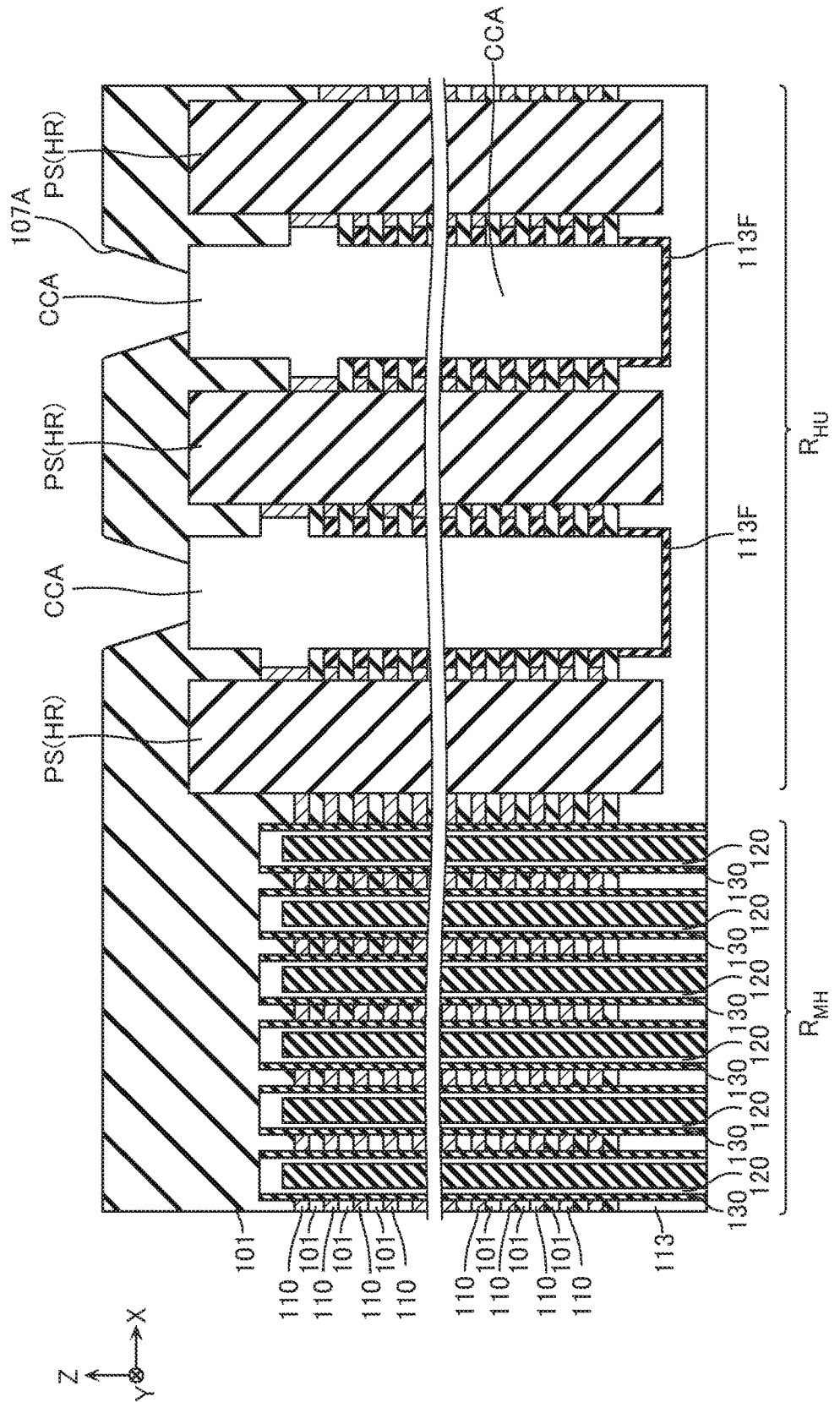
FIG. 36 is a schematic cross-sectional view to describe the manufacturing method.

Next, for example, as illustrated in FIG. 36, through-holes 107A are formed at the positions corresponding to the parts 107 of the conductive layers 110 to expose the upper surfaces of the sacrifice layers CCA. This process is performed by a method, such as RIE.

Figure 37:
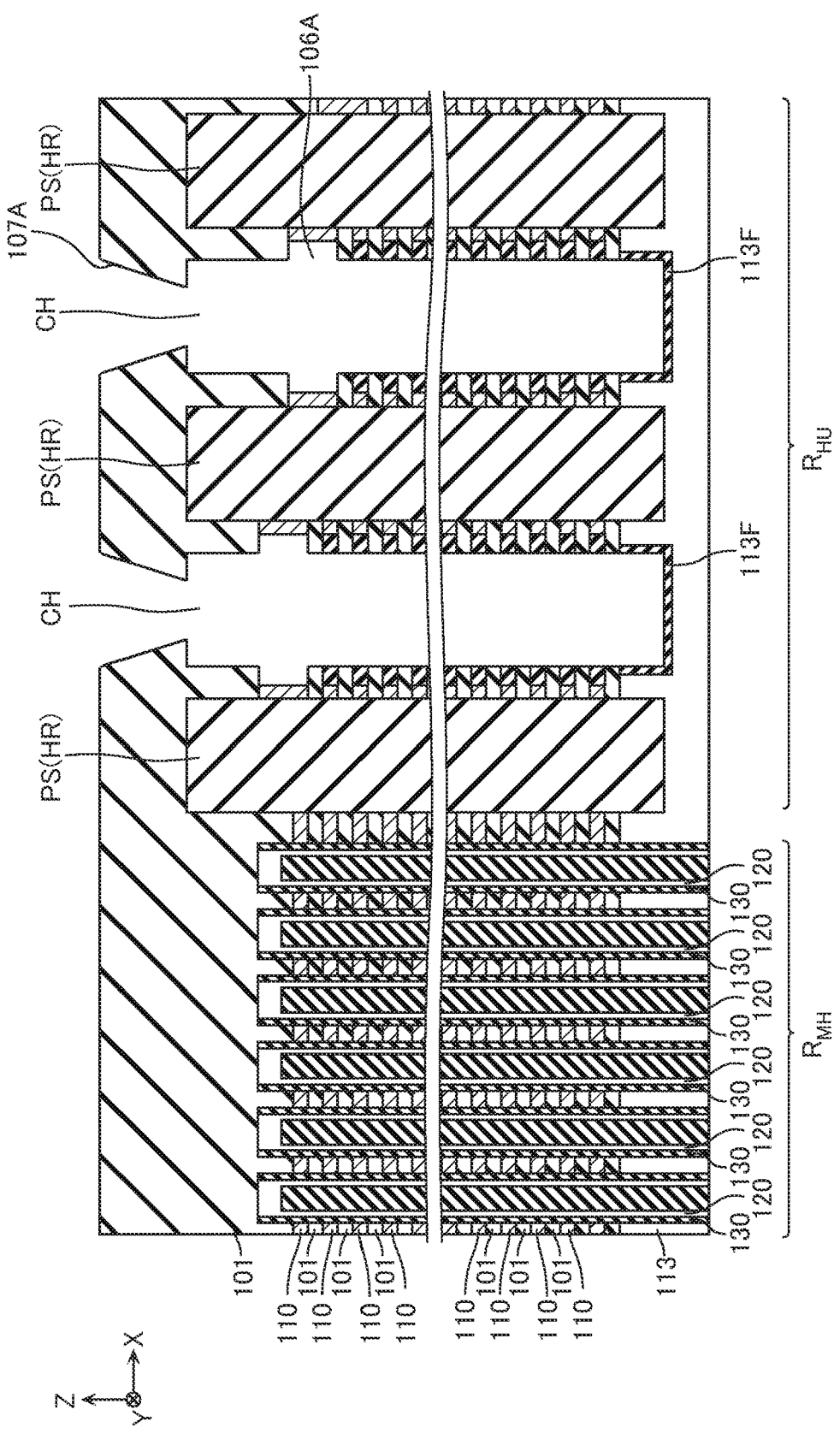
FIG. 37 is a schematic cross-sectional view to describe the manufacturing method.

Next, for example, as illustrated in FIG. 37, the sacrifice layers CCA are removed via the through-holes 107A. This process is performed by wet etching or the like.

Next, for example, as illustrated in FIG. 38 and FIG. 39, the part disposed on the side surface of the end portion 115 in the X-direction of the conductive layer 110 is removed in the high-dielectric-constant insulating layer 134. This process is performed by wet etching or the like. Note that in this process, in the high-dielectric-constant insulating layer 134, the parts disposed on the upper surface and the lower surface of the conductive layer 110 are partially removed.

Next, for example, as illustrated in FIG. 8, the contact electrode CC is formed inside the contact hole CH. This process is performed by CVD or the like.

Afterwards, by forming the wiring and the like, the semiconductor memory device according to the first embodiment is formed.

[Effects]

As described above, in the step described with reference to FIG. 31, the hollow structure including the plurality of insulating layers 101 disposed in the Z-direction and the structures supporting these insulating layers 101 is formed. When this process is employed, there may be a case where, due to an influence of expansion stress of the insulating layers 101 covering the upper surfaces of the structure in the staircase pattern in the hook-up region $R_{HU}$, the structure in the staircase pattern is distorted. To reduce the distortion of the structure in the staircase pattern, the hook-up region $R_{HU}$ includes the supporting structures HR to support this structure in the staircase pattern.

However, in a case where the number of the plurality of conductive layers 110 arranged in the Z-direction increases, the volume of the insulating layers 101 that cover the upper surfaces of the structure in the staircase pattern increases, and in association with this, the expansion stress possibly increases. In the case, to reduce the distortion of the structure in the staircase pattern, for example, increasing the diameter of the supporting structure HR is considered.

However, when the diameter of the supporting structure HR increases, a distance between the supporting structures HR increases. In this case, surface tension of a cleaning chemical solution or warp due to the gravity occurs at a part comparatively far from the supporting structure HR of the insulating layer 101 in some cases.

For example, when the diameter of the supporting structure HR is the same extent of the diameter of the memory hole MH (FIG. 15), the through-holes HRH (FIG. 19) for the supporting structures HR and the memory holes MH (FIG. 15) can be simultaneously formed. Meanwhile, when the diameter of the supporting structure HR is larger than the diameter of the memory hole MH to some extent or more, it is difficult to simultaneously form the through-holes HRH (FIG. 19) and the memory holes MH (FIG. 15) in some cases. In this case, the number of manufacturing processes increases, and a manufacturing cost of the semiconductor memory device increases in some cases.

Therefore, in the manufacturing method according to the first embodiment, as described with reference to FIG. 19, the contact holes CH and the through-holes HRH are collectively formed. Thus, the increase in the manufacturing cost can be reduced.

Additionally, in the manufacturing process of the semiconductor memory device according to the first embodiment, as described with reference to FIG. 21, a part of the sacrifice layers 110A are removed to increase the diameters of the columnar structures PS. Thus, the diameters of the columnar structures PS are adjusted, the distance from the part of the insulating layer 101 comparatively far from the columnar structure PS to the columnar structure PS is adjusted, and thus the warp due to the gravity can be reduced.

In the semiconductor memory device according to the first embodiment, as described with reference to FIG. 8, the thickness $Z_{115}$ in the Z-direction of the end portion 115 of the conductive layer 110 is larger than the thickness $Z_{114}$ in the Z-direction of the other part 114. Additionally, the contact electrode CC according to this embodiment is connected to the inner peripheral surface of the through-hole formed in this end portion 115. With this structure, the contacted area between the contact electrode CC and the end portion 115 can be increased, and a contact resistance between the contact electrode CC and the conductive layer 110 can be reduced.

Second Embodiment

Next, a semiconductor memory device according to the second embodiment will be described. The semiconductor memory device according to the second embodiment is basically configured similarly to the semiconductor memory device according to the first embodiment. However, the semiconductor memory device according to the second embodiment differs from the semiconductor memory device according to the first embodiment in a part of the manufacturing method.

Next, with reference to FIG. 40 to FIG. 43, the manufacturing method of the semiconductor memory device according to the second embodiment will be described. FIG. 40 to FIG. 43 are schematic cross-sectional views to describe the manufacturing method and illustrate the cross-sectional surfaces corresponding to FIG. 6.

The manufacturing method according to the second embodiment performs the steps up to the step described with reference to FIG. 10 among the steps included in the manufacturing method according to the first embodiment.

Figure 40:
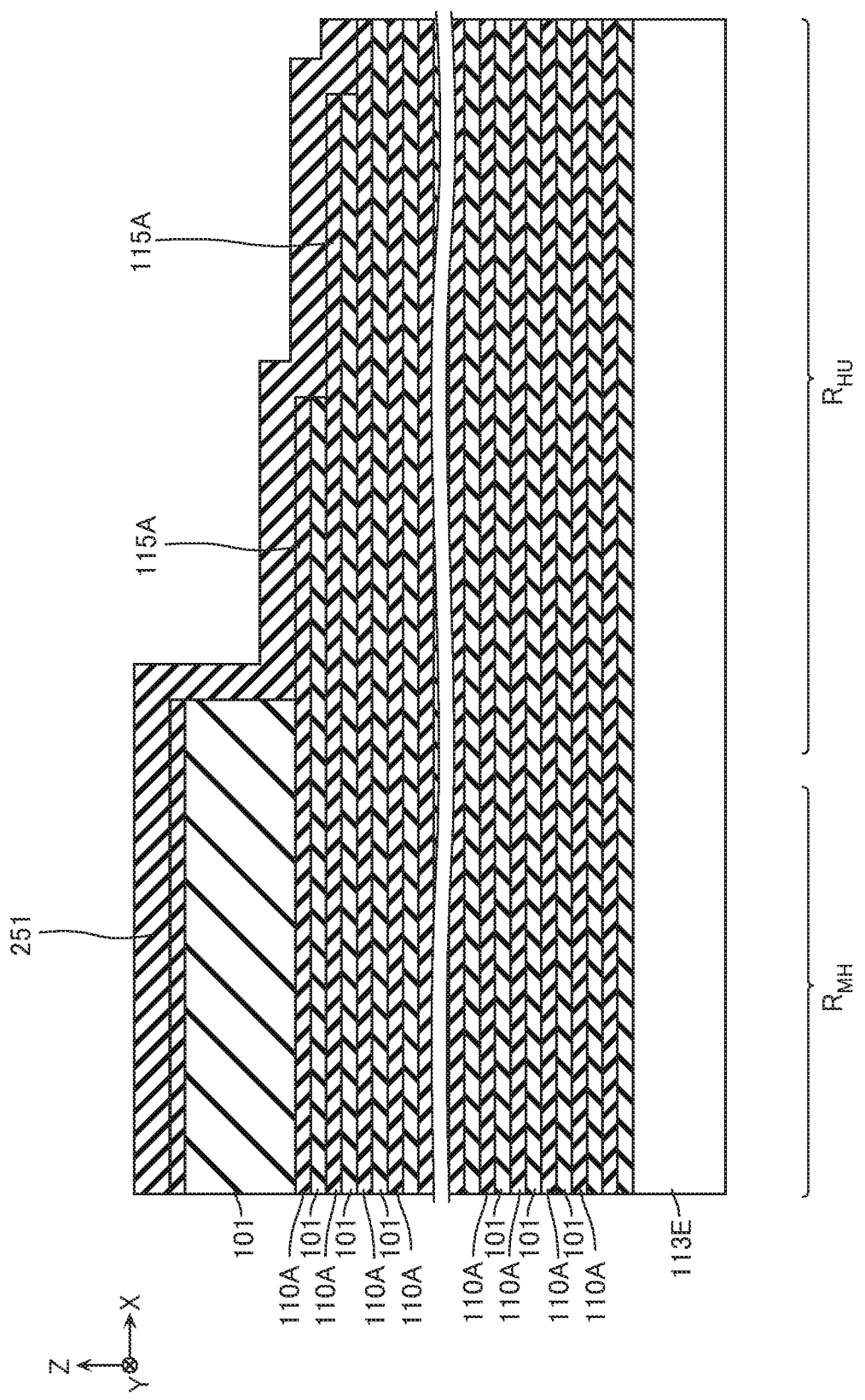
FIG. 40 is a schematic cross-sectional view to describe a manufacturing method of a semiconductor memory device according to a second embodiment.

Next, for example, as illustrated in FIG. 40, a sacrifice layer 251 is formed on the structure described with reference to FIG. 10. The sacrifice layer 251 contains, for example, silicon nitride (Si$_3$N$_4$). The sacrifice layer 251 covers the plurality of surfaces 115A and the side surfaces of the sacrifice layers 110A and the insulating layers 101. This process is performed by a method, such as CVD.

Figure 41:
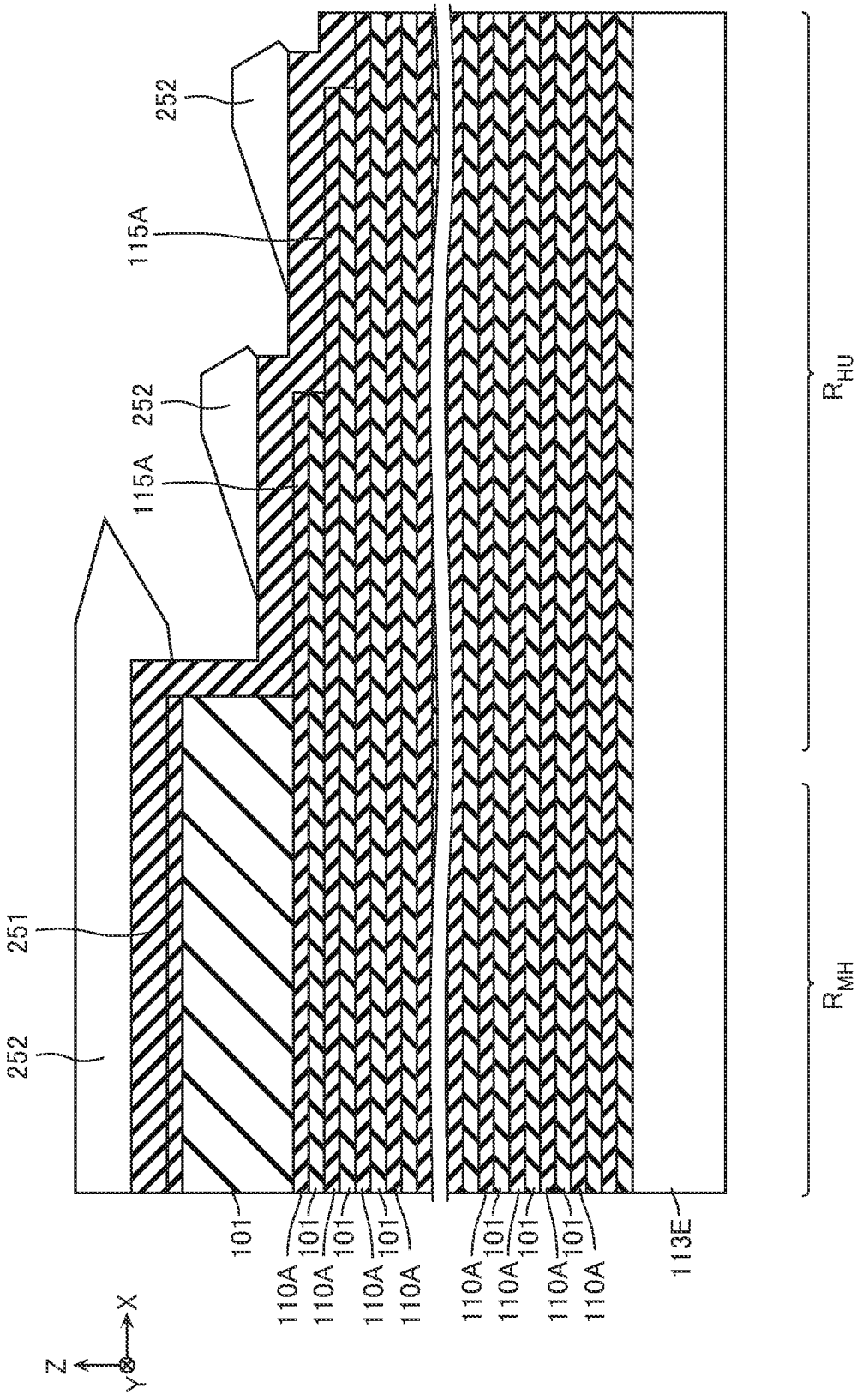
FIG. 41 is a schematic cross-sectional view to describe the manufacturing method.

Next, for example, as illustrated in FIG. 41, stopper layers 252 are formed on the structure described with reference to FIG. 40. The stopper layer 252 may be, for example, a carbon film containing carbon (C). This process is performed by a method, such as CVD.

Figure 42:
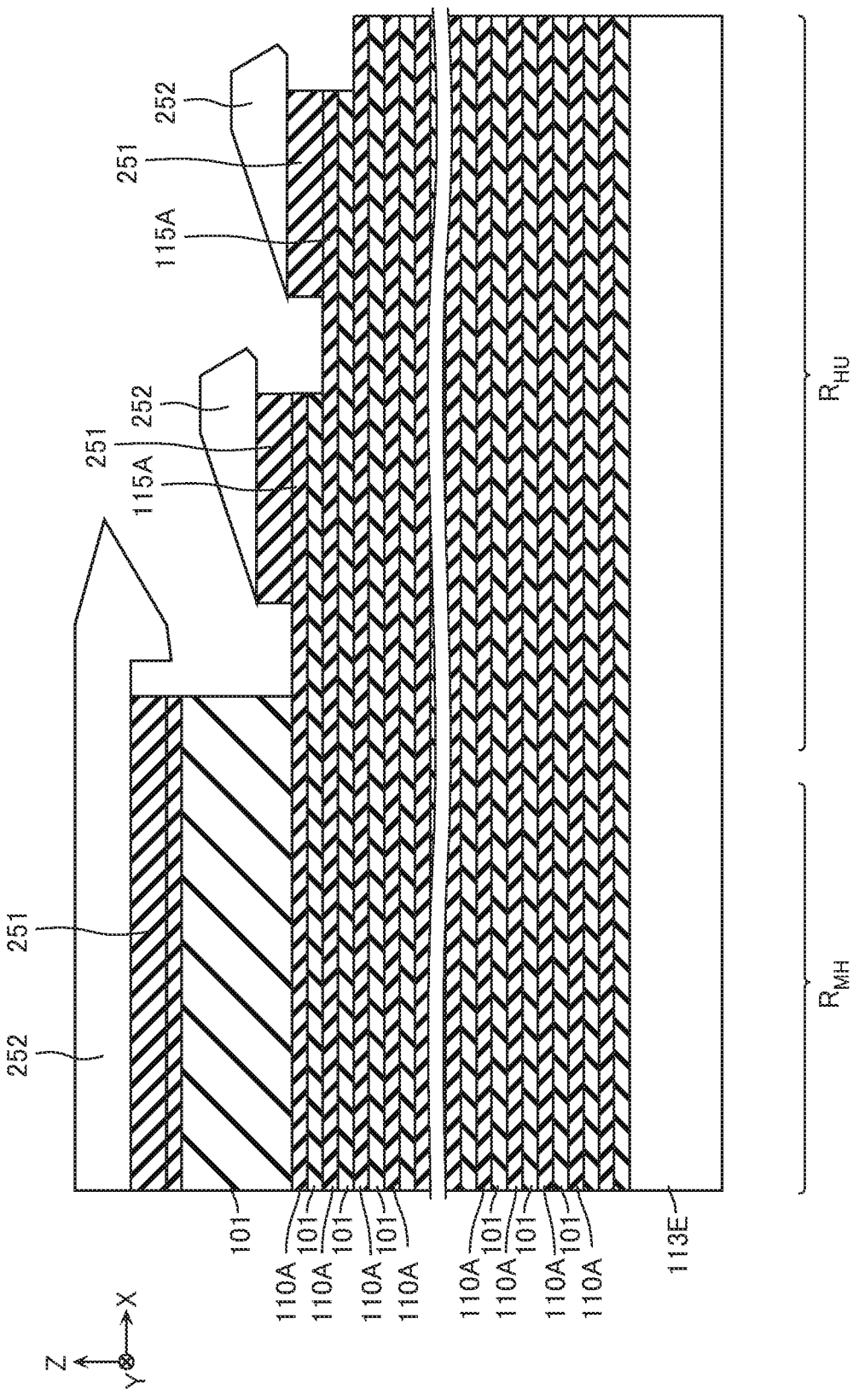
FIG. 42 is a schematic cross-sectional view to describe the manufacturing method.

Next, for example, as illustrated in FIG. 42, using the stopper layers 252 as masks, a part of the sacrifice layers 251 are removed. This process separates the sacrifice layer 251 into a plurality of parts covering the plurality of surfaces 115A. This process is performed by a method, such as RIE.

Figure 43:
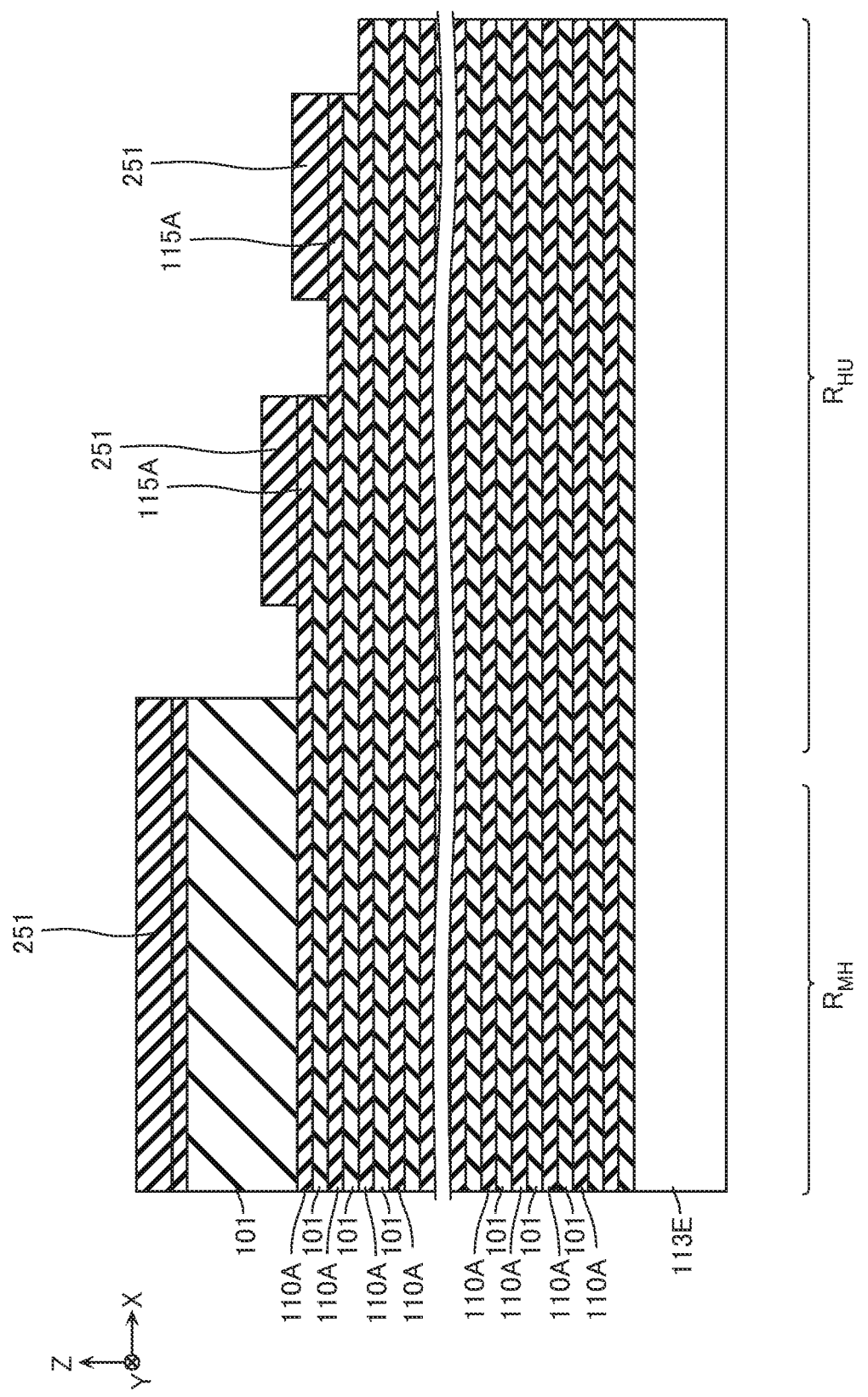
FIG. 43 is a schematic cross-sectional view to describe the manufacturing method.

Next, for example, as illustrated in FIG. 43, the stopper layers 252 are removed. This process is performed by asking or the like.

Afterwards, among the steps included in the manufacturing method according to the first embodiment, the steps at and after the step described with reference to FIG. 14 are performed.

Third Embodiment

Figure 44:
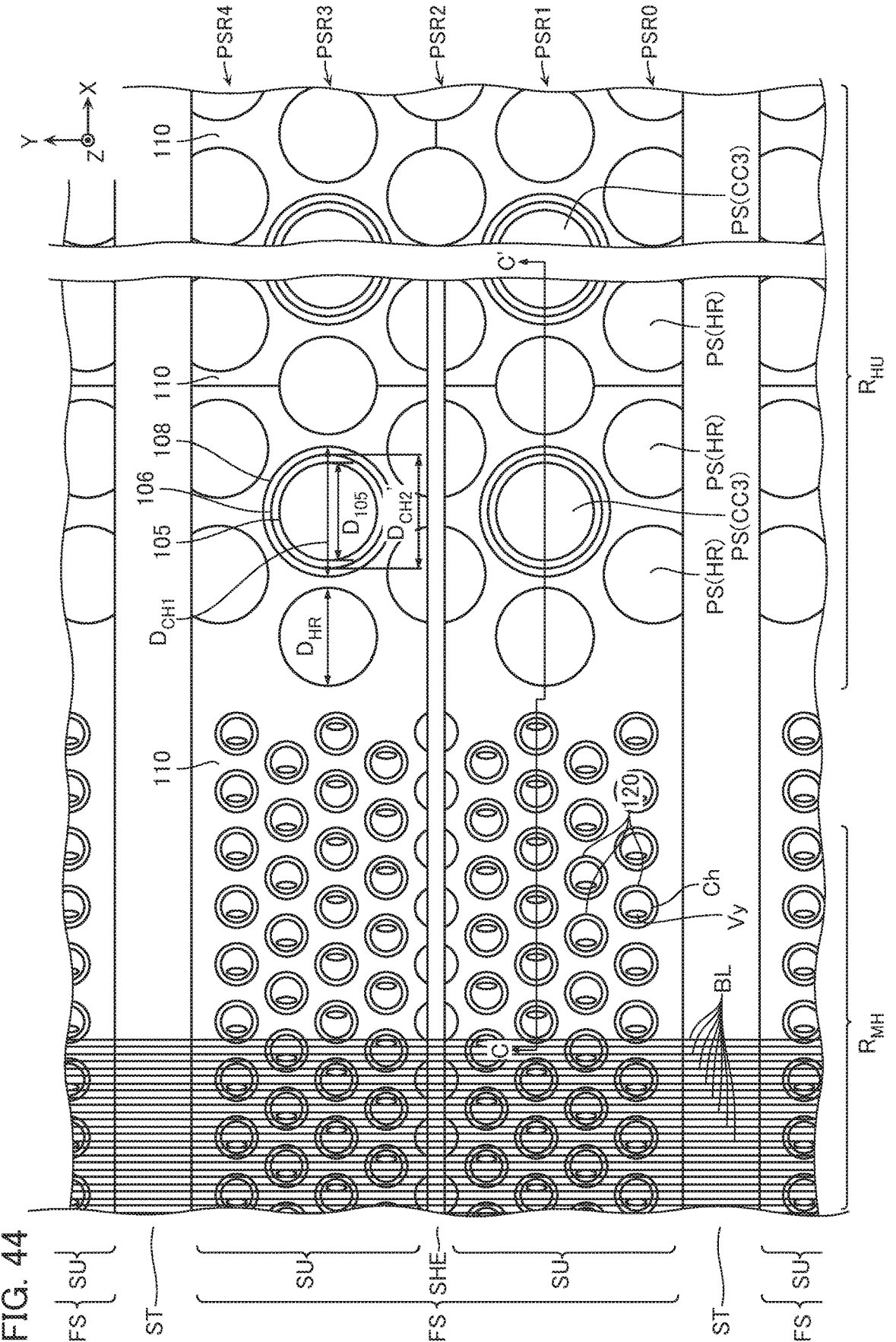
FIG. 44 is a schematic plan view illustrating a configuration of a part of a semiconductor memory device according to a third embodiment.
Figure 45:
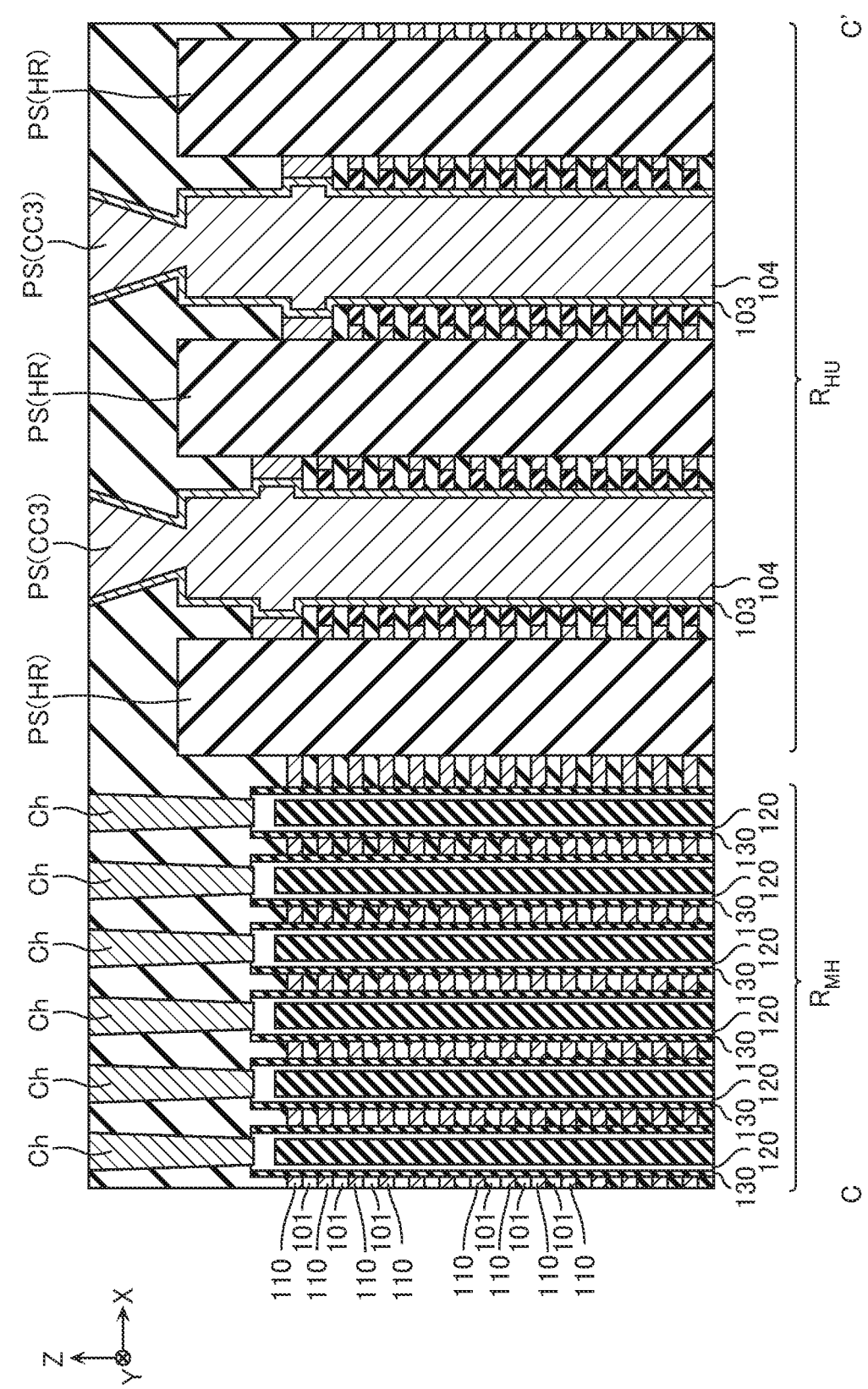
FIG. 45 is a schematic cross-sectional view taking the structure illustrated in FIG. 44 along the line C-C' and viewed in the arrow direction.
Figure 46:
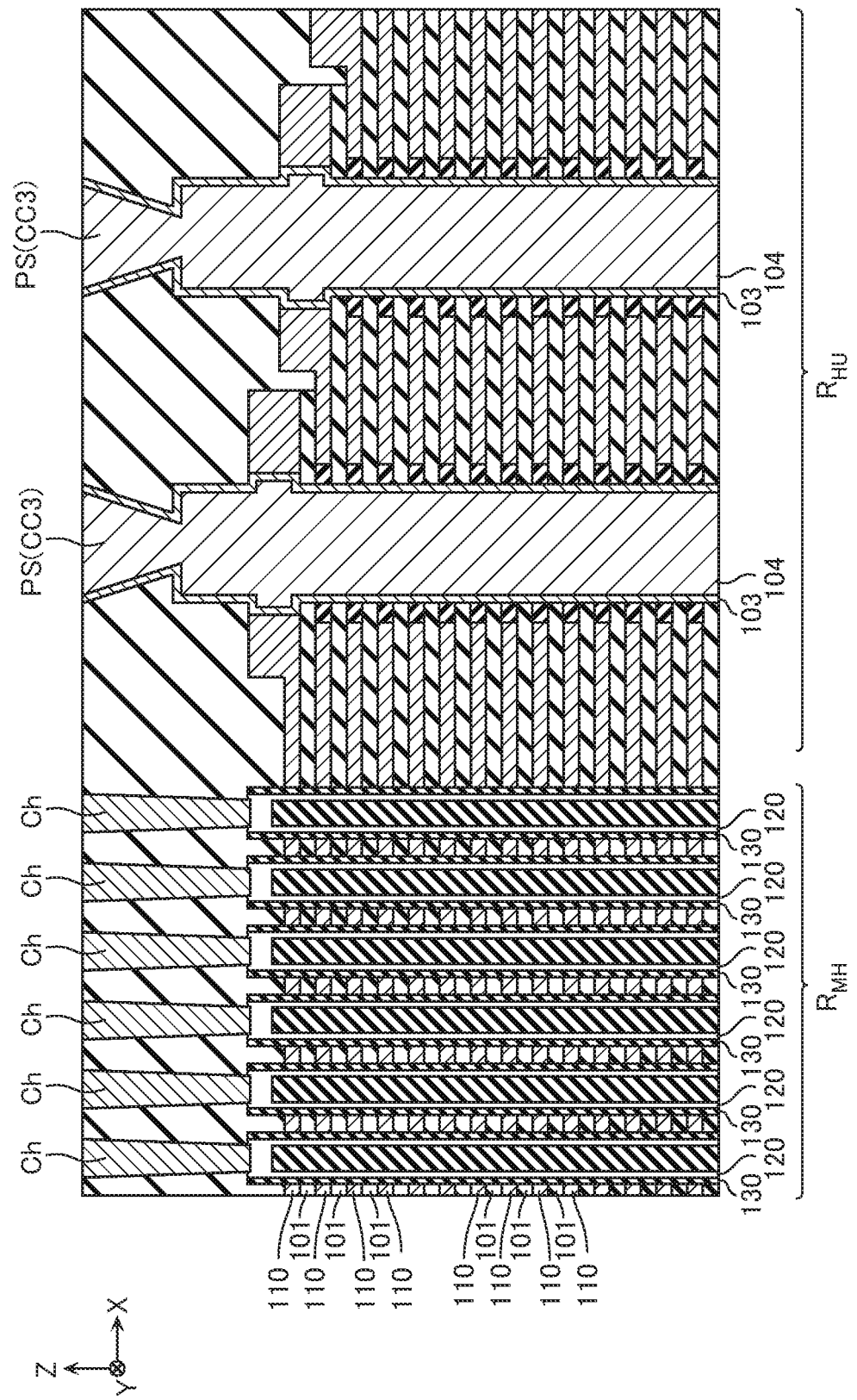
FIG. 46 is a schematic cross-sectional view illustrated with a part of a configuration omitted from FIG. 45.
Figure 47:
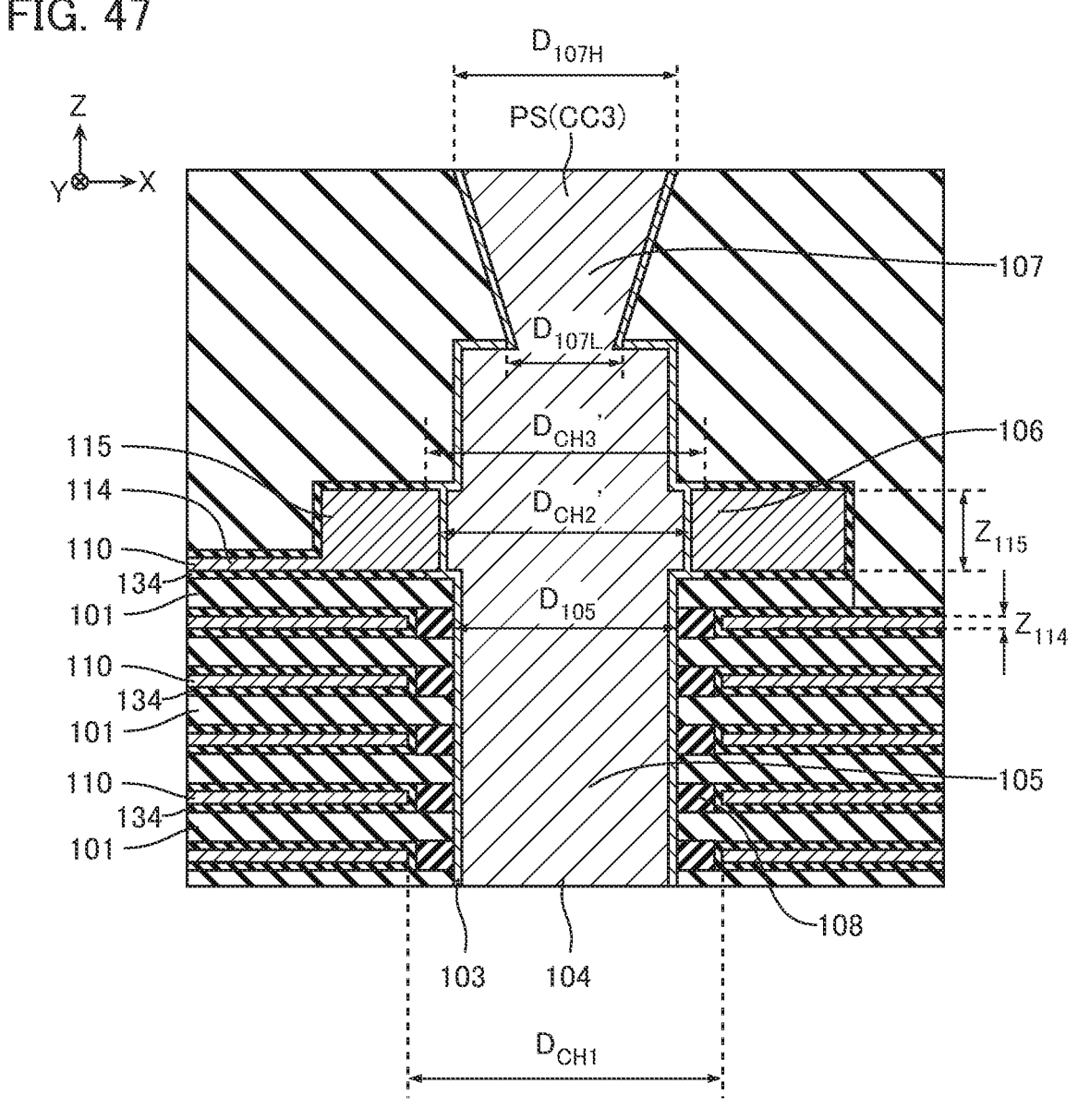
FIG. 47 is a schematic cross-sectional view illustrating an enlarged part of FIG. 46.

Next, with reference to FIG. 44 to FIG. 47, a semiconductor memory device according to the third embodiment will be described. FIG. 44 is a schematic plan view illustrating a configuration of a part of the semiconductor memory device according to the third embodiment. FIG. 45 is a schematic cross-sectional view taking the structure illustrated in FIG. 44 along the line C-C' and viewed in the arrow direction. FIG. 46 is a schematic cross-sectional view illustrated with a part of a configuration (the supporting structures HR) omitted from FIG. 45. FIG. 47 is a schematic cross-sectional view illustrating an enlarged part of FIG. 46.

The semiconductor memory device according to the third embodiment is basically configured similarly to the semiconductor memory device according to the first embodiment. However, as illustrated in FIG. 44 to FIG. 47, the semiconductor memory device according to the third embodiment includes contact electrodes CC3 instead of the contact electrodes CC.

The contact electrode CC3 is basically configured similarly to the contact electrode CC.

However, as described with reference to FIG. 3 and FIG. 8, in the semiconductor memory device according to the first embodiment, the diameter $D_{CH2}$ of the inner peripheral surface of the through-hole disposed in the end portion 115 of the conductive layer 110 has the size same extent of the diameter $D_{CH1}$ of the inner peripheral surface of the through-hole disposed in the part 114 of the conductive layer 110. Additionally, in the semiconductor memory device according to the first embodiment, the diameter $D_{CH3}$ of the inner peripheral surface of the through-hole disposed in the high-dielectric-constant insulating layer 134 is larger than the diameter $D_{CH1}$.

Meanwhile, as illustrated in FIG. 44 and FIG. 47, in the semiconductor memory device according to the third embodiment, a diameter $D_{CH2}'$ of the inner peripheral surface of the through-hole disposed in the end portion 115 of the conductive layer 110 is smaller than the diameter $D_{CH1}$ of the inner peripheral surface of the through-hole disposed in the part 114 of the conductive layer 110. Additionally, in the semiconductor memory device according to the third embodiment, a diameter $D_{CH3}'$ of the inner peripheral surface of the through-hole disposed in the high-dielectric-constant insulating layer 134 is smaller than the diameter $D_{CH1}$.

Note that the diameter $D_{CH2}'$ can be defined by the method similar to the method of the diameter $D_{CH2}$ according to the first embodiment. Additionally, the diameter $D_{CH3}'$ can be defined by the method similar to the method of the diameter $D_{CH3}$ according to the first embodiment.

Next, with reference to FIG. 48 to FIG. 51, the manufacturing method of the semiconductor memory device according to the third embodiment will be described. FIG. 48 to FIG. 51 are schematic cross-sectional views to describe the manufacturing method and illustrate the cross-sectional surfaces corresponding to FIG. 47.

The manufacturing method according to the third embodiment performs the steps up to the step described with reference to FIG. 31 among the steps included in the manufacturing method according to the first embodiment or the second embodiment.

Figure 48:
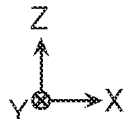
FIG. 48 is a schematic cross-sectional view to describe a manufacturing method of the semiconductor memory device according to the third embodiment.
Figure 48:
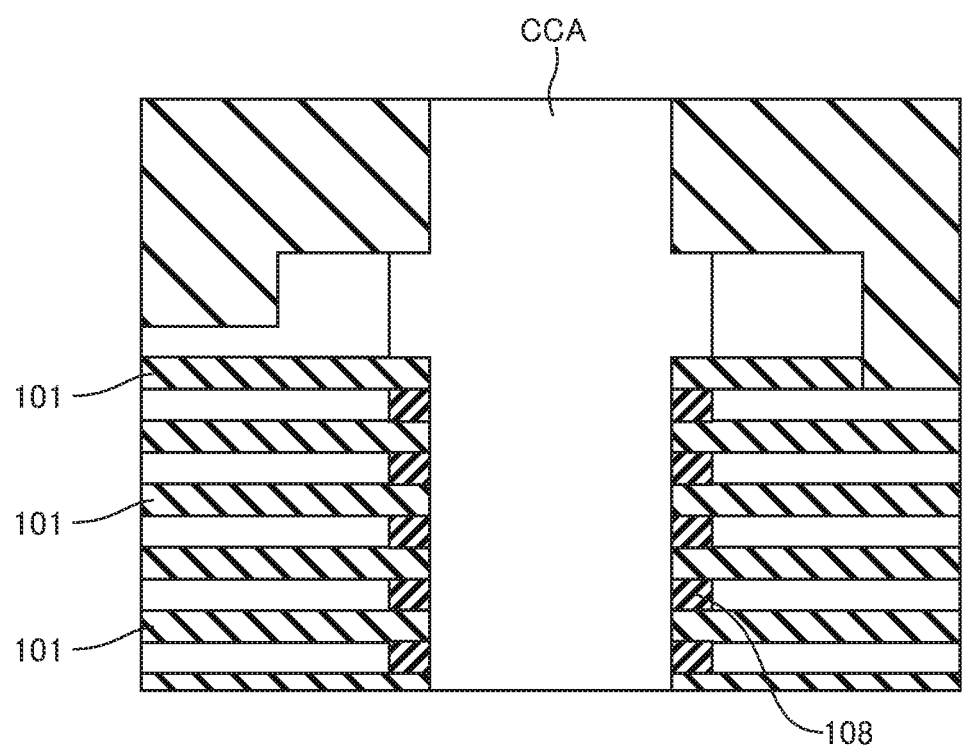
Figure 49:
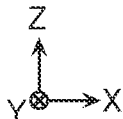
FIG. 49 is a schematic cross-sectional view to describe the manufacturing method.
Figure 49:
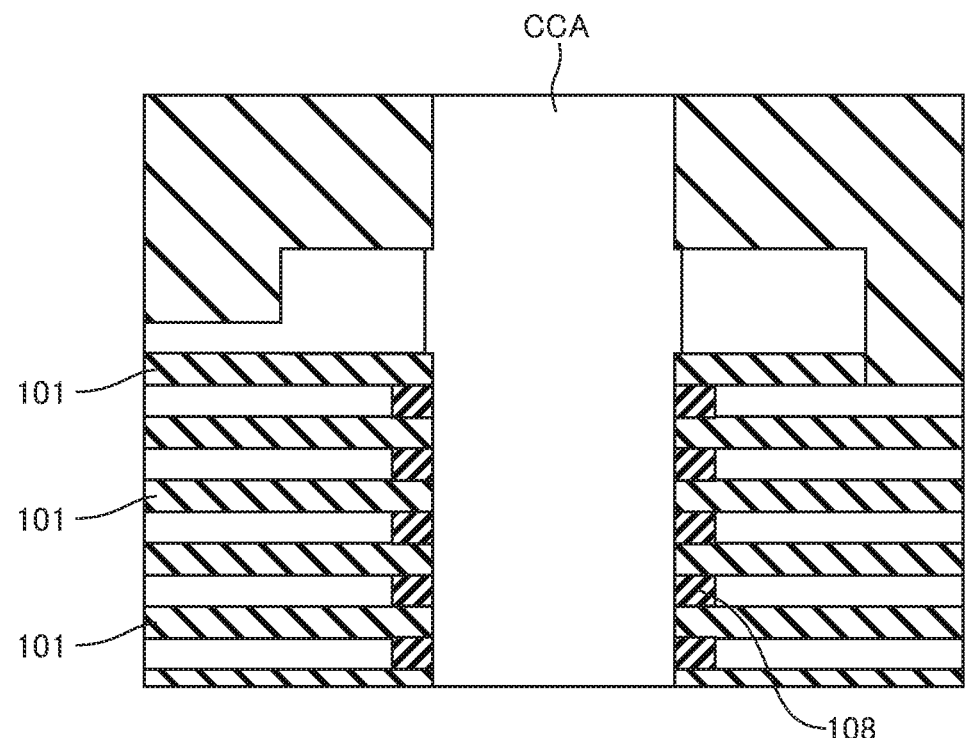

Next, for example, as illustrated in FIG. 48 and FIG. 49, a part of the sacrifice layer CCA is removed via the trench STA. This process is performed by a method, such as wet etching.

Figure 50:
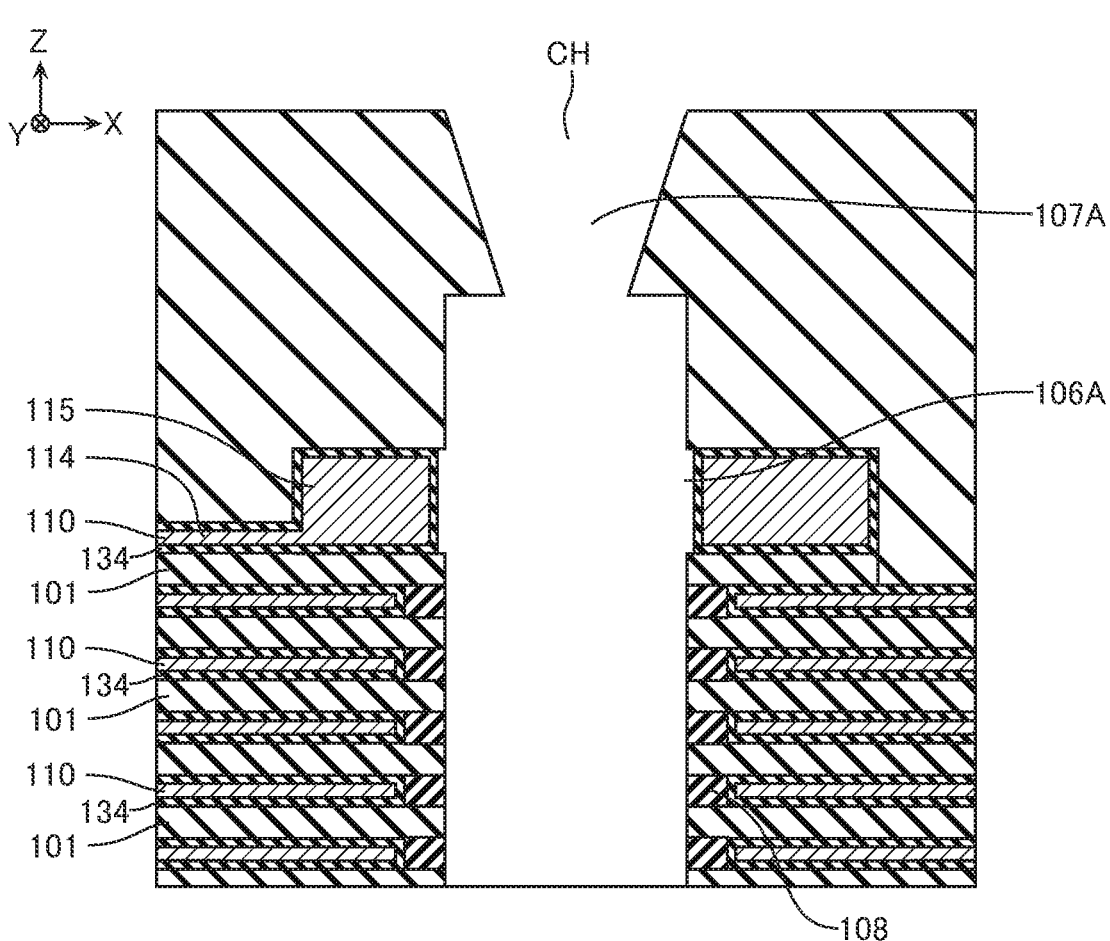
FIG. 50 is a schematic cross-sectional view to describe the manufacturing method.
Figure 51:
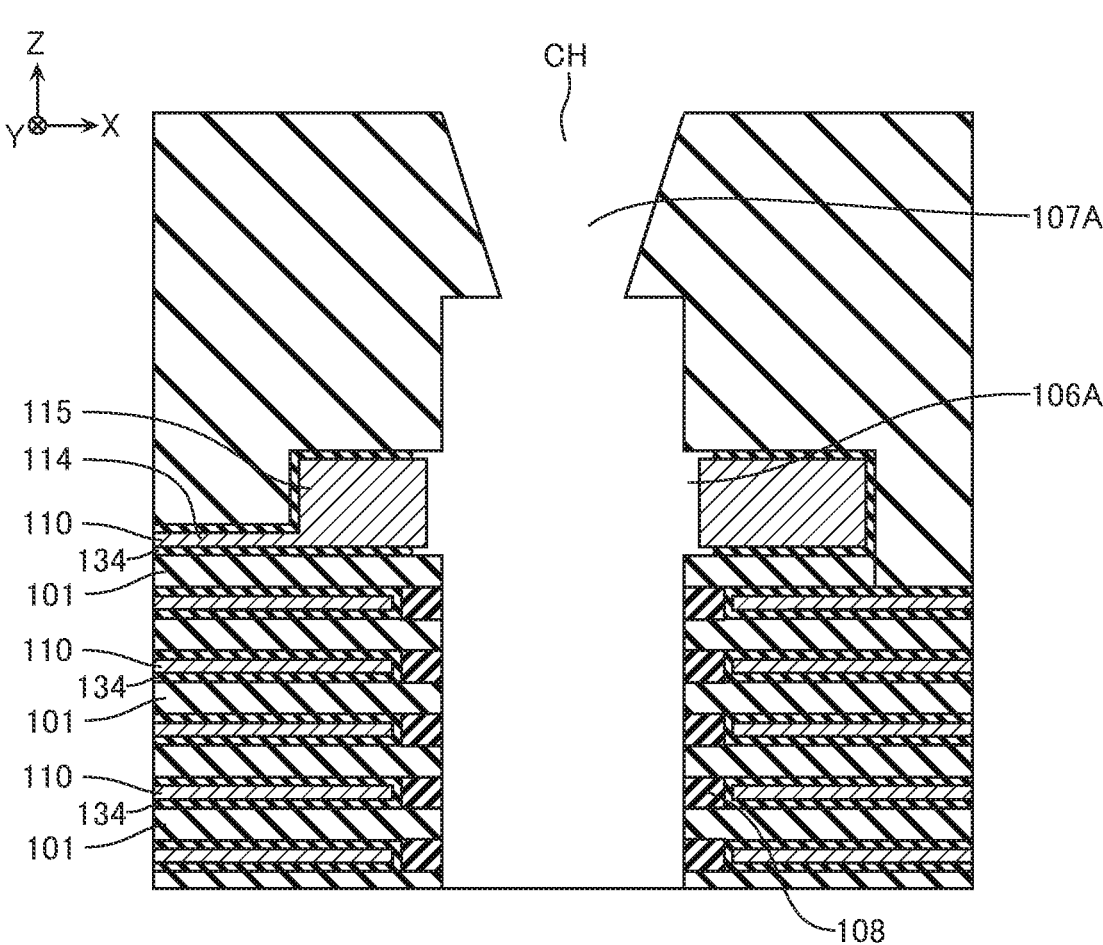
FIG. 51 is a schematic cross-sectional view to describe the manufacturing method.

Afterwards, the steps at and after the step that has been described with reference to FIG. 32 are performed among the steps included in the manufacturing method according to the first embodiment. Note that FIG. 50 and FIG. 51 illustrate the step corresponding to the step described with reference to FIG. 38 and FIG. 39 among the steps included in the manufacturing method according to the third embodiment.

[Effects]

As described with reference to FIG. 8, the upper surface and the lower surface of the part 114 other than the end portion 115 of the conductive layer 110 are covered with the high-dielectric-constant insulating layers 134. Therefore, the distance between the two conductive layers 110 adjacent in the Z-direction is basically around the thickness in the Z-direction of one insulating layer 101 and the two high-dielectric-constant insulating layers 134.

Here, as described above, in the semiconductor memory device according to the first embodiment, the diameter $D_{CH3}$ (FIG. 8) of the inner peripheral surface of the through-hole disposed in the high-dielectric-constant insulating layer 134 is larger than the diameter $D_{CH1}$. Additionally, in the lower surface of the conductive layer 110, the region inside this through-hole is covered with the barrier conductive layer 103 of the contact electrode CC.

Here, the distance between the barrier conductive layer 103 disposed on the lower surface of the conductive layer 110 and the conductive layer 110 immediately below the barrier conductive layer 103 is around the thickness in the Z-direction of one insulating layer 101 and one high-dielectric-constant insulating layer 134, and the distance is smaller than the above-described distance. Accordingly, a problem of withstand voltage possibly occurs at this part.

Here, as described with reference to FIG. 47, in the contact electrode CC3 according to the third embodiment, the diameter $D_{CH3}'$ of the inner peripheral surface of the through-hole disposed in the high-dielectric-constant insulating layer 134 is smaller than the diameter $D_{CH1}$. Additionally, in the lower surface of the conductive layer 110, the region inside this through-hole is covered with the barrier conductive layer 103 of the contact electrode CC.

According to this configuration, the distance between the barrier conductive layer 103 disposed on the lower surface of the conductive layer 110 and the conductive layer 110 immediately below the barrier conductive layer 103 is larger than the thickness in the Z-direction of one insulating layer 101 and one high-dielectric-constant insulating layer 134. Therefore, the problem of withstand voltage can be reduced.

Fourth Embodiment

Figure 52:
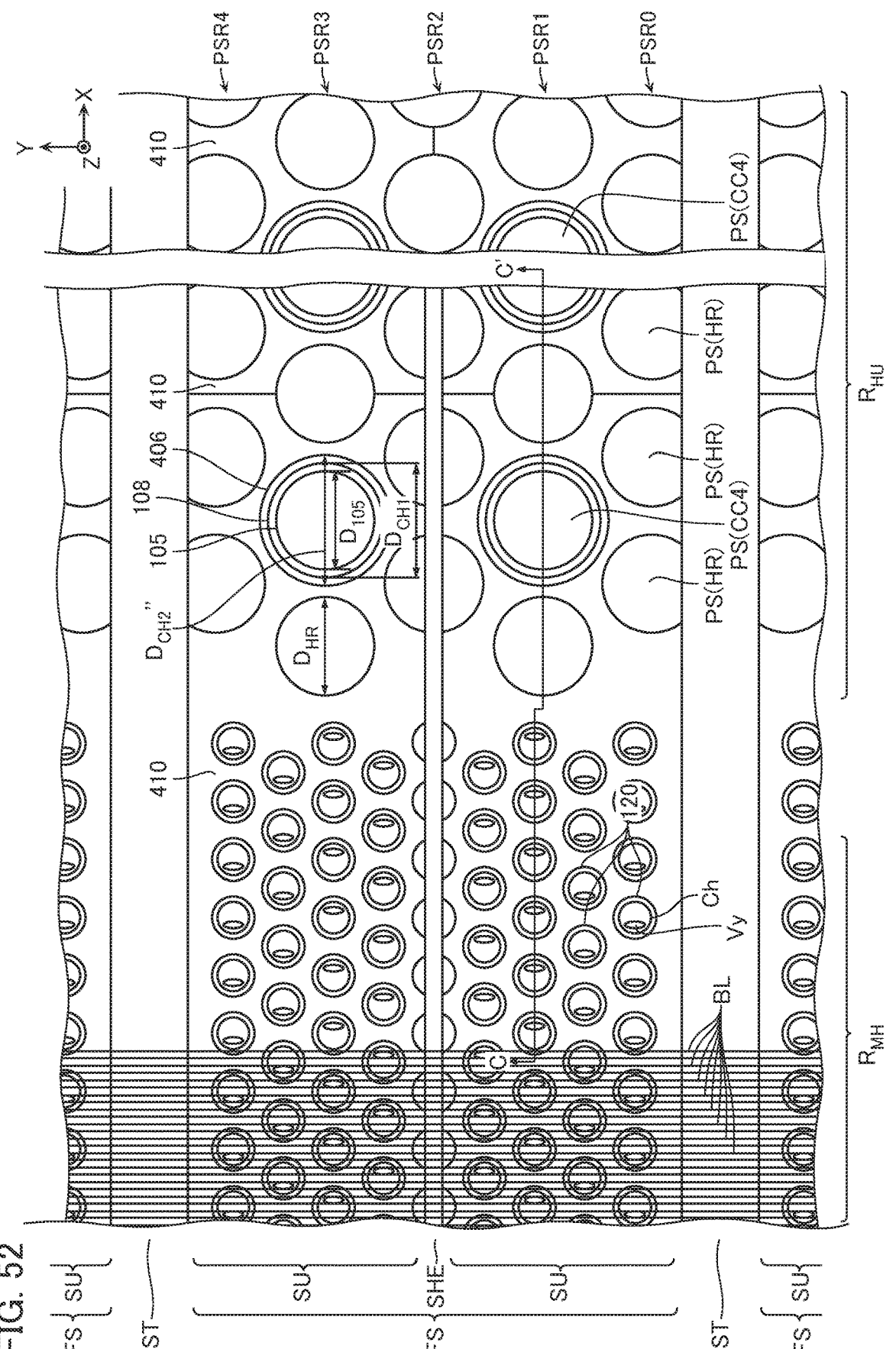
FIG. 52 is a schematic plan view illustrating a configuration of a part of a semiconductor memory device according to a fourth embodiment.
Figure 53:
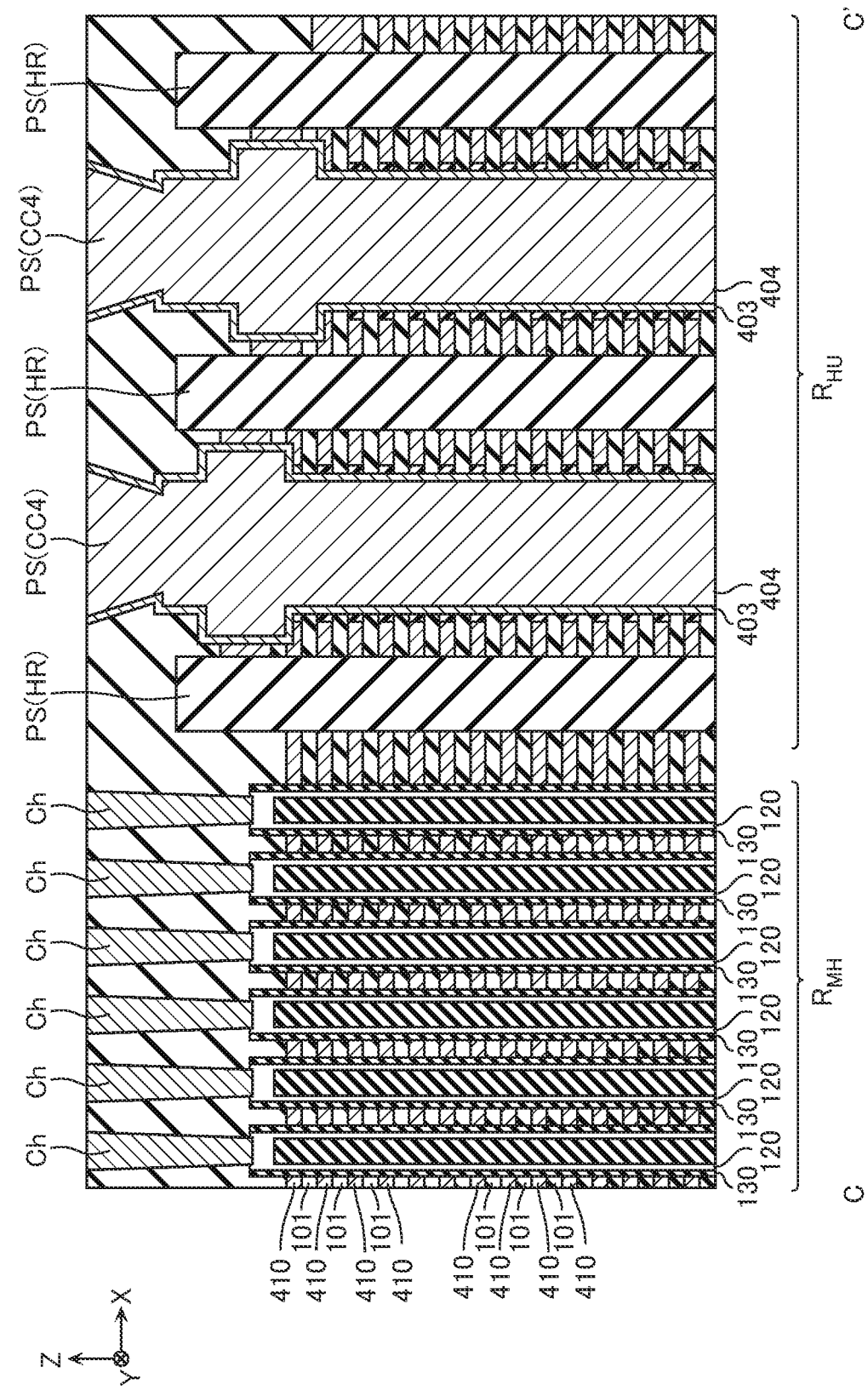
FIG. 53 is a schematic cross-sectional view taking the structure illustrated in FIG. 52 along the line C-C' and viewed in the arrow direction.
Figure 54:
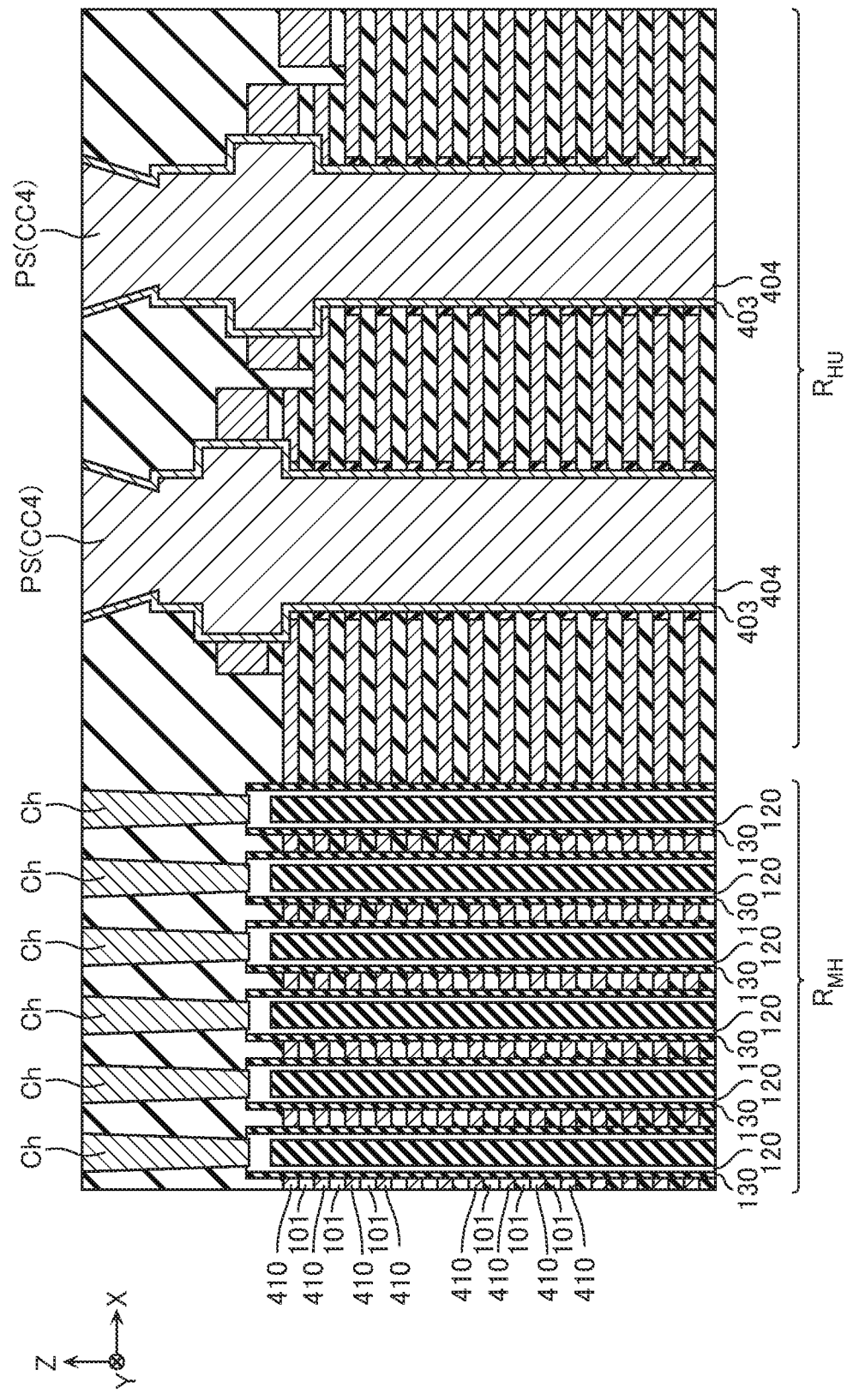
FIG. 54 is a schematic cross-sectional view illustrated with a part of a configuration omitted from FIG. 53.
Figure 55:
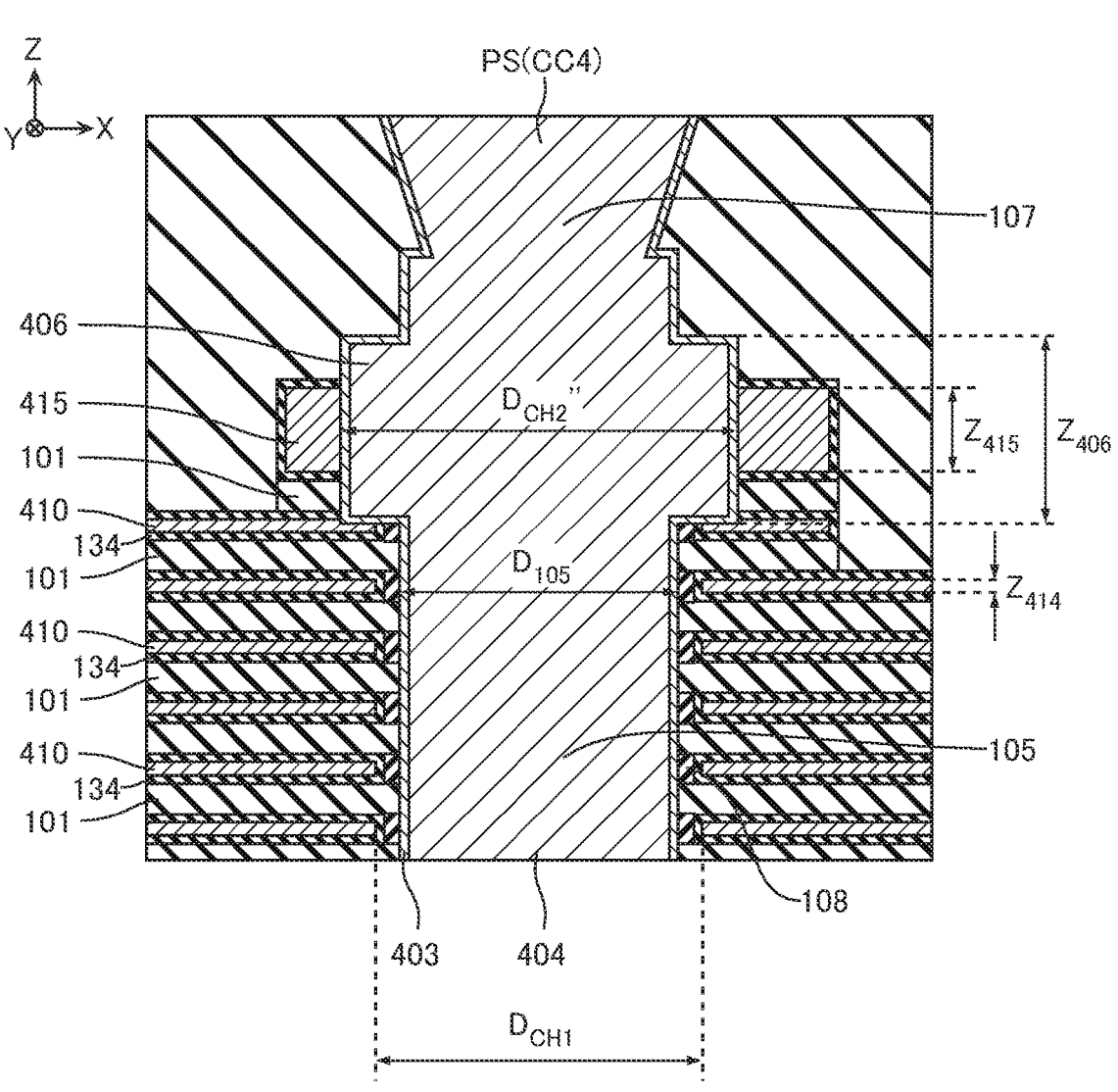
FIG. 55 is a schematic cross-sectional view illustrating an enlarged part of FIG. 54.

Next, with reference to FIG. 52 to FIG. 55, a semiconductor memory device according to the fourth embodiment will be described. FIG. 52 is a schematic plan view illustrating a configuration of a part of the semiconductor memory device according to the fourth embodiment. FIG. 53 is a schematic cross-sectional view taking the structure illustrated in FIG. 52 along the line C-C' and viewed in the arrow direction. FIG. 54 is a schematic cross-sectional view illustrated with a part of a configuration (the supporting structures HR) omitted from FIG. 53. FIG. 55 is a schematic cross-sectional view illustrating an enlarged part of FIG. 54.

The semiconductor memory device according to the fourth embodiment is basically configured similarly to the semiconductor memory device according to the first embodiment. However, as illustrated in FIG. 52 to FIG. 55, the semiconductor memory device according to the fourth embodiment includes conductive layers 410 instead of the conductive layers 110. Additionally, the semiconductor memory device according to the fourth embodiment includes contact electrodes CC4 instead of the contact electrodes CC.

The conductive layer 410 is basically configured similarly to the conductive layer 110. However, as described with reference to FIG. 8, in the conductive layer 110, the thickness $Z_{115}$ in the Z-direction of the end portion 115 in the X-direction is larger than the thickness $Z_{114}$ in the Z-direction of another part. Meanwhile, as illustrated in FIG. 55, a thickness $Z_{414}$ in the Z-direction of the conductive layer 410 is approximately uniform across the whole including the end portions in the X-direction.

Additionally, a conductive layer 415 is disposed on the upper surface of the end portion in the X-direction of the conductive layer 410 via the insulating layer 101 and the high-dielectric-constant insulating layer 134. The conductive layer 415, for example, may include a stacked film of a barrier conductive layer of, for example, titanium nitride (TiN) and a metal layer of, for example, tungsten (W).

Here, the end portion in the X-direction of the conductive layer 410 has a through-hole disposed corresponding to the contact electrode CC4. FIG. 52 and FIG. 55 illustrate the diameter of this through-hole as the diameter $D_{CH1}$. Additionally, the conductive layer 415 has a through-hole disposed corresponding to the contact electrode CC4. FIG. 52 and FIG. 55 illustrate the diameter of this through-hole as a diameter $D_{CH2}''$. In the illustrated example, the diameter $D_{CH2}''$ is larger than the diameter $D_{CH1}$.

Note that the diameter $D_{CH2}''$, for example, can be defined by the method as follows. For example, the XY cross-sectional surface corresponding to the conductive layer 415 is observed with SEM, TEM, or the like. Next, in this XY cross-sectional surface, a circle is applied along the through-hole corresponding to the contact electrode CC4 of the conductive layer 415. The diameter of the circle applied to this through-hole may be the diameter $D_{CH2}''$.

As illustrated in FIG. 55, the upper surface of the end portion in the X-direction of the conductive layer 410 is covered with the high-dielectric-constant insulating layer 134 excluding the contact part of the conductive layer 410 with the contact electrode CC4. Additionally, the lower surface of the end portion in the X-direction of the conductive layer 410 and the inner peripheral surface of the through-hole are covered with the high-dielectric-constant insulating layer 134 across the entire surface. The upper surface and the lower surface and the side surfaces in the X-direction and the Y-direction of the conductive layer 415 are covered with the high-dielectric-constant insulating layer 134 across the entire surface.

The contact electrode CC4 is basically configured similarly to the contact electrode CC.

However, the contact electrode CC4 may include, for example, a stacked film of a barrier conductive layer 403 of, for example, titanium nitride (TiN) and the metal layer 404 of, for example, tungsten (W).

The contact electrode CC4 includes apart 406 instead of the part 106 (FIG. 8). The part 406 is basically configured similarly to the part 106. However, a width $Z_{406}$ in the Z-direction of the part 406 is larger than the sum of a thickness $Z_{415}$ in the Z-direction of the conductive layer 415 and a thickness of the two high-dielectric-constant insulating layers 134. A part of the lower surface of the part 406 is in contact with a part of the upper surface of the conductive layer 410. The height position of the upper surface of the part 406 is disposed above the height position of the upper surface of the high-dielectric-constant insulating layer 134 covering the upper surface of the conductive layer 415.

Figure 56:
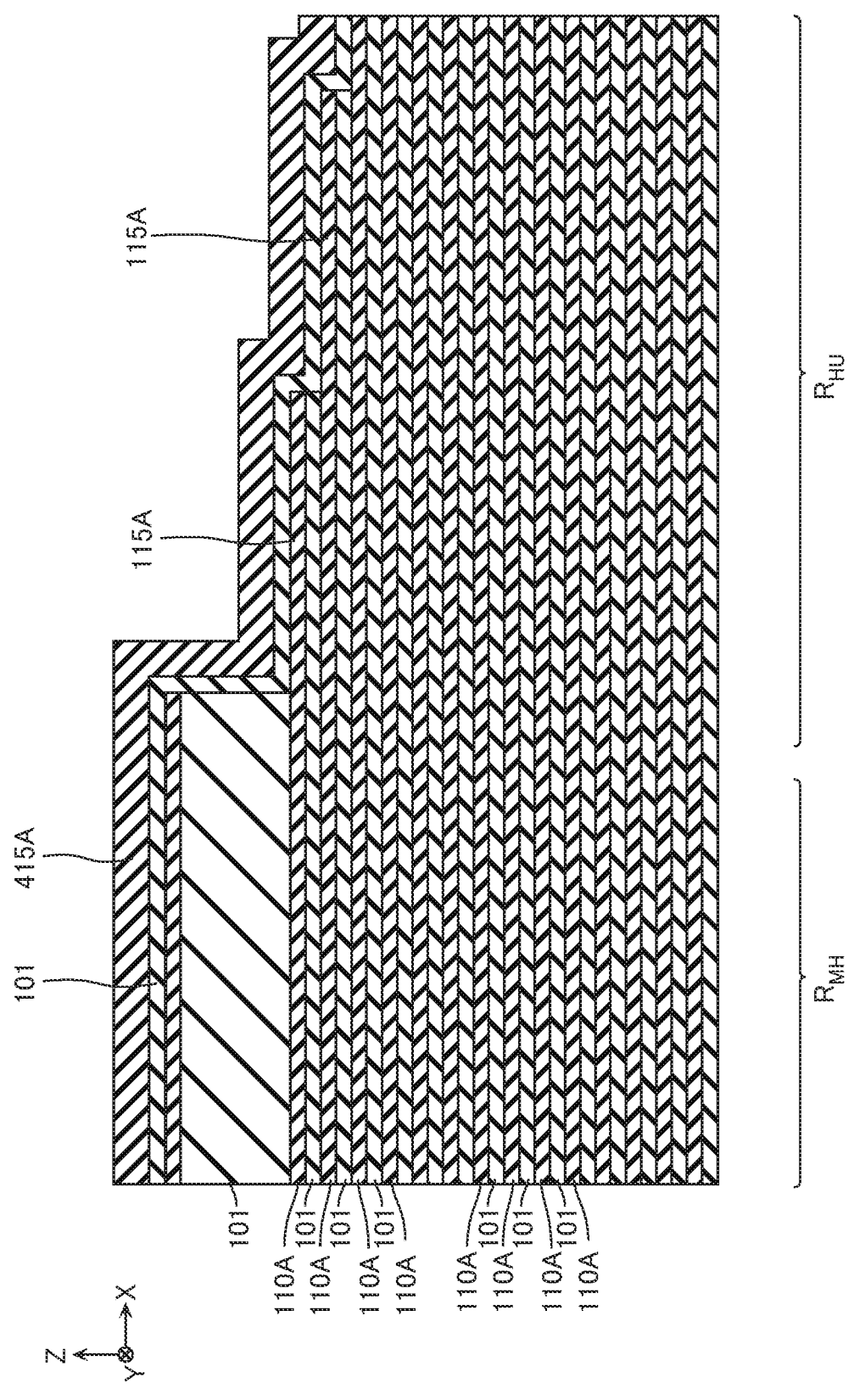
FIG. 56 is a schematic cross-sectional view to describe a manufacturing method of the semiconductor memory device according to the fourth embodiment.
Figure 57:
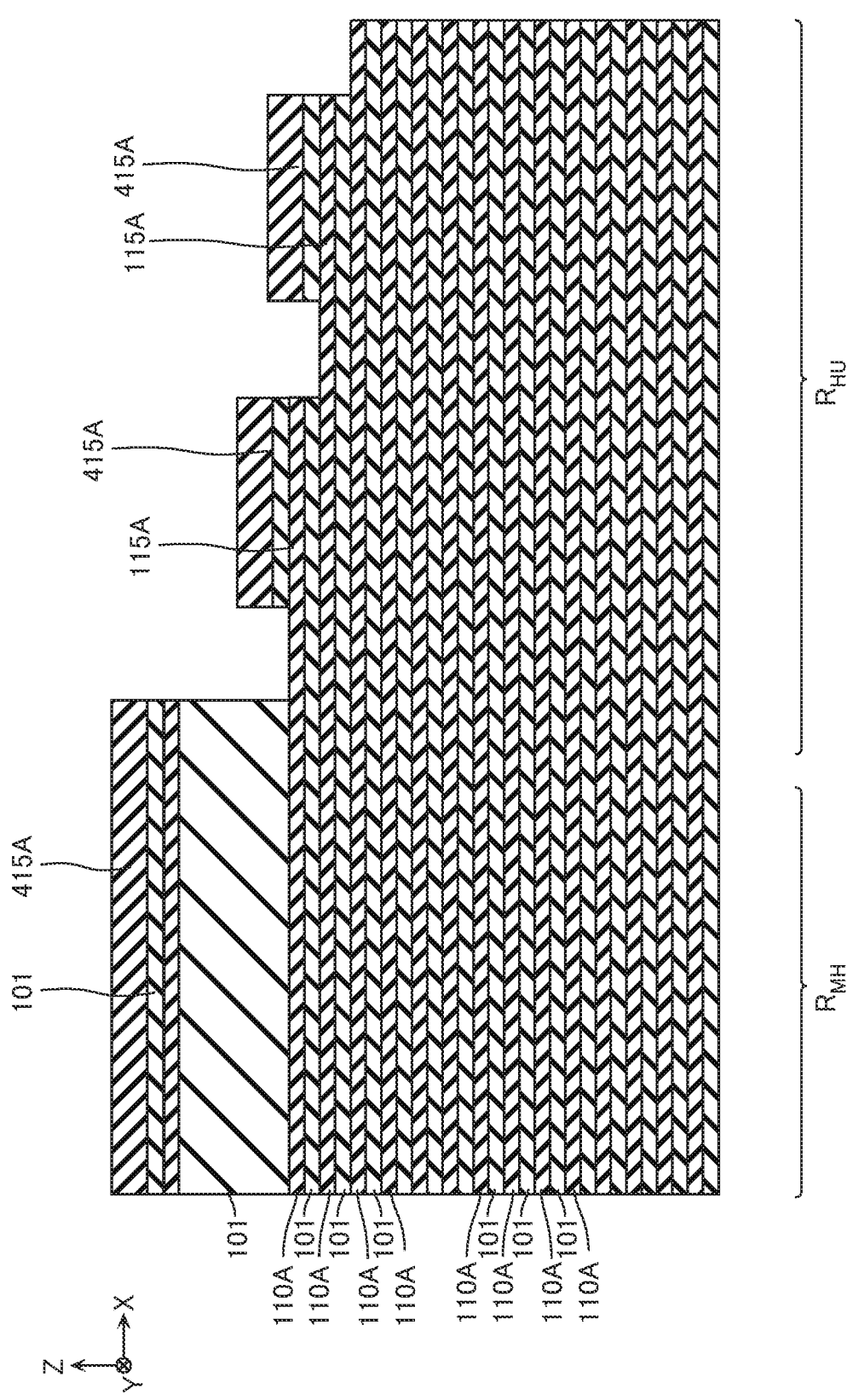
FIG. 57 is a schematic cross-sectional view to describe the manufacturing method.

Next, with reference to FIG. 56 to FIG. 66, a manufacturing method of the semiconductor memory device according to the fourth embodiment will be described. FIG. 56 and FIG. 57 are schematic cross-sectional views to describe the manufacturing method and illustrate the cross-sectional surfaces corresponding to FIG. 53. FIG. 58 to FIG. 66 are schematic cross-sectional views to describe the manufacturing method and illustrate the cross-sectional surfaces corresponding to FIG. 55.

The manufacturing method according to the fourth embodiment performs the steps up to the step described with reference to FIG. 10 among the steps included in the manufacturing method according to the first embodiment.

Next, for example, as illustrated in FIG. 56, the insulating layer 101 and a sacrifice layer 415A are formed on the structure described with reference to FIG. 10. The sacrifice layer 415A contains, for example, silicon nitride ($Si_3N_4$). The insulating layer 101 and the sacrifice layer 415A cover the plurality of surfaces 115A and the side surfaces of the sacrifice layers 110A and the insulating layers 101. This process is performed by a method, such as CVD.

Next, among the steps included in the manufacturing method according to the second embodiment, the step described with reference to FIG. 41 to the step described with reference to FIG. 43 are performed. Thus, the structure as illustrated in FIG. 57 is formed.

Figure 58:
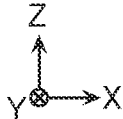
FIG. 58 is a schematic cross-sectional view to describe the manufacturing method.
Figure 58:
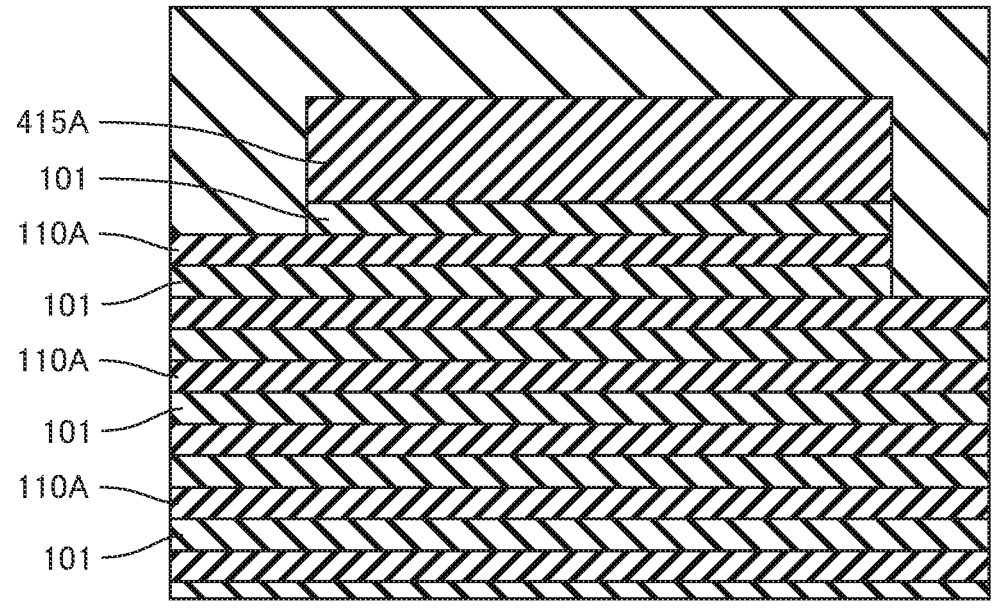
Figure 59:
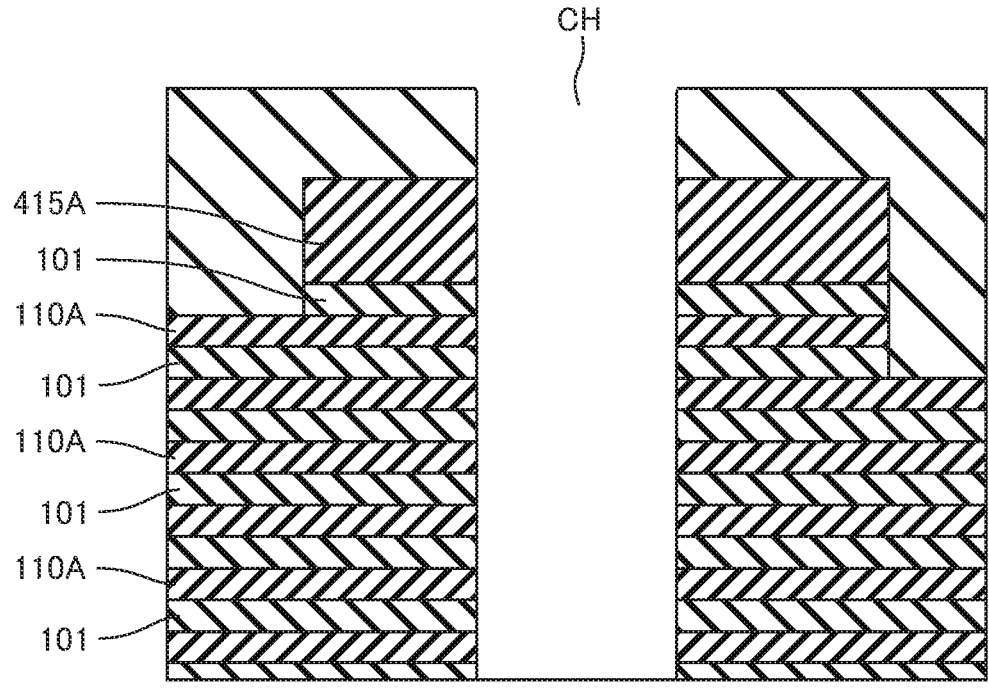
FIG. 59 is a schematic cross-sectional view to describe the manufacturing method.

Next, the step described with reference to FIG. 18 and FIG. 19 is performed. In this step, as illustrated in FIG. 58 and FIG. 59, the contact hole CH passes through the sacrifice layer 415A.

Figure 60:
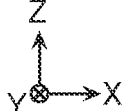
FIG. 60 is a schematic cross-sectional view to describe the manufacturing method.
Figure 60:
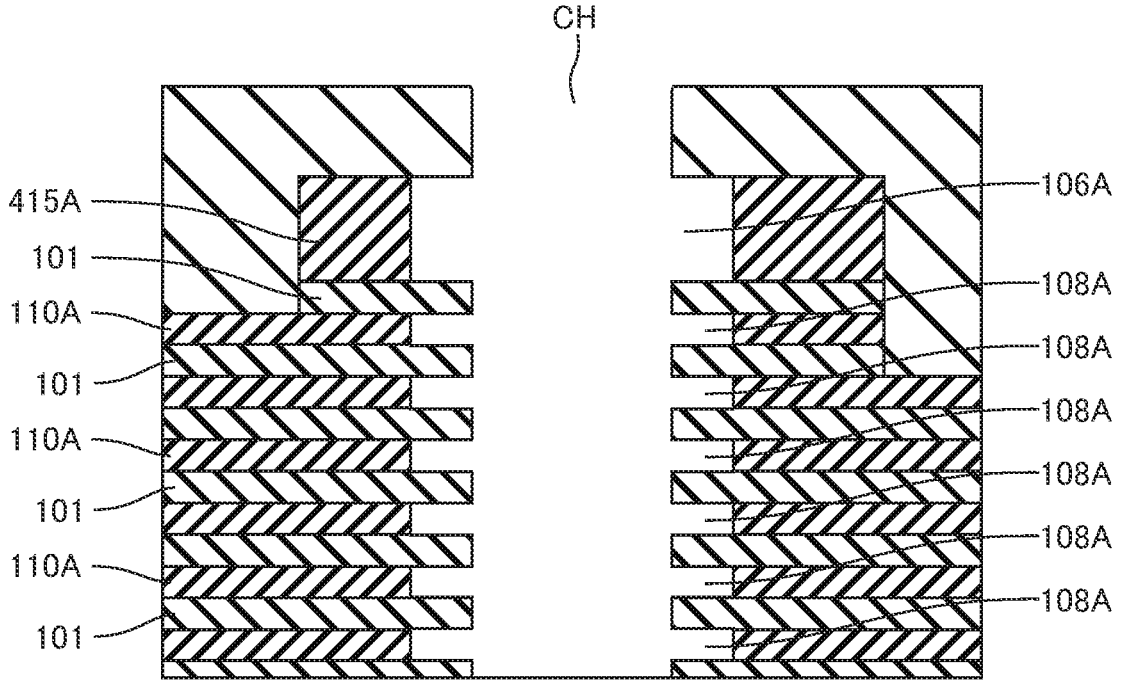

Next, the step described with reference to FIG. 20 and FIG. 21 is performed. Thus, the structure as illustrated in FIG. 60 is formed.

Figure 61:
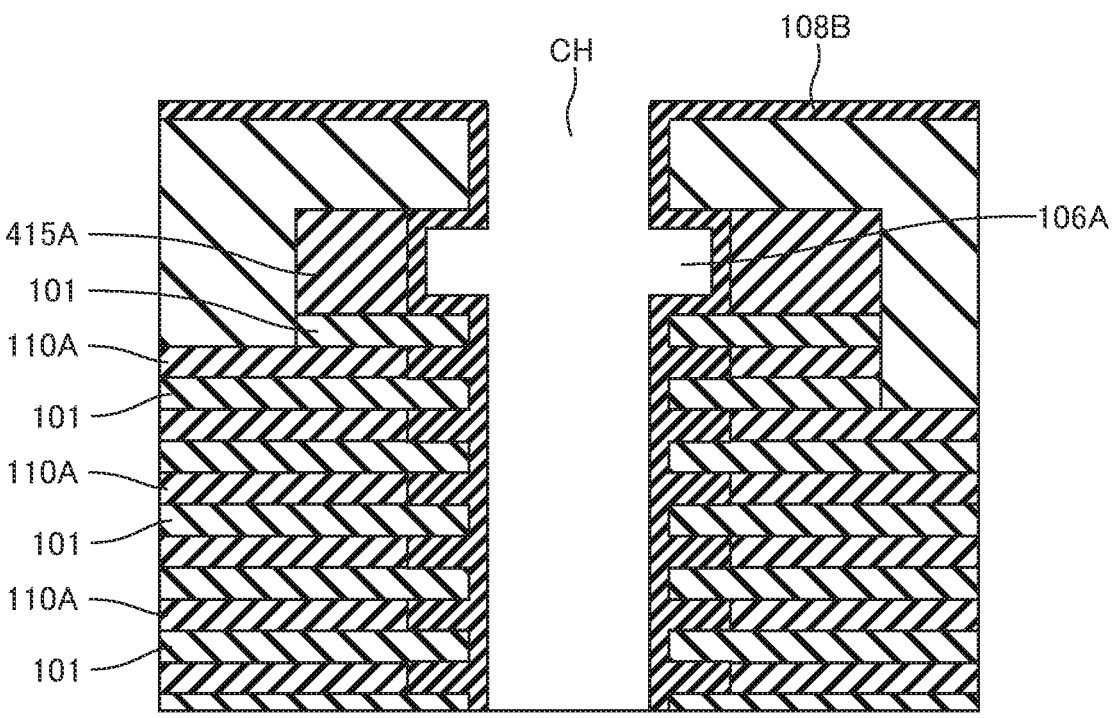
FIG. 61 is a schematic cross-sectional view to describe the manufacturing method.

Next, the step described with reference to FIG. 22 is performed. Thus, the structure as illustrated in FIG. 61 is formed.

Figure 62:
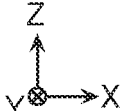
FIG. 62 is a schematic cross-sectional view to describe the manufacturing method.
Figure 62:
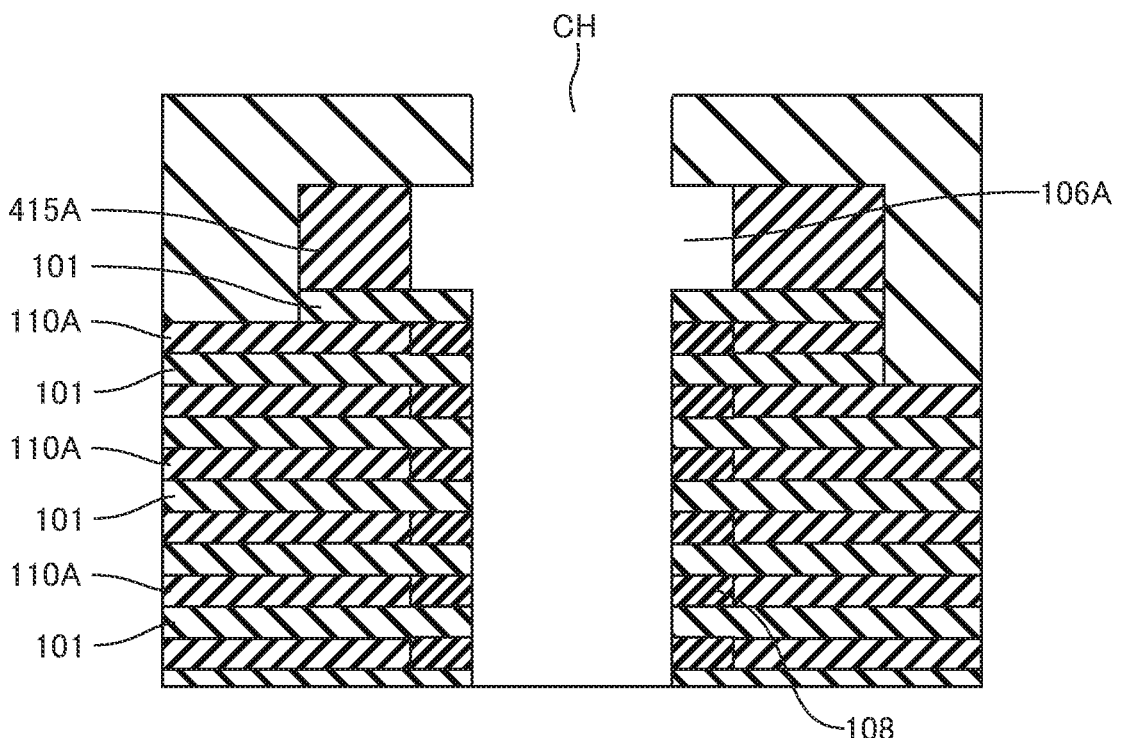

Next, the step described with reference to FIG. 23 is performed. Thus, the structure as illustrated in FIG. 62 is formed.

Figure 63:
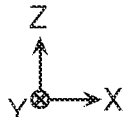
FIG. 63 is a schematic cross-sectional view to describe the manufacturing method.
Figure 63:
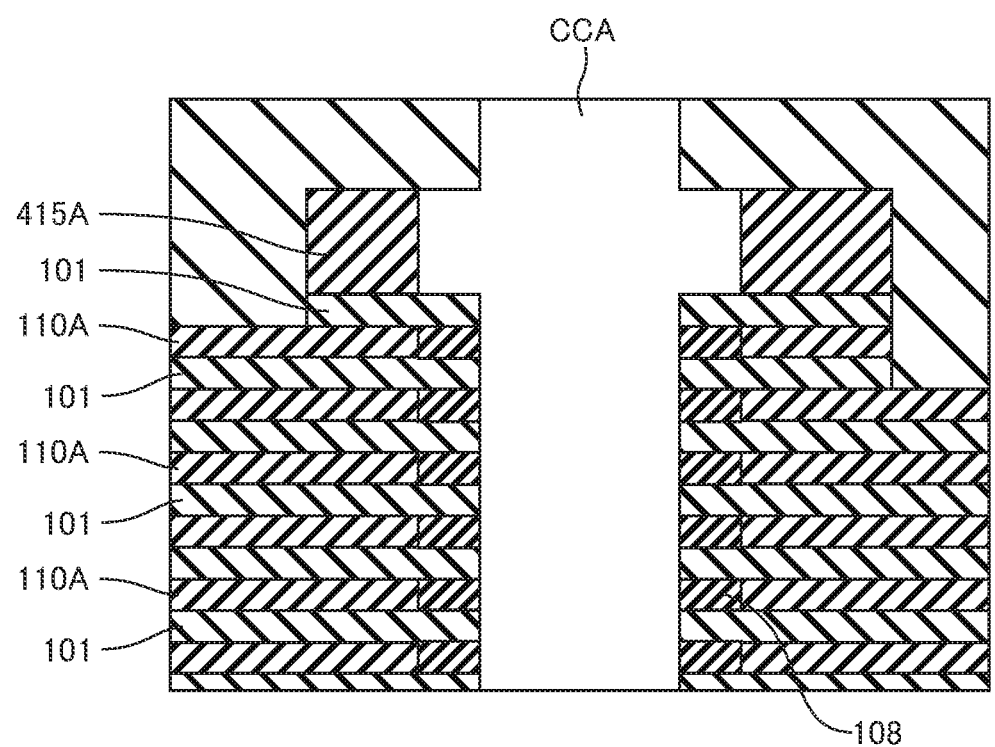

Next, the step described with reference to FIG. 24 and FIG. 25 is performed. Thus, the structure as illustrated in FIG. 63 is formed.

Figure 64:
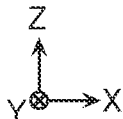
FIG. 64 is a schematic cross-sectional view to describe the manufacturing method.
Figure 64:
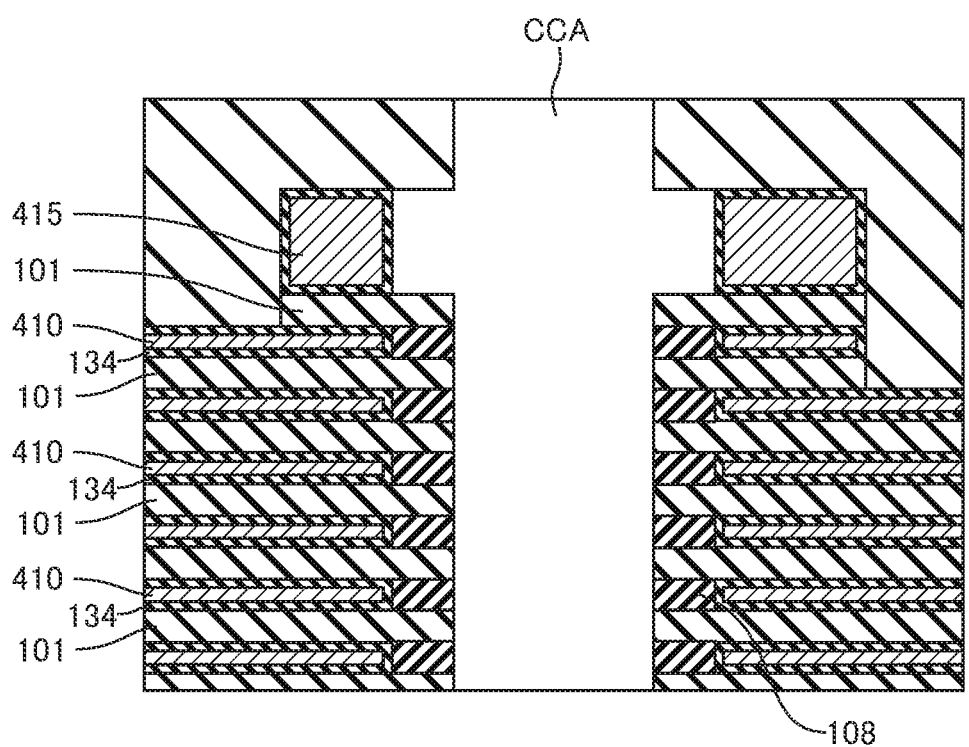

Next, among the steps included in the manufacturing method according to the first embodiment, the step described with reference to FIG. 26 to the step described with reference to FIG. 33 are performed. Thus, the structure as illustrated in FIG. 64 is formed.

Figure 65:
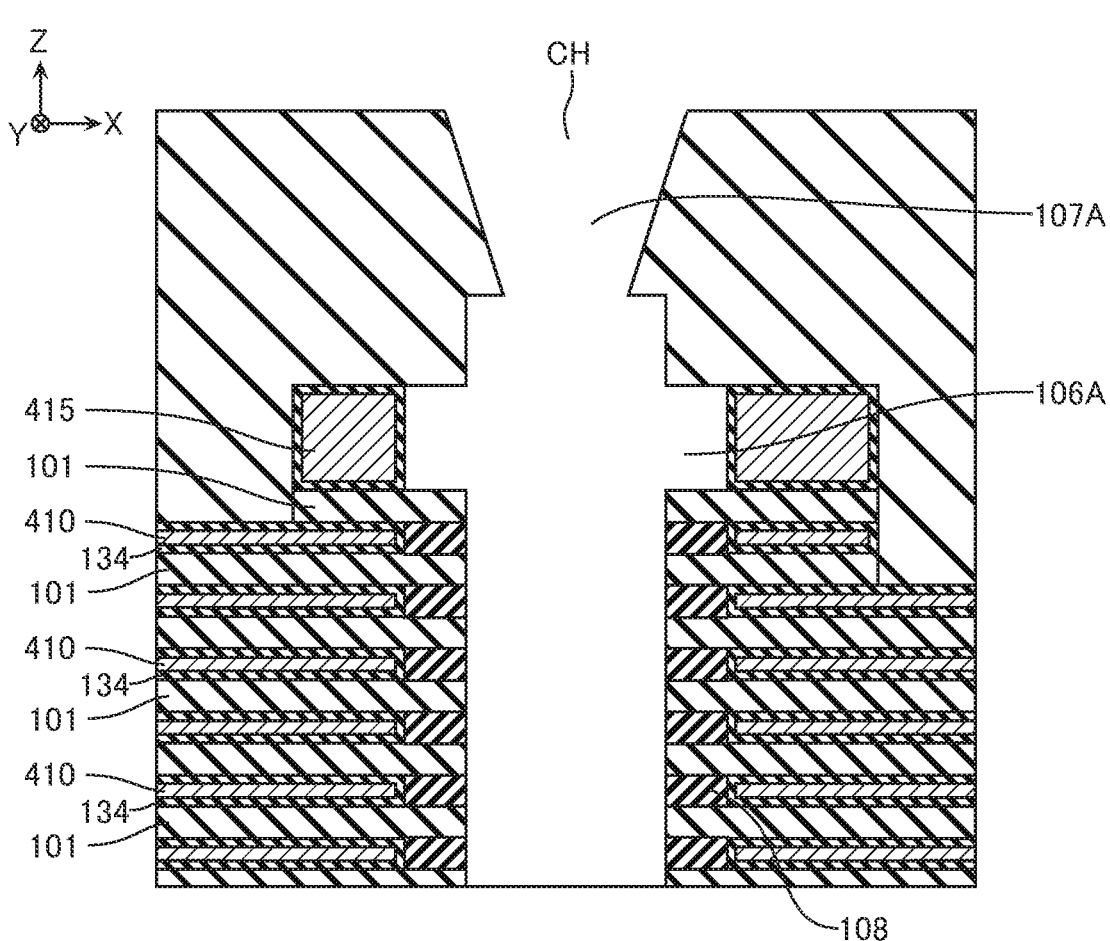
FIG. 65 is a schematic cross-sectional view to describe the manufacturing method.

Next, among the steps included in the manufacturing method according to the first embodiment, the step described with reference to FIG. 34 and FIG. 35 to the step described with reference to FIG. 37 are performed. Thus, the structure as illustrated in FIG. 65 is formed.

Figure 66:
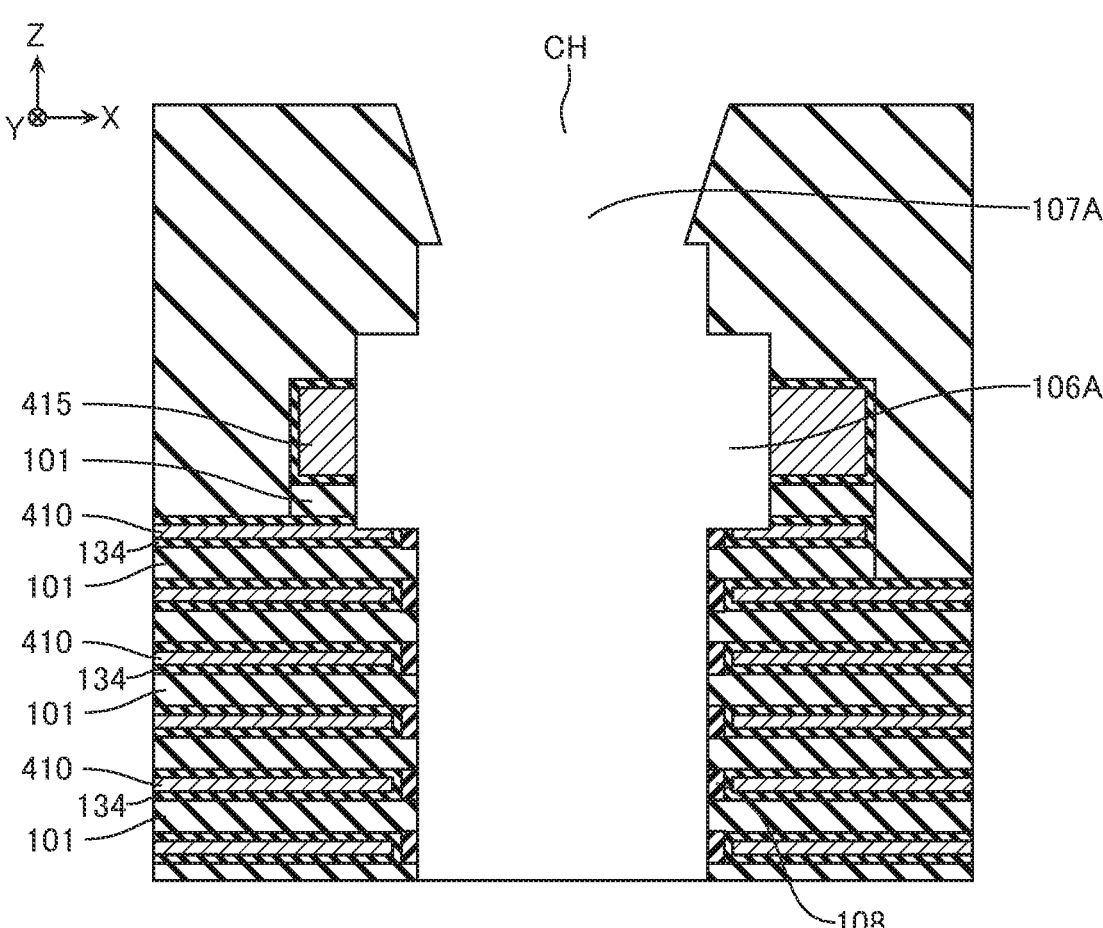
FIG. 66 is a schematic cross-sectional view to describe the manufacturing method.

Next, as illustrated in FIG. 66, a part of the insulating layers 101 and 108 and the high-dielectric-constant insulating layer 134 are removed to expose a part of the upper surface of the conductive layer 410. This process is performed by wet etching or the like.

Next, for example, as illustrated in FIG. 55, the contact electrode CC4 is formed inside the contact hole CH. This process is performed by CVD or the like.

Afterwards, by forming the wiring and the like, the semiconductor memory device according to the fourth embodiment is formed.

[Effects]

In the semiconductor memory device according to the fourth embodiment, the lower surface of the part 406 of the contact electrode CC4 is disposed above the lower surface of the conductive layer 110 connected to this contact electrode CC4. Therefore, the problem of withstand voltage can be reduced also with the semiconductor memory device according to the fourth embodiment.

Fifth Embodiment

Figure 67:
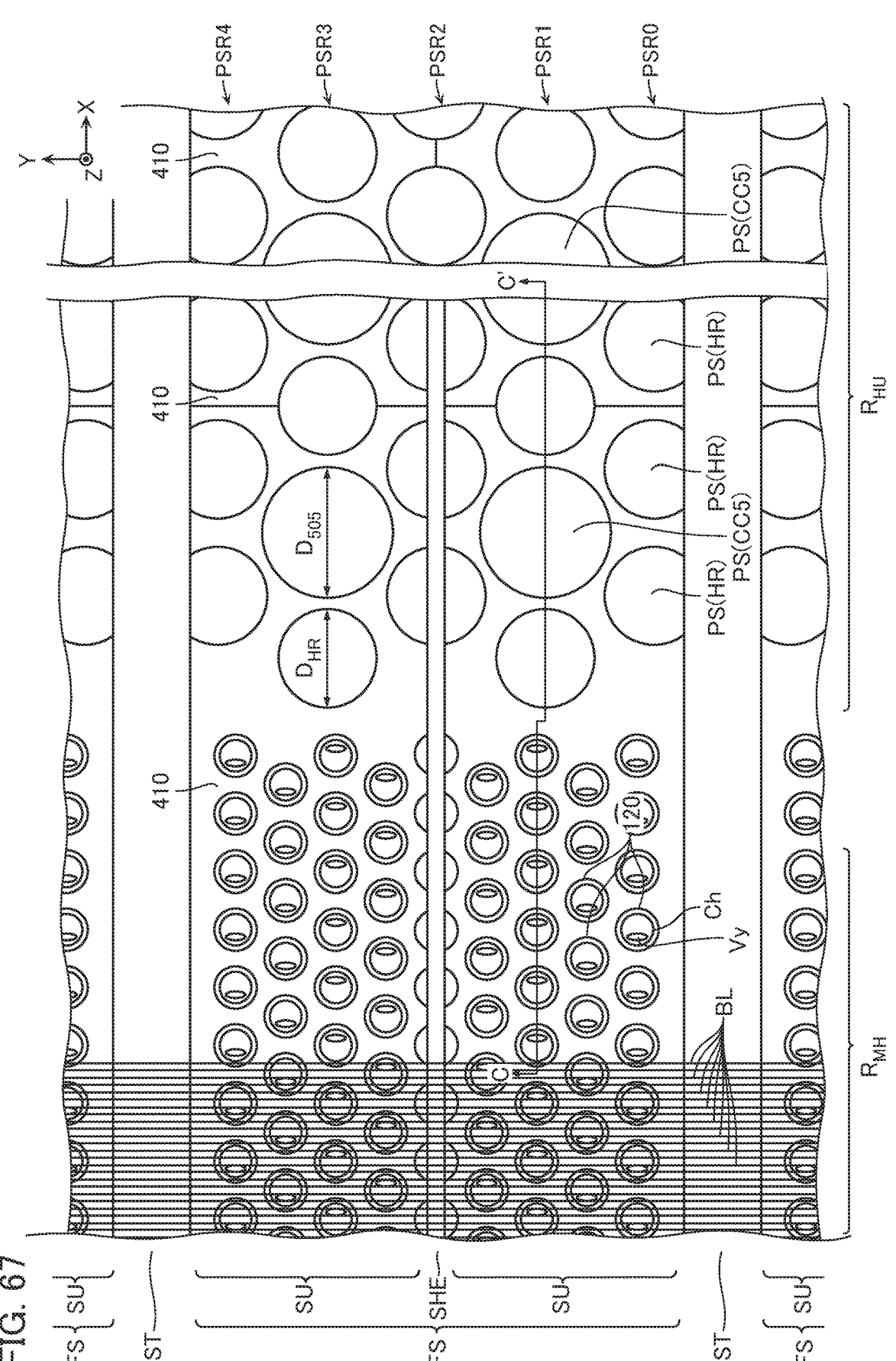
FIG. 67 is a schematic plan view illustrating a configuration of a part of a semiconductor memory device according to a fifth embodiment.
Figure 68:
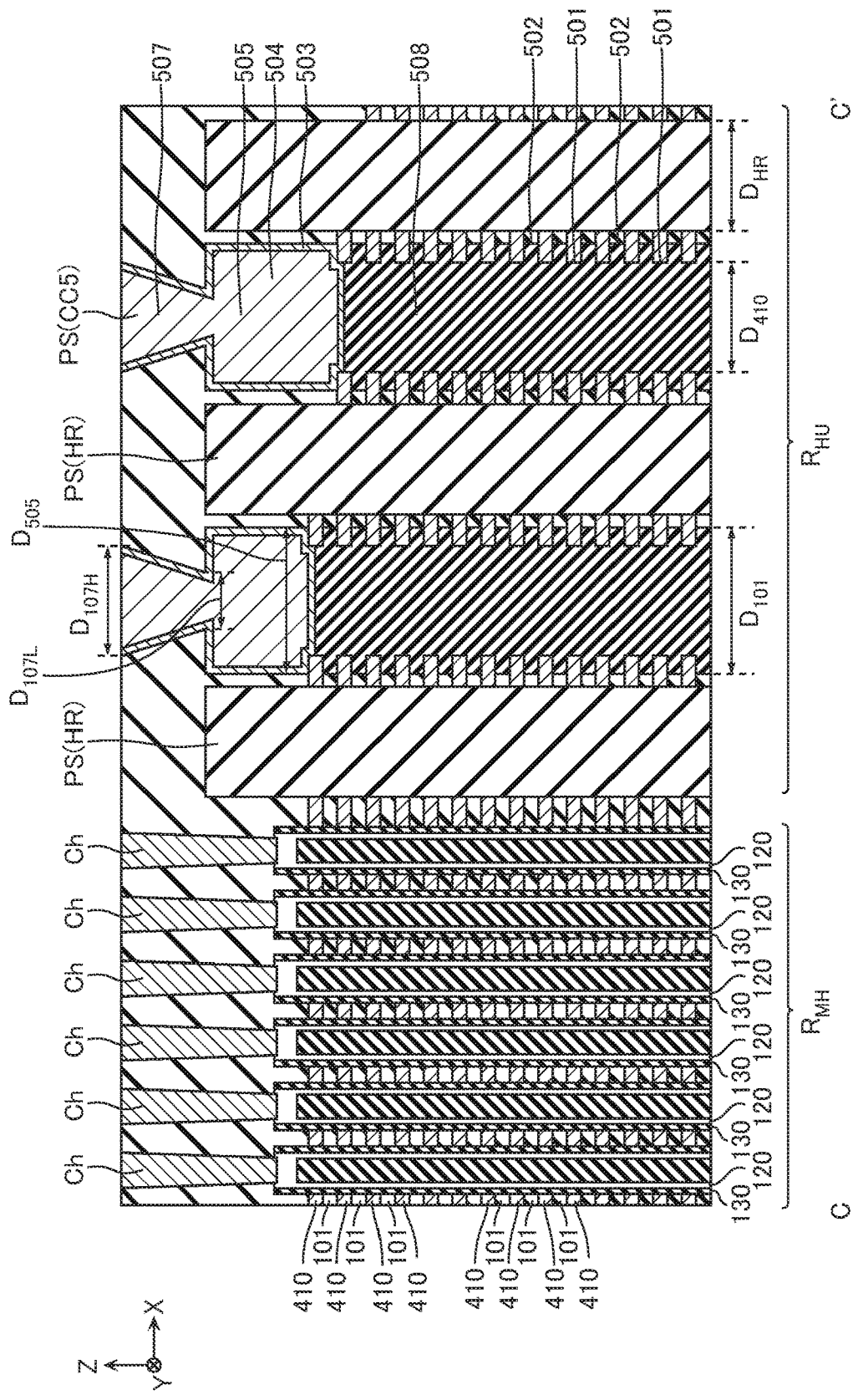
FIG. 68 is a schematic cross-sectional view taking the structure illustrated in FIG. 67 along the line C-C' and viewed in the arrow direction.
Figure 69:
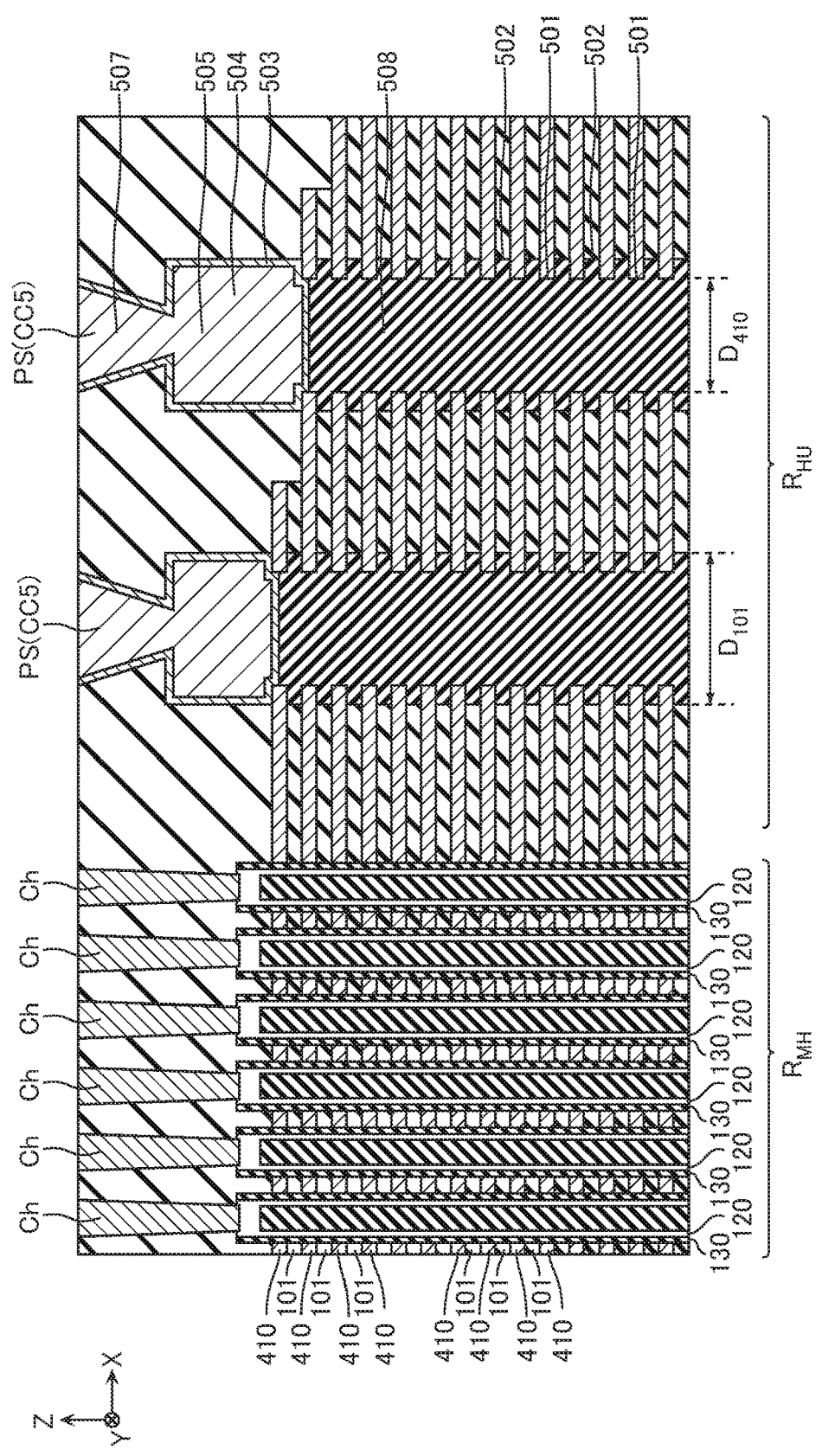
FIG. 69 is a schematic cross-sectional view illustrated with a part of a configuration omitted from FIG. 68.

Next, with reference to FIG. 67 to FIG. 69, a semiconductor memory device according to the fifth embodiment will be described. FIG. 67 is a schematic plan view illustrating a configuration of a part of the semiconductor memory device according to the fifth embodiment. FIG. 68 is a schematic cross-sectional view taking the structure illustrated in FIG. 67 along the line C-C' and viewed in the arrow direction. FIG. 69 is a schematic cross-sectional view illustrated with a part of a configuration (the supporting structures HR) omitted from FIG. 68.

The semiconductor memory device according to the fifth embodiment is basically configured similarly to the semiconductor memory device according to the first embodiment. However, as illustrated in FIG. 67 to FIG. 69, the semiconductor memory device according to the fifth embodiment includes the conductive layers 410 instead of the conductive layers 110. Additionally, the semiconductor memory device according to the fifth embodiment includes contact electrodes CC5 instead of the contact electrodes CC.

The contact electrode CC5 may include, for example, a stacked film of a barrier conductive layer 503 of, for example, titanium nitride (TiN) and a metal layer 504 of, for example, tungsten (W).

The contact electrode CC5 includes an approximately columnar shaped part 505 extending in the Z-direction and an approximately conical shaped part 507 connected to the upper end of the part 505.

The part 505 extends in the Z-direction. The upper end of the part 505 is disposed above the upper surface of the conductive layer 410 disposed as the uppermost layer among the plurality of conductive layers 410. The lower end of the part 505 is disposed between the upper surface of the corresponding conductive layer 410 and the upper surface of the conductive layer 410 immediately below it. Note that a diameter $D_{505}$ of the part 505 according to this embodiment is larger than the diameter $D_{HR}$ of the supporting structure HR.

The diameter $D_{107L}$ at the lower end of the part 507 is smaller than the diameter $D_{107H}$ at the upper end of the part 507. The diameter $D_{107L}$ differs from the diameter $D_{505}$ at the part 505. In the illustrated example, the diameter $D_{107L}$ is smaller than the diameter $D_{505}$.

Note that the diameter $D_{505}$ can be defined by the method similar to the method of the diameter $D_{105}$ according to first embodiment.

In the illustrated example, the barrier conductive layer 503 is continuously formed along the bottom surface of the part 505 and the outer peripheral surfaces of the parts 505 and 507. The metal layer 504 is continuously formed across the parts 505 and 507.

A supporting structure 508 is disposed below the contact electrode CC5. The supporting structure 508 includes an insulating layer of, for example, silicon oxide ($SiO_2$).

The supporting structure 508 extends in the Z-direction. The supporting structure 508 has an upper end in contact with the lower end of the contact electrode CC5. The supporting structure 508 has a lower end disposed downward of the lower surface of the conductive layer 410 disposed as the lowermost layer among the plurality of conductive layers 410.

A plurality of parts 501 disposed corresponding to the plurality of conductive layers 410 arranged in the Z-direction and a plurality of parts 502 disposed corresponding to the plurality of insulating layers 101 arranged in the Z-direction are disposed on the outer peripheral surface of the supporting structure 508. Each of the parts 501 is in contact with the conductive layer 410. Each of the parts 502 is in contact with the insulating layer 101. A diameter $D_{410}$ of part 501 is smaller than a diameter $D_{101}$ of the part 502. Note that the diameters $D_{410}$ and $D_{101}$ are larger than the diameter $D_{HR}$ of the supporting structure HR. Additionally, the diameter $D_{101}$ may be equal to the diameter $D_{505}$ of the part 505 of the contact electrode CC5, or may be smaller than the diameter $D_{505}$ of the part 505 of the contact electrode CC5.

Note that the outer diameter $D_{410}$ of the part 501, for example, can be defined by the method as follows. For example, the XY cross-sectional surface corresponding to any of the plurality of conductive layers 410 arranged in the Z-direction is observed with SEM, TEM, or the like (see FIG. 67). Next, a circle is applied along the outer peripheral surface of the part 501 in this XY cross-sectional surface. The diameter of this circle may be the outer diameter $D_{410}$.

Similarly, the outer diameter $D_{101}$ of the part 502, for example, can be defined by the method as follows. For example, the XY cross-sectional surface corresponding to any of the plurality of conductive layers 101 arranged in the Z-direction is observed with SEM, TEM, or the like (see FIG. 3). Next, a circle is applied along the outer peripheral surface of the part 502 in this XY cross-sectional surface. The diameter of this circle may be the outer diameter $D_{101}$.

Note that to define the outer diameters $D_{410}$ and $D_{101}$ by this method, the height positions of the two XY cross-sectional surfaces corresponding to the respective parts 501 and 502 are preferably close. For example, when the outer diameter $D_{410}$ is defined based on the XY cross-sectional surface corresponding to any of the two conductive layers 410 adjacent in the Z-direction, the outer diameter $D_{101}$ is preferably defined based on the XY cross-sectional surface corresponding to the insulating layer 101 disposed between these two conductive layers 410. However, it is possible to define the outer diameters $D_{410}$ and $D_{101}$ based on the XY cross-sectional surface corresponding to another height position.

Next, with reference to FIG. 70 to FIG. 75, a manufacturing method of the semiconductor memory device according to the fifth embodiment will be described. FIG. 70 to FIG. 75 are schematic cross-sectional views to describe the manufacturing method and illustrate the cross-sectional surfaces corresponding to FIG. 68.

The manufacturing method according to the fifth embodiment performs the steps up to the step described with reference to FIG. 10 among the steps included in the manufacturing method according to the first embodiment. The manufacturing method according to the fifth embodiment performs the step described with reference to FIG. 14 to the step described with reference to FIG. 20 among the steps included in the manufacturing method according to the first embodiment.

Figure 70:
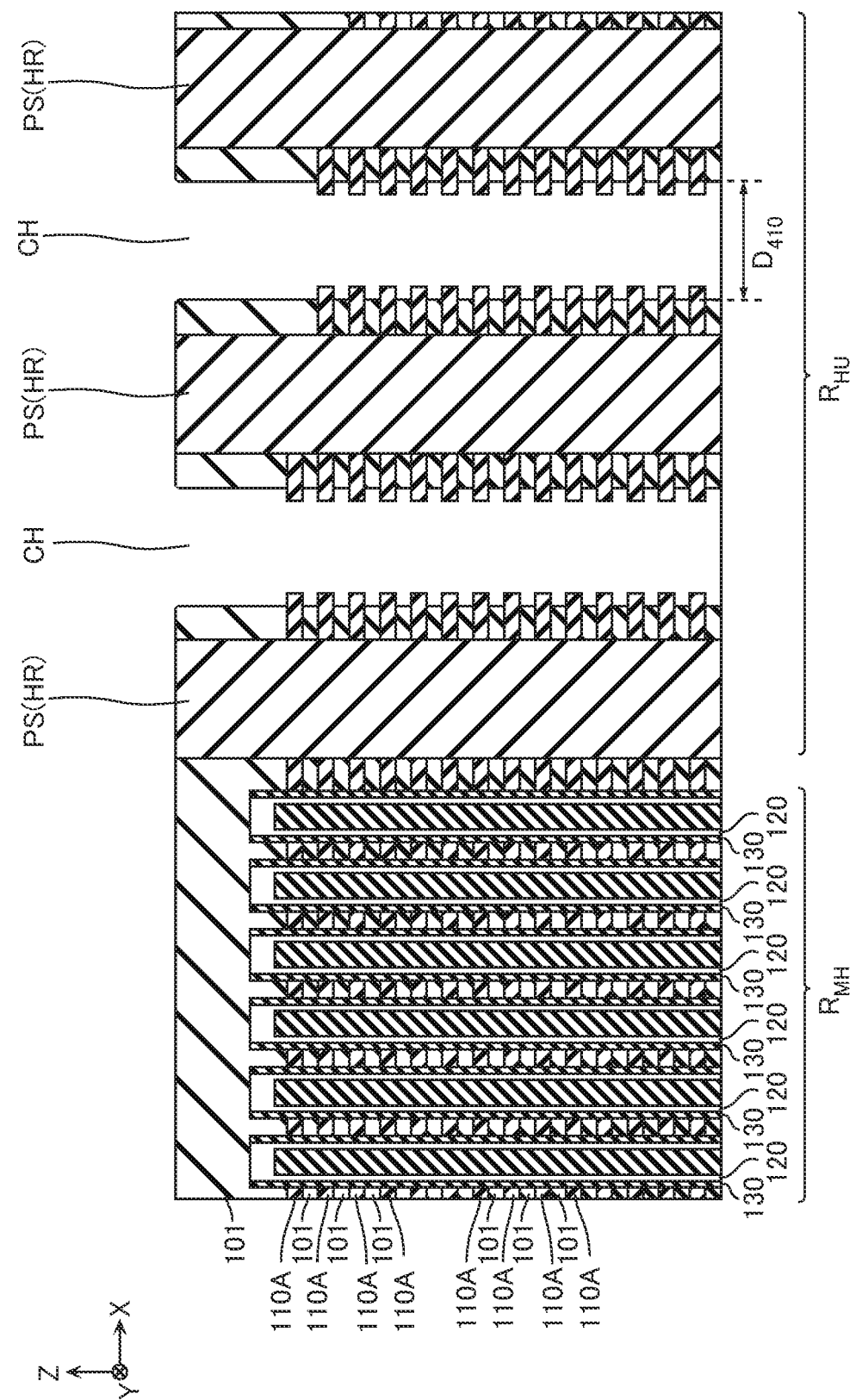
FIG. 70 is a schematic cross-sectional view to describe a manufacturing method of the semiconductor memory device according to the fifth embodiment.

Next, for example, as illustrated in FIG. 70, a part of the insulating layers 101 are removed in the inner peripheral surfaces of the contact holes CH. In this process, the diameter of the contact hole CH becomes around the diameter $D_{410}$ described with reference to FIG. 68 at the height position corresponding to the insulating layer 101. This process is performed by wet etching or the like.

Figure 71:
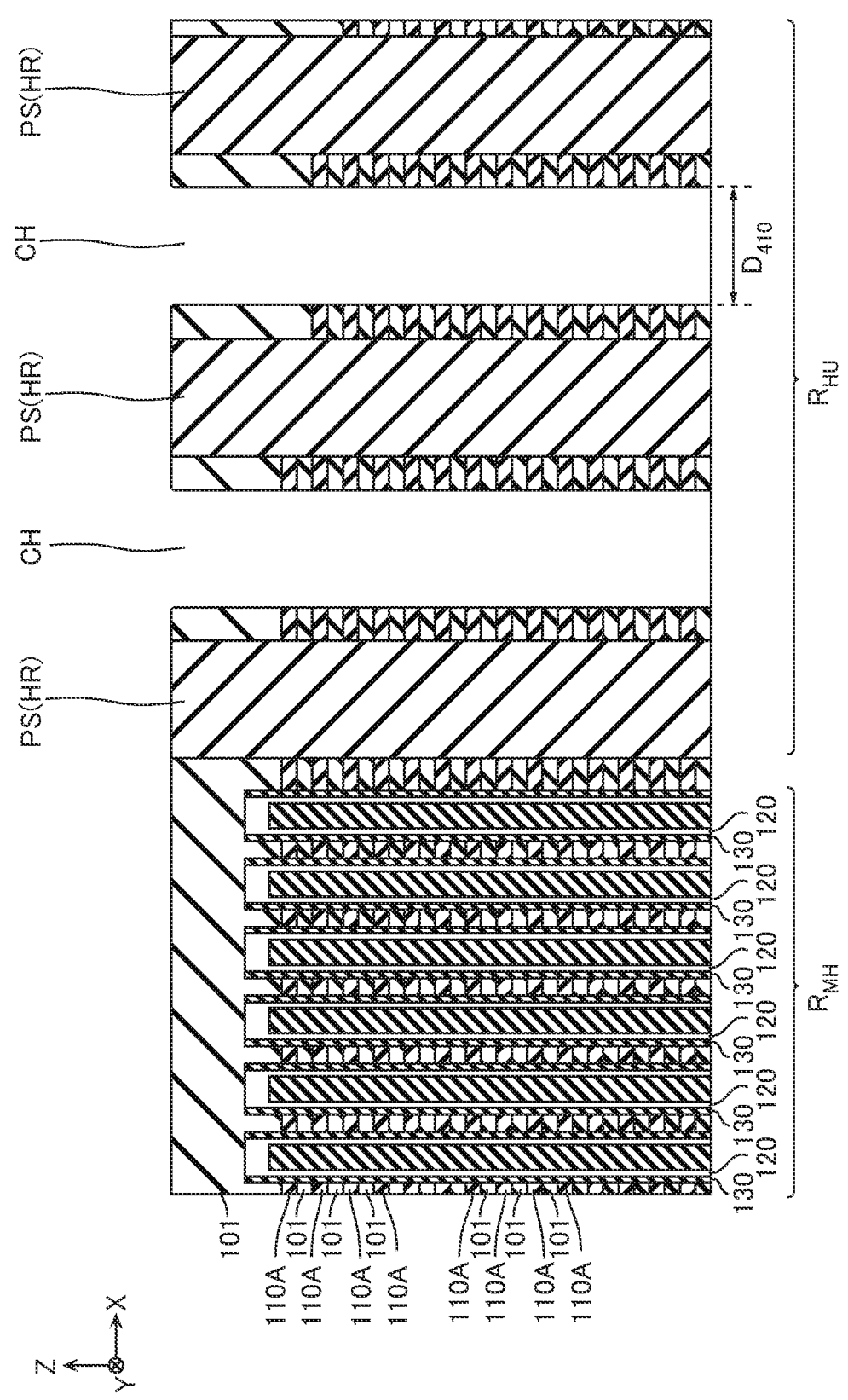
FIG. 71 is a schematic cross-sectional view to describe the manufacturing method.

Next, for example, as illustrated in FIG. 71, a part of the sacrifice layers 110A are removed in the inner peripheral surfaces of the contact holes CH. In this process, the diameter of the contact hole CH becomes around the diameter $D_{410}$ described with reference to FIG. 68 at the height position corresponding to the sacrifice layer 110A. This process is performed by wet etching or the like.

Figure 72:
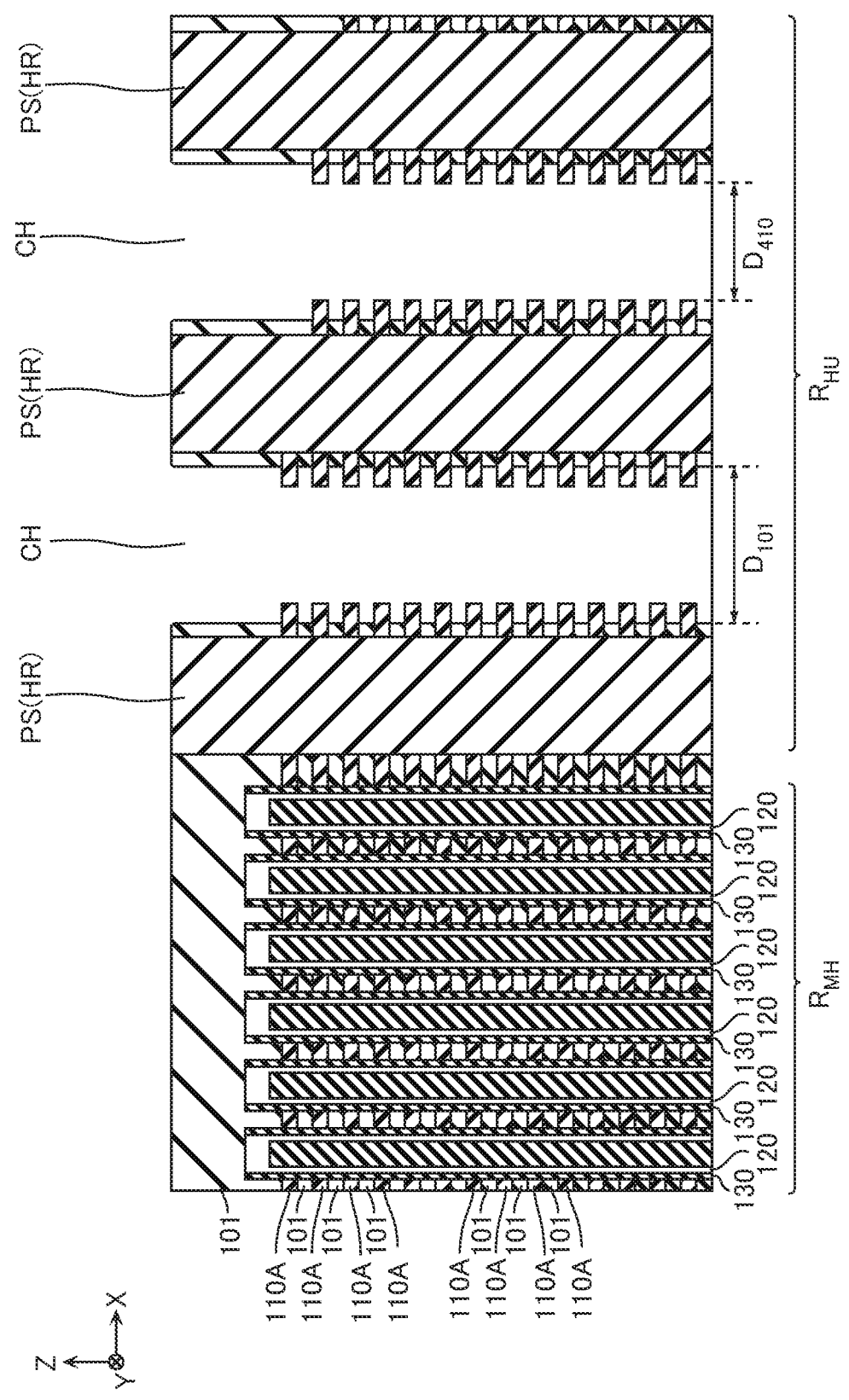
FIG. 72 is a schematic cross-sectional view to describe the manufacturing method.

Next, for example, as illustrated in FIG. 72, a part of the insulating layers 101 are removed in the inner peripheral surfaces of the contact holes CH. In this process, the diameter of the contact hole CH becomes around the diameters $D_{505}$ and $D_{101}$ described with reference to FIG. 68 at the height position corresponding to the insulating layer 101. This process is performed by wet etching or the like.

Figure 73:
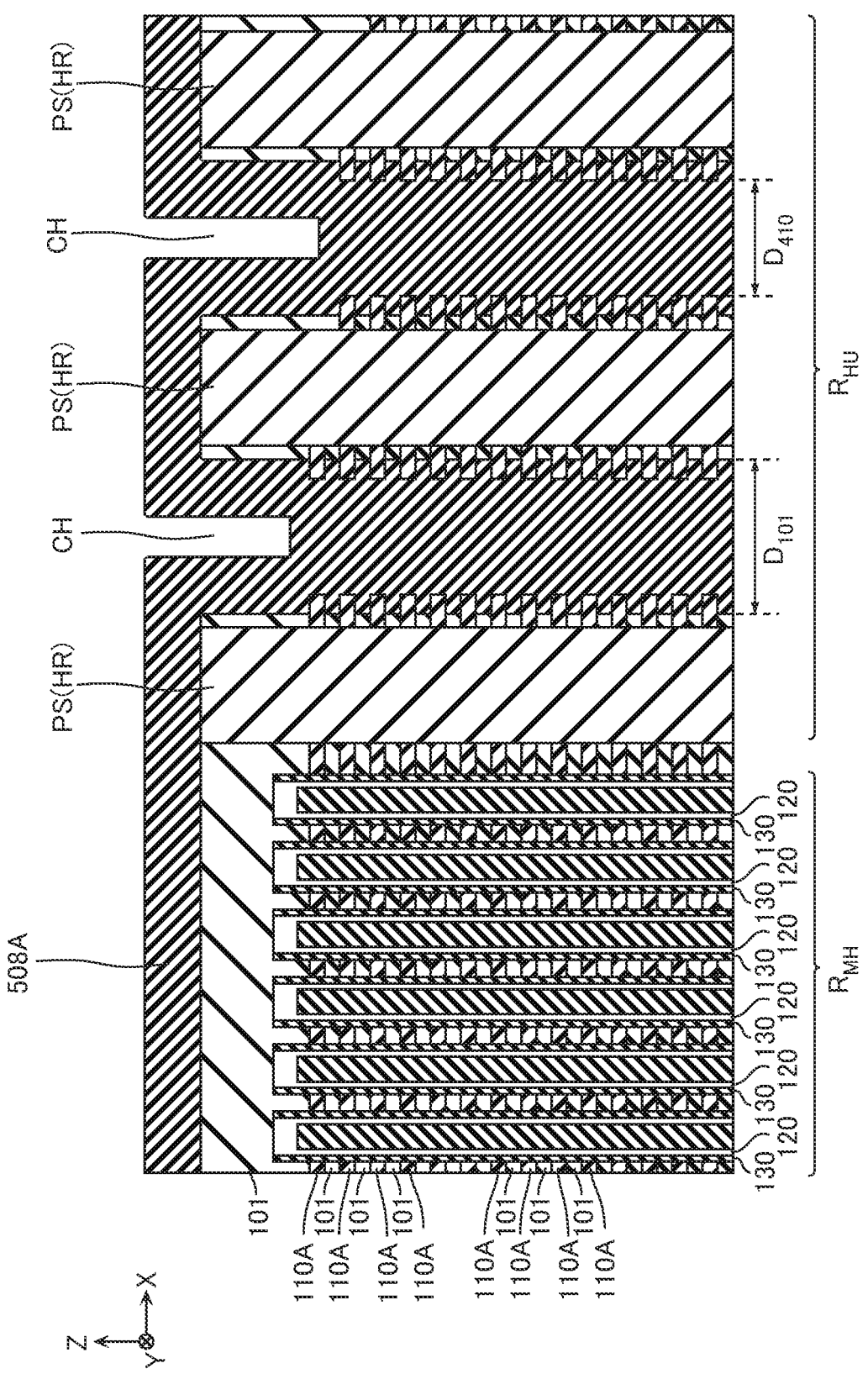
FIG. 73 is a schematic cross-sectional view to describe the manufacturing method.

Next, for example, as illustrated in FIG. 73, an insulating layer 508A is formed on the upper surface of the structure described with reference to FIG. 72 and the inner peripheral surfaces of the plurality of contact holes CH. In this respect, a film thickness of the insulating layer 508A is larger than the size of the half of the diameter $D_{410}$. Therefore, a part of the regions of the contact holes CH are embedded by the insulating layer 508A. Meanwhile, the film thickness of the insulating layer 508A is smaller than the size of the half of the diameters $D_{505}$ and $D_{101}$. Therefore, a part of the regions of the contact holes CH are not embedded by the insulating layer 508A. This process is performed by a method, such as CVD.

Figure 74:
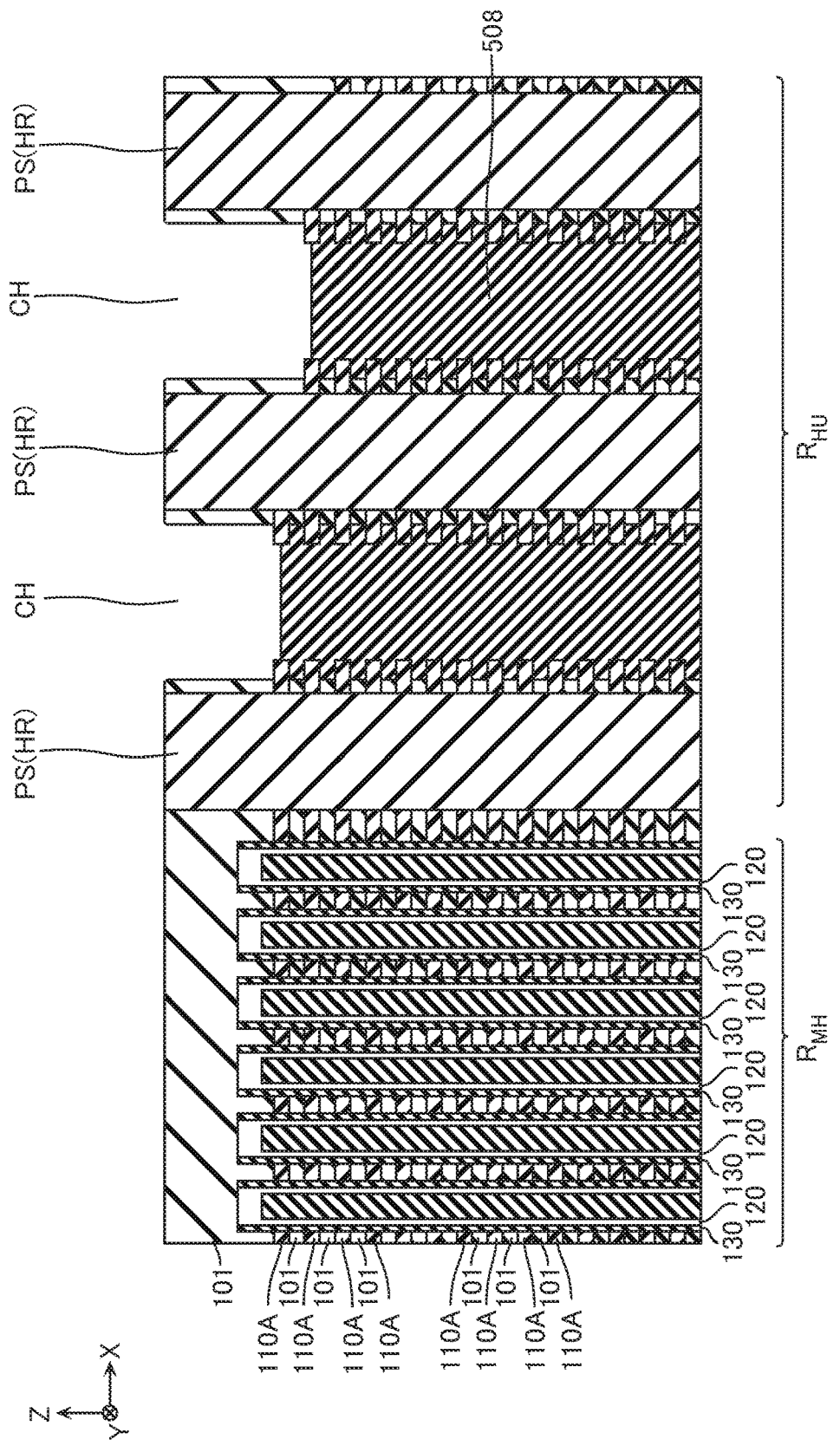
FIG. 74 is a schematic cross-sectional view to describe the manufacturing method.

Next, for example, as illustrated in FIG. 74, a part of the insulating layers 508A are removed. In this process, a part of the upper surfaces of a part of the sacrifice layers 110A are exposed. This process is performed by wet etching or the like.

Figure 75:
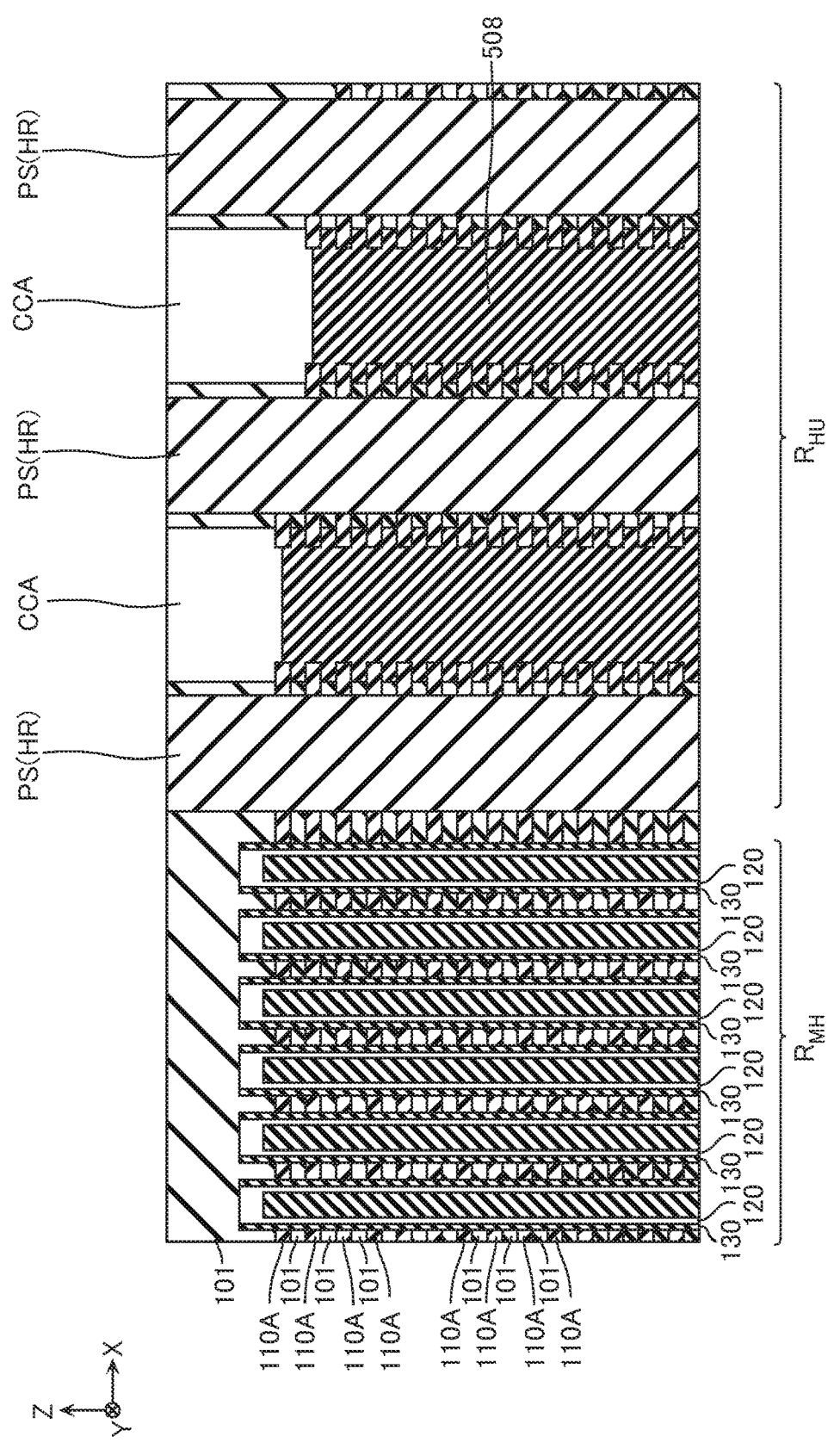
FIG. 75 is a schematic cross-sectional view to describe the manufacturing method.

Next, for example, as illustrated in FIG. 75, sacrifice layers CCA are formed inside the contact holes CH. This process is performed by a method, such as CVD.

Afterwards, among the steps included in the manufacturing method according to the first embodiment, the steps at and after the step described with reference to FIG. 26 are performed.

Sixth Embodiment

Figure 76:
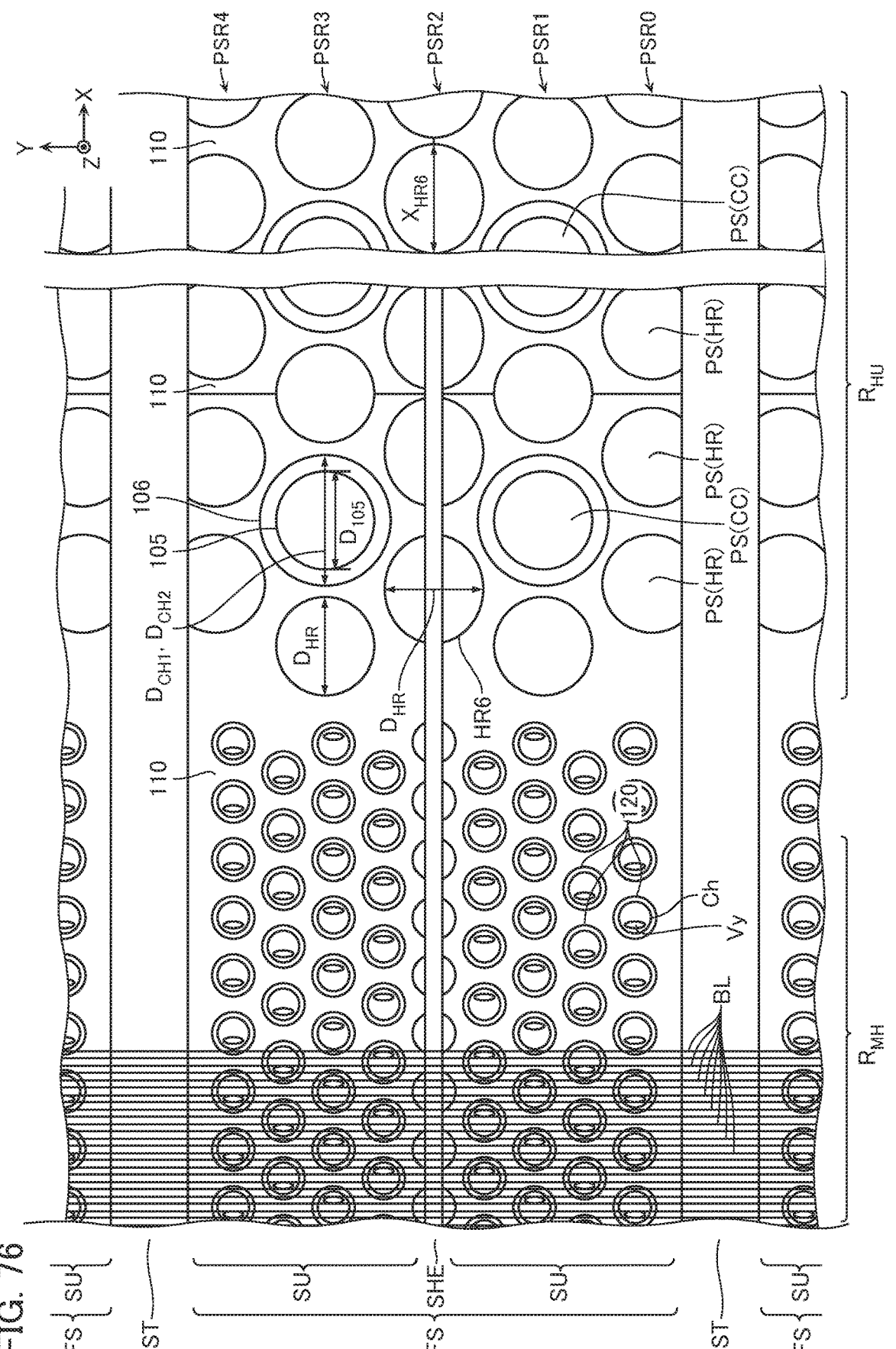
FIG. 76 is a schematic plan view illustrating a configuration of a part of a semiconductor memory device according to a sixth embodiment.

Next, a semiconductor memory device according to the sixth embodiment will be described with reference to FIG. 76. FIG. 76 is a schematic plan view illustrating a configuration of a part of the semiconductor memory device according to the sixth embodiment.

The semiconductor memory device according to the sixth embodiment is basically configured similarly to the semiconductor memory device according to the first embodiment. However, in the semiconductor memory device according to the sixth embodiment, a part of the columnar structure region PSR (the third columnar structure region PSR2 counted from one side in the Y-direction in the illustrated example) includes supporting structures HR6 instead of the supporting structures HR.

The supporting structure HR6 is basically configured similarly to the supporting structure HR. However, a width $X_{HR6}$ in the X-direction of the supporting structure HR6 is larger than a width in the X-direction of the supporting structure HR, that is, the diameter $D_{HR}$.

Note that the width $X_{HR6}$ and the diameter $D_{HR}$, for example, can be defined by the method as follows. For example, the XY cross-sectional surface corresponding to any of the plurality of conductive layers 110 arranged in the Z-direction is observed with SEM, TEM, or the like (see FIG. 76). Next, in this XY cross-sectional surface, any geometric shape including an ellipse and an oval is applied along the outer peripheral surface of the supporting structure HR6. A length of this geometric shape in the X-direction may be the width $X_{HR6}$, and a length in the Y-direction may be the diameter $D_{HR}$.

Note that in the example of FIG. 76, the semiconductor memory device according to the sixth embodiment includes the contact electrodes CC. However, the semiconductor memory device according to the sixth embodiment may include the contact electrodes CC3 (FIG. 47), the contact electrodes CC4 (FIG. 55), or the contact electrodes CC5 (FIG. 68) instead of the contact electrodes CC.

In the example of FIG. 76, the semiconductor memory device according to the sixth embodiment includes the conductive layers 110. However, the semiconductor memory device according to the sixth embodiment may include the conductive layers 410 instead of the conductive layers 110.

Seventh Embodiment

Figure 77:
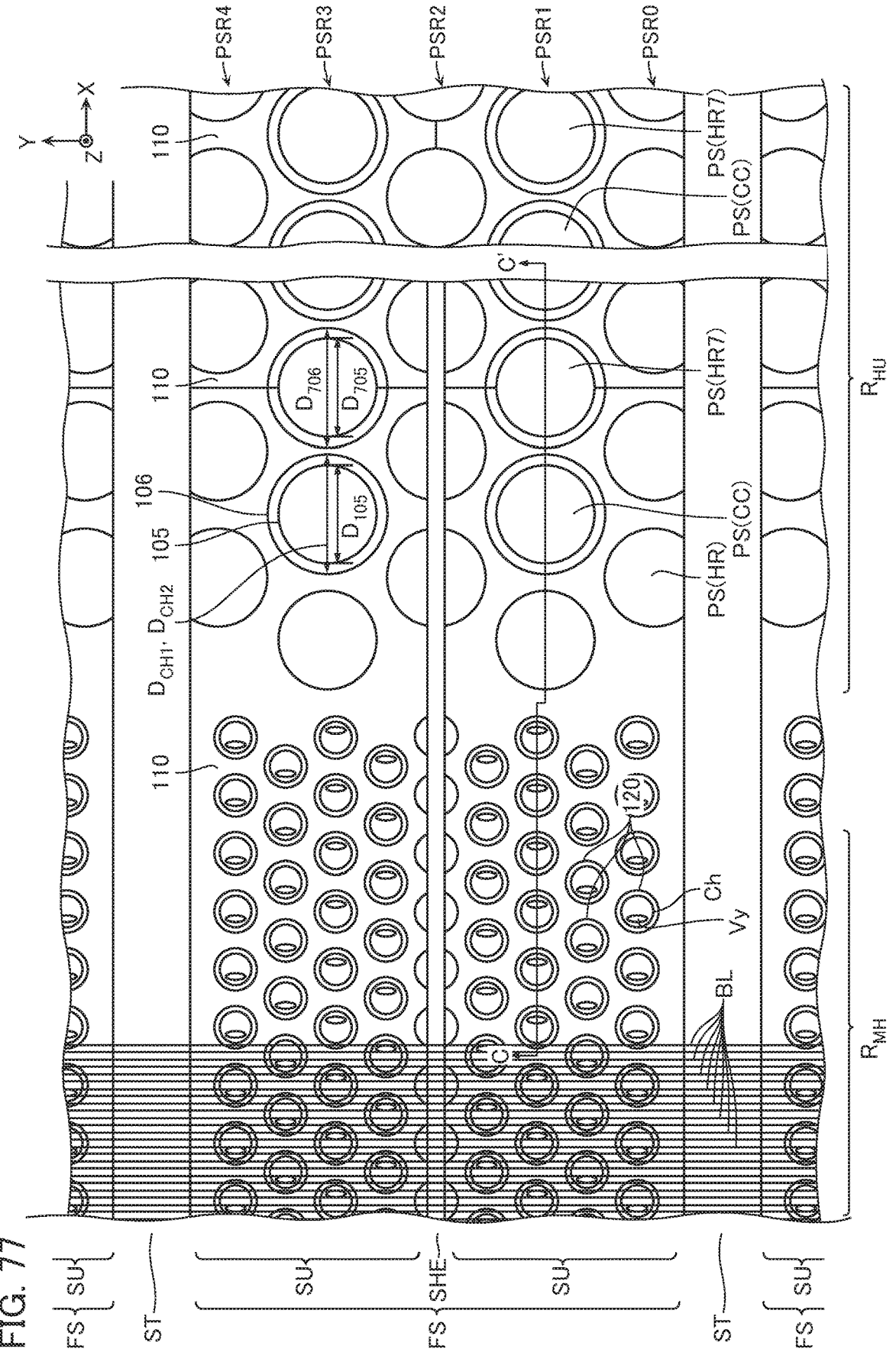
FIG. 77 is a schematic plan view illustrating a configuration of a part of a semiconductor memory device according to a seventh embodiment.
Figure 78:
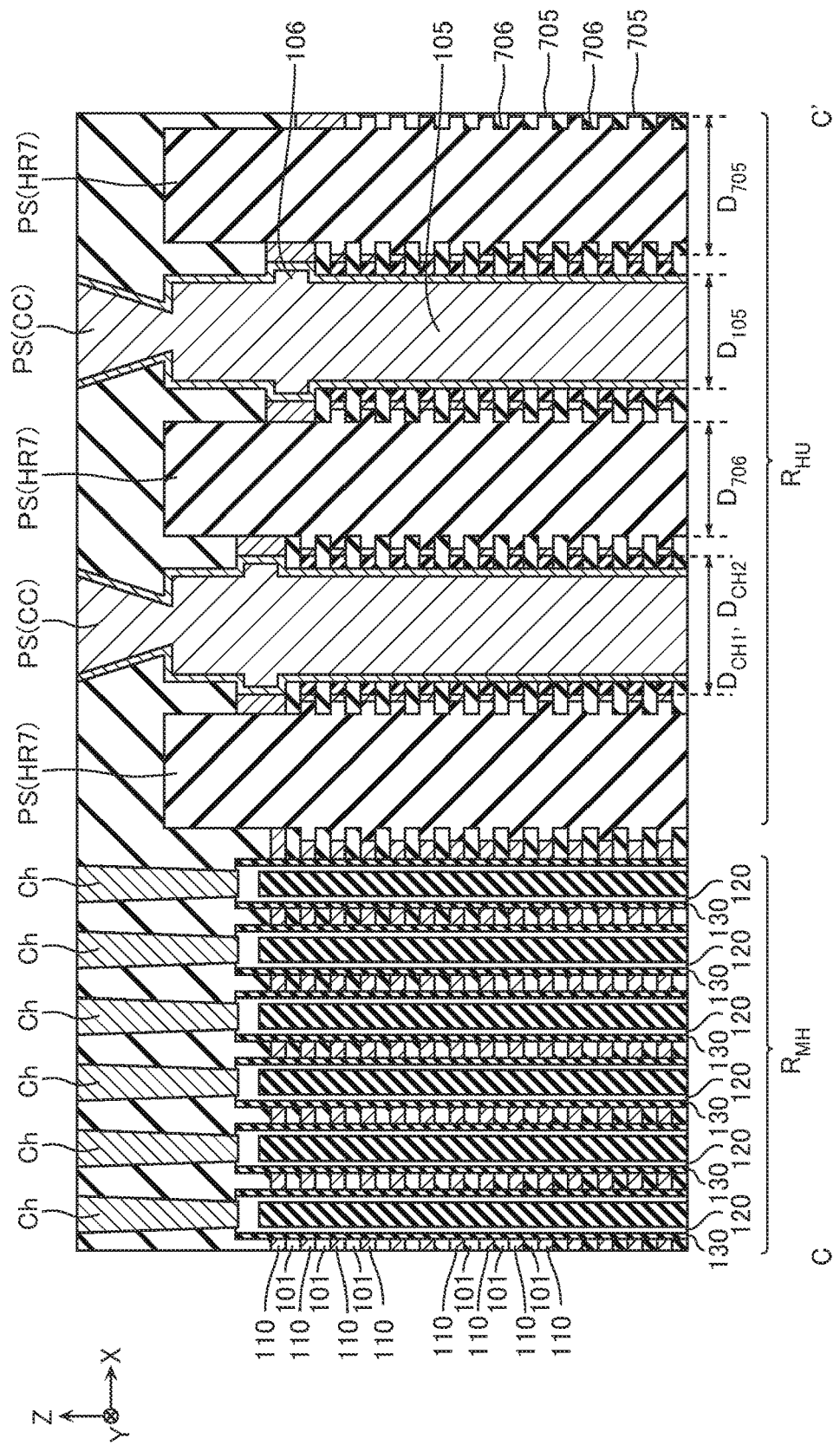
FIG. 78 is a schematic cross-sectional view taking the structure illustrated in FIG. 77 along the line C-C' and viewed in the arrow direction.

Next, with reference to FIG. 77 and FIG. 78, a semiconductor memory device according to the seventh embodiment will be described. FIG. 77 is a schematic plan view illustrating a configuration of a part of the semiconductor memory device according to the seventh embodiment. FIG. 78 is a schematic cross-sectional view taking the structure illustrated in FIG. 77 along the line C-C' and viewed in the arrow direction.

The semiconductor memory device according to the seventh embodiment is basically configured similarly to the semiconductor memory device according to the first embodiment. However, in the semiconductor memory device according to the seventh embodiment, a part of the columnar structure regions PSR (the second columnar structure region PSR1 and the fourth columnar structure region PSR3 counted from one side in the Y-direction in the illustrated example) includes supporting structures HR7 instead of the supporting structures HR.

The supporting structure HR7 is basically configured similarly to the supporting structure HR. However, for example, as illustrated in FIG. 78, the supporting structure HR7 includes a plurality of parts 705 disposed corresponding to the plurality of conductive layers 110 arranged in the Z-direction and a plurality of parts 706 disposed corresponding the plurality of insulating layers 101 arranged in the Z-direction. Each of the parts 705 is in contact with the conductive layer 110. Each of the parts 706 is in contact with the insulating layer 101. Additionally, a diameter $D_{705}$ of the part 705 is larger than a diameter $D_{706}$ of the part 706. Note that the diameter $D_{705}$ may be, for example, equal to the diameters $D_{CH1}$ and $D_{CH2}$ of the through-holes disposed in the conductive layers 110. The diameter $D_{706}$ may be, for example, equal to the diameter $D_{105}$ of the part 105 of the contact electrode CC.

Note that the diameter $D_{705}$ can be defined by the method similar to the method of the outer diameter $D_{410}$ according to the fifth embodiment. Additionally, the diameter $D_{706}$ can be defined by the method similar to the method of the outer diameter $D_{101}$ according to the fifth embodiment.

Note that in the example of FIG. 77 and FIG. 78, the semiconductor memory device according to the seventh embodiment includes the contact electrodes CC. However, the semiconductor memory device according to the seventh embodiment may include the contact electrodes CC3 (FIG. 47), the contact electrodes CC4 (FIG. 55), or the contact electrodes CC5 (FIG. 68) instead of the contact electrodes CC.

In the example of FIG. 77 and FIG. 78, the semiconductor memory device according to the seventh embodiment includes the conductive layers 110. However, the semiconductor memory device according to the seventh embodiment may include the conductive layers 410 instead of the conductive layers 110.

Eighth Embodiment

Figure 79:
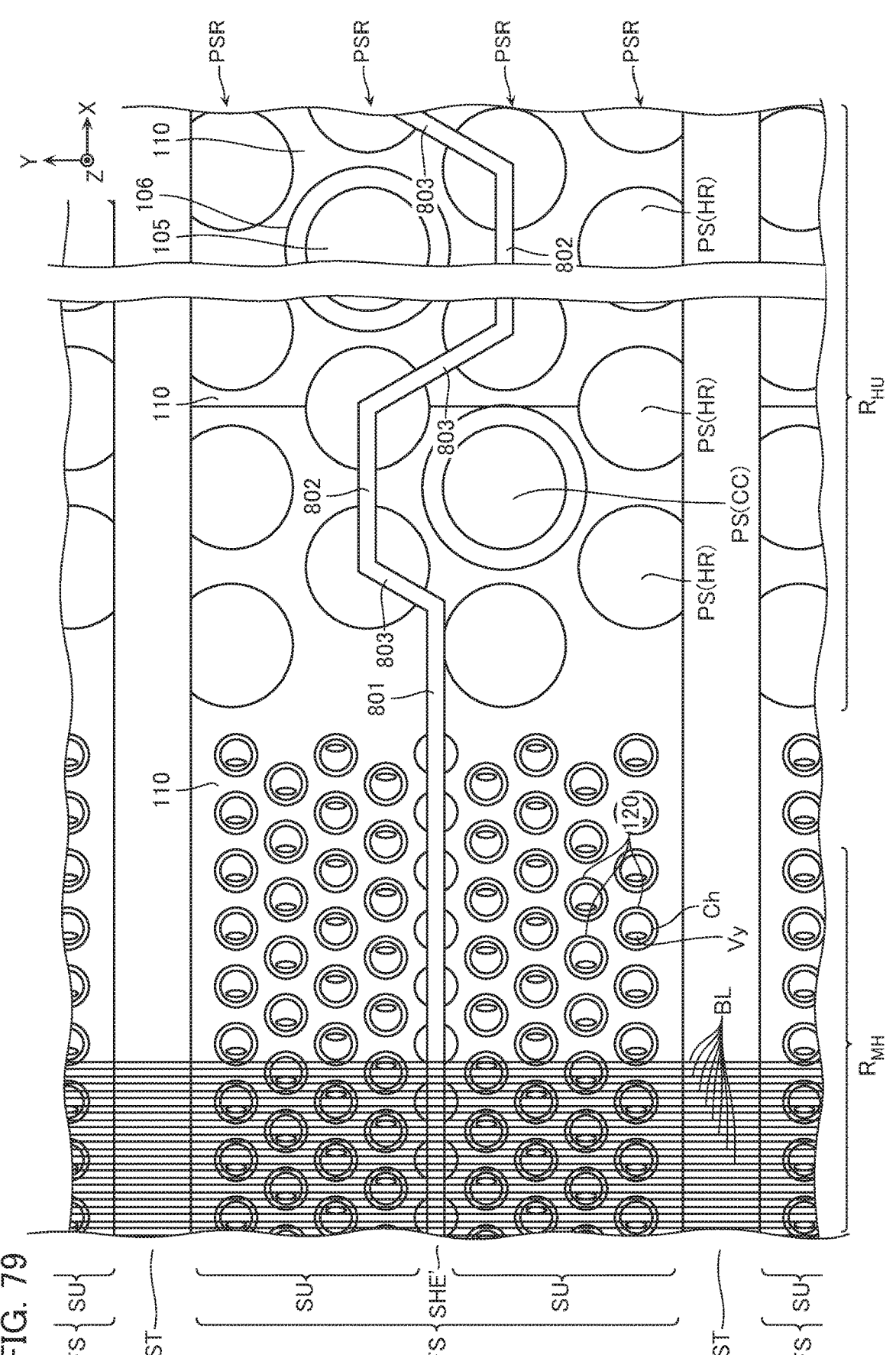
FIG. 79 is a schematic plan view illustrating a configuration of a part of a semiconductor memory device according to an eighth embodiment.

Next, with reference to FIG. 79, a semiconductor memory device according to the eighth embodiment will be described. FIG. 79 is a schematic plan view illustrating a configuration of a part of the semiconductor memory device according to the eighth embodiment.

The semiconductor memory device according to the eighth embodiment is basically configured similarly to the semiconductor memory device according to the first embodiment.

However, as described with reference to FIG. 3, in the semiconductor memory device according to the first embodiment, the five columnar structure regions PSR are disposed corresponding to one finger structure FS. Meanwhile, as illustrated in FIG. 79, in the semiconductor memory device according to the eighth embodiment, the four columnar structure regions PSR are disposed corresponding to one finger structure FS.

Additionally, the semiconductor memory device according to the eighth embodiment includes an inter-string unit insulating layer SHE' instead of the inter-string unit insulating layer SHE. The inter-string unit insulating layer SHE' is basically configured similarly to the inter-string unit insulating layer SHE. However, for example, as illustrated in FIG. 79, the inter-string unit insulating layer SHE' has a shape so as to meander avoiding the contact electrodes CC in the hook-up region $R_{HU}$.

That is, the inter-string unit insulating layer SHE' includes a part 801, a plurality of parts 802, and a plurality of parts 803. The part 801 is disposed in the memory hole region $R_{MH}$ and extends in the X-direction. The plurality of parts 802 are disposed corresponding to the plurality of contact electrodes CC. Each of the plurality of parts 802 is disposed at one side or at the other side in the Y-direction with respect to the corresponding contact electrode CC and extends in the X-direction. The plurality of parts 803 are disposed corresponding to the plurality of parts 802. Each of the plurality of parts 803 extends in a diagonal direction in the XY plane (a direction in the XY plane and a direction intersecting with both of the X-direction and the Y-direction) and is connected to the part 801 and the part 802 or the two parts 802.

Note that in the example of FIG. 79, the semiconductor memory device according to the eighth embodiment includes the contact electrodes CC. However, the semiconductor memory device according to the eighth embodiment may include the contact electrodes CC3 (FIG. 47), the contact electrodes CC4 (FIG. 55), or the contact electrodes CC5 (FIG. 68) instead of the contact electrodes CC.

In the example of FIG. 79, the semiconductor memory device according to the eighth embodiment includes the conductive layers 110. However, the semiconductor memory device according to the eighth embodiment may include the conductive layers 410 instead of the conductive layers 110.

Additionally, in the example of FIG. 79, the semiconductor memory device according to the eighth embodiment includes the plurality of supporting structures HR. However, in the semiconductor memory device according to the eighth embodiment, at least a part of the plurality of supporting structures HR may be exchanged for the supporting structure HR6 (FIG. 76) or the supporting structure HR7 (FIG. 77).

Ninth Embodiment

Figure 80:
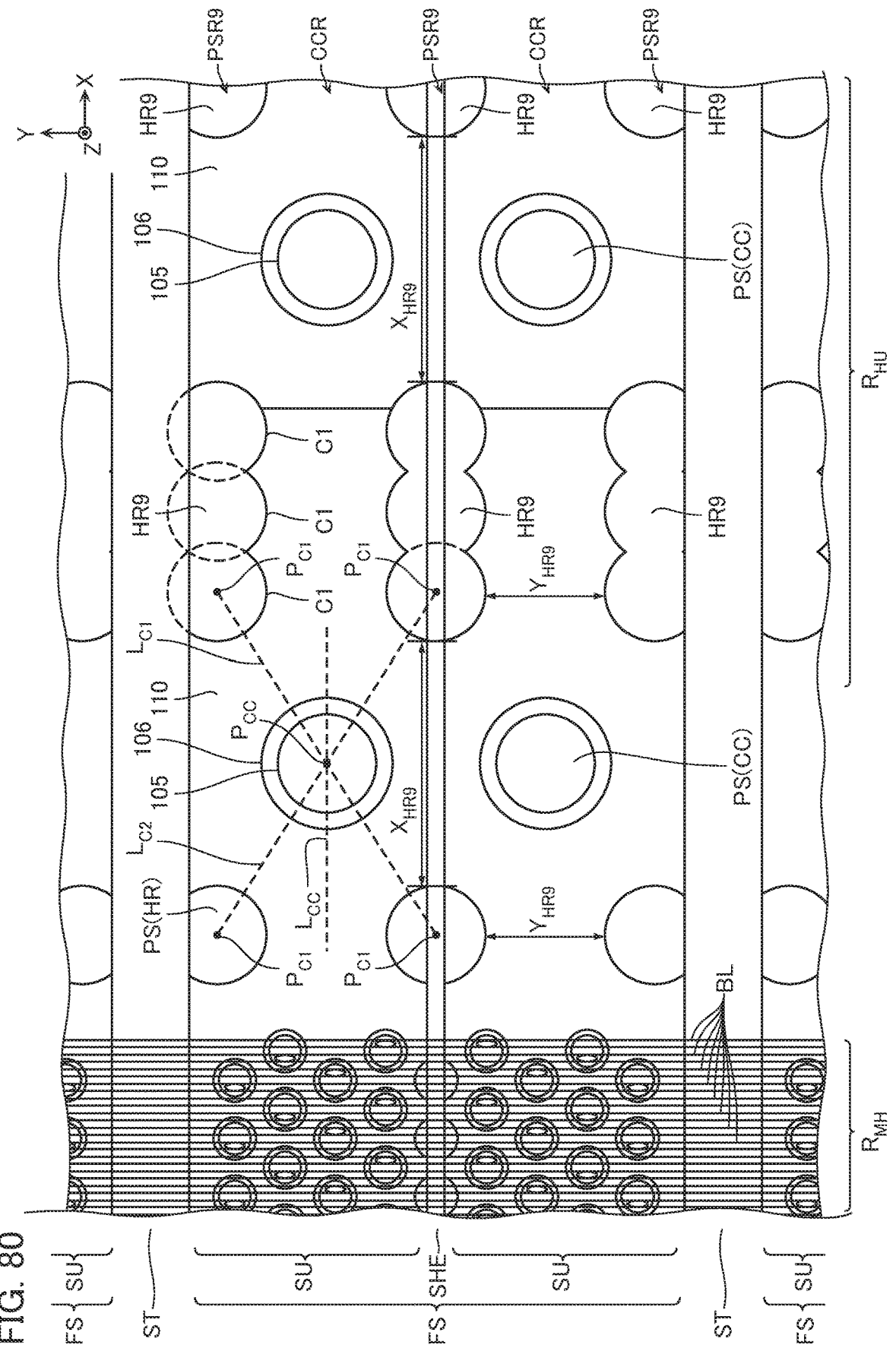
FIG. 80 is a schematic plan view illustrating a configuration of a part of a semiconductor memory device according to a ninth embodiment.

Next, with reference to FIG. 80, a semiconductor memory device according to the ninth embodiment will be described. FIG. 80 is a schematic plan view illustrating a configuration of a part of the semiconductor memory device according to the ninth embodiment.

The semiconductor memory device according to the ninth embodiment is basically configured similarly to the semiconductor memory device according to the first embodiment.

However, as described with reference to FIG. 3, the semiconductor memory device according to the first embodiment includes the plurality of columnar structure regions PSR arranged in the Y-direction corresponding to one finger structure FS. Meanwhile, as illustrated in FIG. 80, the semiconductor memory device according to the ninth embodiment includes a plurality of (two in the illustrated example) contact electrode regions CCR and a plurality of (three in the illustrated example) columnar structure regions PSR9 arranged in alternation in the Y-direction corresponding to one finger structure FS.

Each of the contact electrode regions CCR includes the plurality of contact electrodes CC arranged in the X-direction.

Each of the columnar structure regions PSR9 includes a plurality of supporting structures HR9 arranged in the X-direction and the supporting structure HR disposed between these plurality of supporting structures HR9 and the memory hole region $R_{MH}$. FIG. 80 denotes the distance between the two supporting structures HR9 adjacent in the X-direction and the distance between the supporting structure HR and the supporting structure HR9 closest to this supporting structure HR as a distance $X_{HR9}$. The distance between the two supporting structures HR9 adjacent in the Y-direction and the distance between the two supporting structures HR adjacent in the Y-direction are denoted as a distance $Y_{HR9}$. In the illustrated example, the distance $X_{HR9}$ is larger than the distance $Y_{HR9}$.

The supporting structure HR9 is basically configured similarly to the supporting structure HR. However, the shape of the supporting structure HR9 in the XY plane differs from the shape of the supporting structure HR in the XY plane. For example, FIG. 80 illustrates a plurality of (three in the illustrated example) circles C1 arranged in the X-direction. These plurality of circles C1 overlap with one another. The diameters of these plurality of circles C1 are equal to one another. The outer peripheral surface of the supporting structure HR9 is formed along these plurality of (three in the illustrated example) circles C1. Note that the diameter of the circle C1 may be the same extent to the diameter of the circumscribed circle of the supporting structure HR.

Here, when focusing on one contact electrode CC, the two supporting structures HR and the two circles C1 closest to this contact electrode CC or the four circles C1 closest to this contact electrode CC may be disposed in the direction of +10° to +50° (for example, the direction of +30°) and the direction of −10° to −50° (for example, the direction of −30°) with respect to the straight line passing through the center of this contact electrode CC and extending in the X-direction.

For example, FIG. 80 illustrates the center of the circumscribed circle of the part 105 or the part 106 of the contact electrode CC as a point $P_{CC}$. Additionally, the center of the circumscribed circle of the supporting structure HR and the circle C1 are denoted as a point $P_{C1}$. FIG. 80 illustrates a straight line $L_{CC}$ as a straight line passing through the point $P_{CC}$ and extending in the X-direction. FIG. 80 also illustrates a straight line $L_{C1}$ extending in the direction of approximately +30° with respect to the straight line $L_{CC}$. The straight line $L_{C1}$ passes through one point $P_{CC}$ and the two points $P_{C1}$. FIG. 80 also illustrates a straight line $L_{C2}$ extending in the direction of approximately −30° with respect to the straight line $L_{CC}$. The straight line $L_{C2}$ passes through one point $P_{CC}$ and the two points $P_{C1}$. Note that in the example of FIG. 80, all of the distances from the four points $P_{C1}$ to the point $P_{CC}$ are equal.

Note that in the example of FIG. 80, the semiconductor memory device according to the ninth embodiment includes the contact electrodes CC. However, the semiconductor memory device according to the ninth embodiment may include the contact electrodes CC3 (FIG. 47), the contact electrodes CC4 (FIG. 55), or the contact electrodes CC5 (FIG. 68) instead of the contact electrodes CC.

In the example of FIG. 80, the semiconductor memory device according to the ninth embodiment includes the conductive layers 110. However, the semiconductor memory device according to the ninth embodiment may include the conductive layers 410 instead of the conductive layers 110.

Additionally, in the example of FIG. 80, the semiconductor memory device according to the ninth embodiment includes the inter-string unit insulating layer SHE. However, the semiconductor memory device according to the ninth embodiment may include the inter-string unit insulating layer SHE' instead of the inter-string unit insulating layer SHE.

Tenth Embodiment

Figure 81:
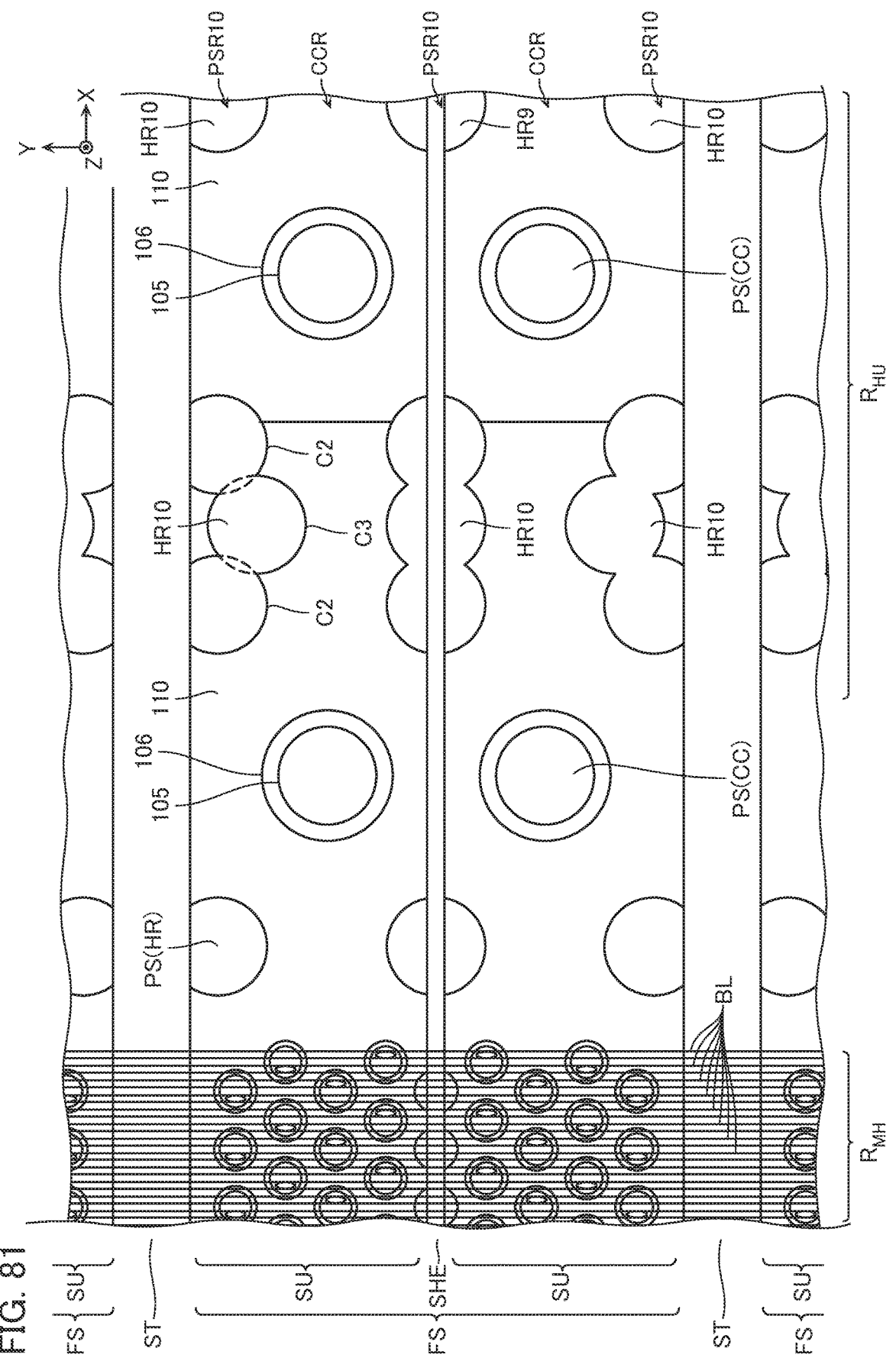
FIG. 81 is a schematic plan view illustrating a configuration of a part of a semiconductor memory device according to a tenth embodiment.

Next, with reference to FIG. 81, a semiconductor memory device according to the tenth embodiment will be described. FIG. 81 is a schematic plan view illustrating a configuration of a part of the semiconductor memory device according to the tenth embodiment.

The semiconductor memory device according to the tenth embodiment is basically configured similarly to the semiconductor memory device according to the ninth embodiment. However, the semiconductor memory device according to the tenth embodiment includes columnar structure regions PSR10 instead of the columnar structure regions PSR9.

The columnar structure region PSR10 is basically configured similarly to the columnar structure region PSR9. However, the columnar structure region PSR10 includes a plurality of supporting structures HR10 instead of the plurality of supporting structures HR9.

The supporting structure HR10 is basically configured similarly to the supporting structure HR9. However, the shape of the supporting structure HR10 in the XY plane differs from the shape of the supporting structure HR9 in the XY plane. For example, FIG. 81 illustrates two circles C2 arranged in the X-direction and one circle C3 overlapping with these two circles C2. The diameters of these three circles C1 and C2 are equal to one another. The position in the Y-direction of the circle C3 differs from the positions in the Y-direction of the circles C2. The outer peripheral surface of the supporting structure HR10 is formed along these plurality of (three in the illustrated example) circles C2 and C3.

Note that in the example of FIG. 81, the semiconductor memory device according to the tenth embodiment includes the contact electrodes CC. However, the semiconductor memory device according to the tenth embodiment may include the contact electrodes CC3 (FIG. 47), the contact electrodes CC4 (FIG. 55), or the contact electrodes CC5 (FIG. 68) instead of the contact electrodes CC.

In the example of FIG. 81, the semiconductor memory device according to the tenth embodiment includes the conductive layers 110. However, the semiconductor memory device according to the tenth embodiment may include the conductive layers 410 instead of the conductive layers 110.

Additionally, in the example of FIG. 81, the semiconductor memory device according to the tenth embodiment includes the inter-string unit insulating layer SHE. However, the semiconductor memory device according to the tenth embodiment may include the inter-string unit insulating layer SHE' instead of the inter-string unit insulating layer SHE.

Eleventh Embodiment

Figure 82:
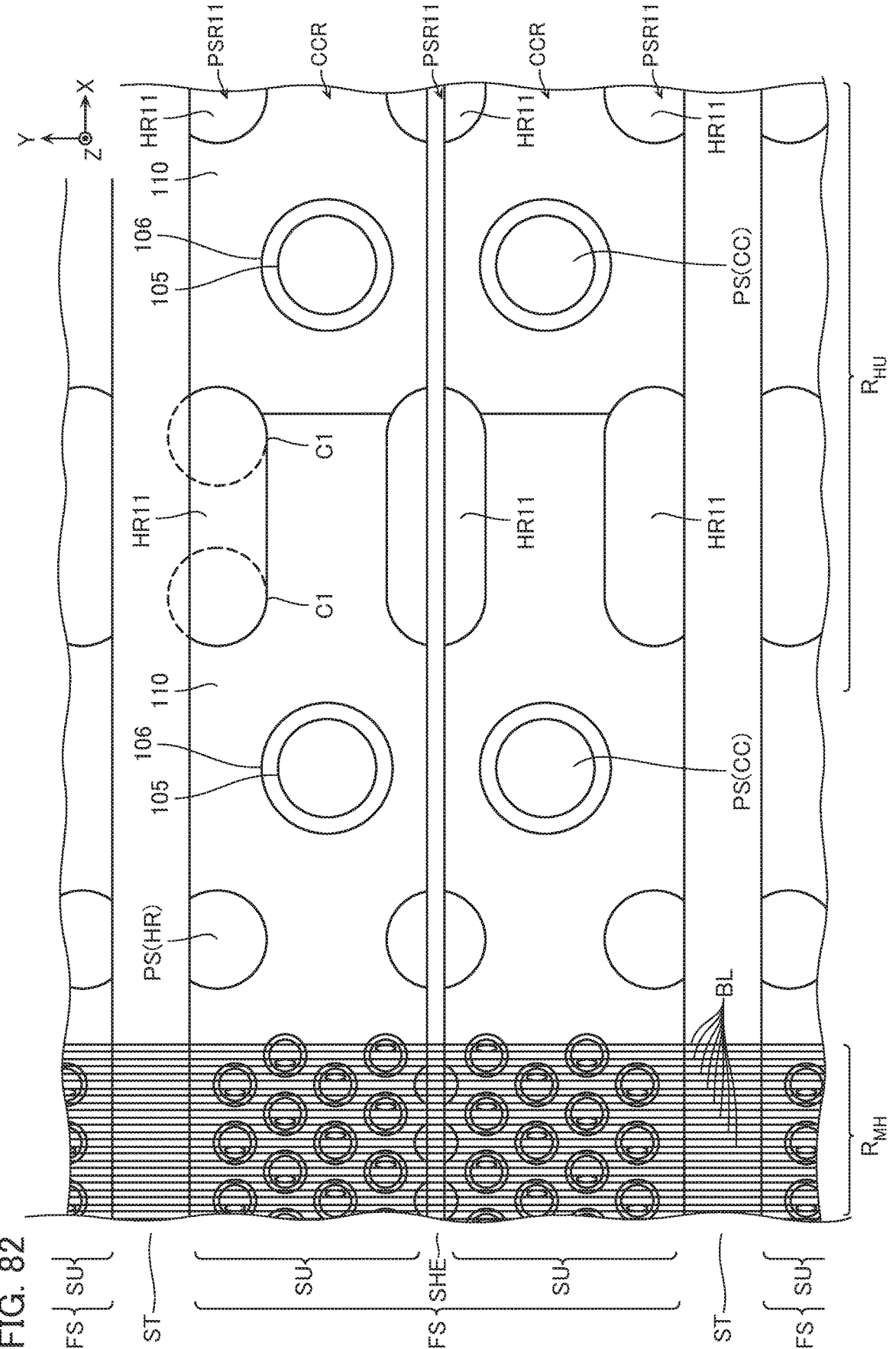
FIG. 82 is a schematic plan view illustrating a configuration of a part of a semiconductor memory device according to an eleventh embodiment.

Next, with reference to FIG. 82, a semiconductor memory device according to the eleventh embodiment will be described. FIG. 82 is a schematic plan view illustrating a configuration of a part of the semiconductor memory device according to the eleventh embodiment.

The semiconductor memory device according to the eleventh embodiment is basically configured similarly to the semiconductor memory device according to the ninth embodiment. However, the semiconductor memory device according to the eleventh embodiment includes columnar structure regions PSR11 instead of the columnar structure regions PSR9.

The columnar structure region PSR11 is basically configured similarly to the columnar structure region PSR9. However, the columnar structure region PSR11 includes a plurality of supporting structures HR11 instead of the plurality of supporting structures HR9.

The supporting structure HR11 is basically configured similarly to the supporting structure HR9. However, the shape of the supporting structure HR11 in the XY plane differs from the shape of the supporting structure HR9 in the XY plane. For example, FIG. 82 illustrates an example of the supporting structures HR11 having an oval shape (a race track shape). Note that the supporting structure HR11 may have another shape, such as an elliptical shape. Note that in the illustrated example, the outer peripheral surfaces at one end and the other end in the X-direction of the supporting structure HR11 are formed along the two circles C1 arranged in the X-direction.

Note that in the example of FIG. 82, the semiconductor memory device according to the eleventh embodiment includes the contact electrodes CC. However, the semiconductor memory device according to the eleventh embodiment may include the contact electrodes CC3 (FIG. 47), the contact electrodes CC4 (FIG. 55), or the contact electrodes CC5 (FIG. 68) instead of the contact electrodes CC.

In the example of FIG. 82, the semiconductor memory device according to the eleventh embodiment includes the conductive layers 110. However, the semiconductor memory device according to the eleventh embodiment may include the conductive layers 410 instead of the conductive layers 110.

Additionally, in the example of FIG. 82, the semiconductor memory device according to the eleventh embodiment includes the inter-string unit insulating layer SHE. However, the semiconductor memory device according to the eleventh embodiment may include the inter-string unit insulating layer SHE' instead of the inter-string unit insulating layer SHE.

Twelfth Embodiment

Figure 83:
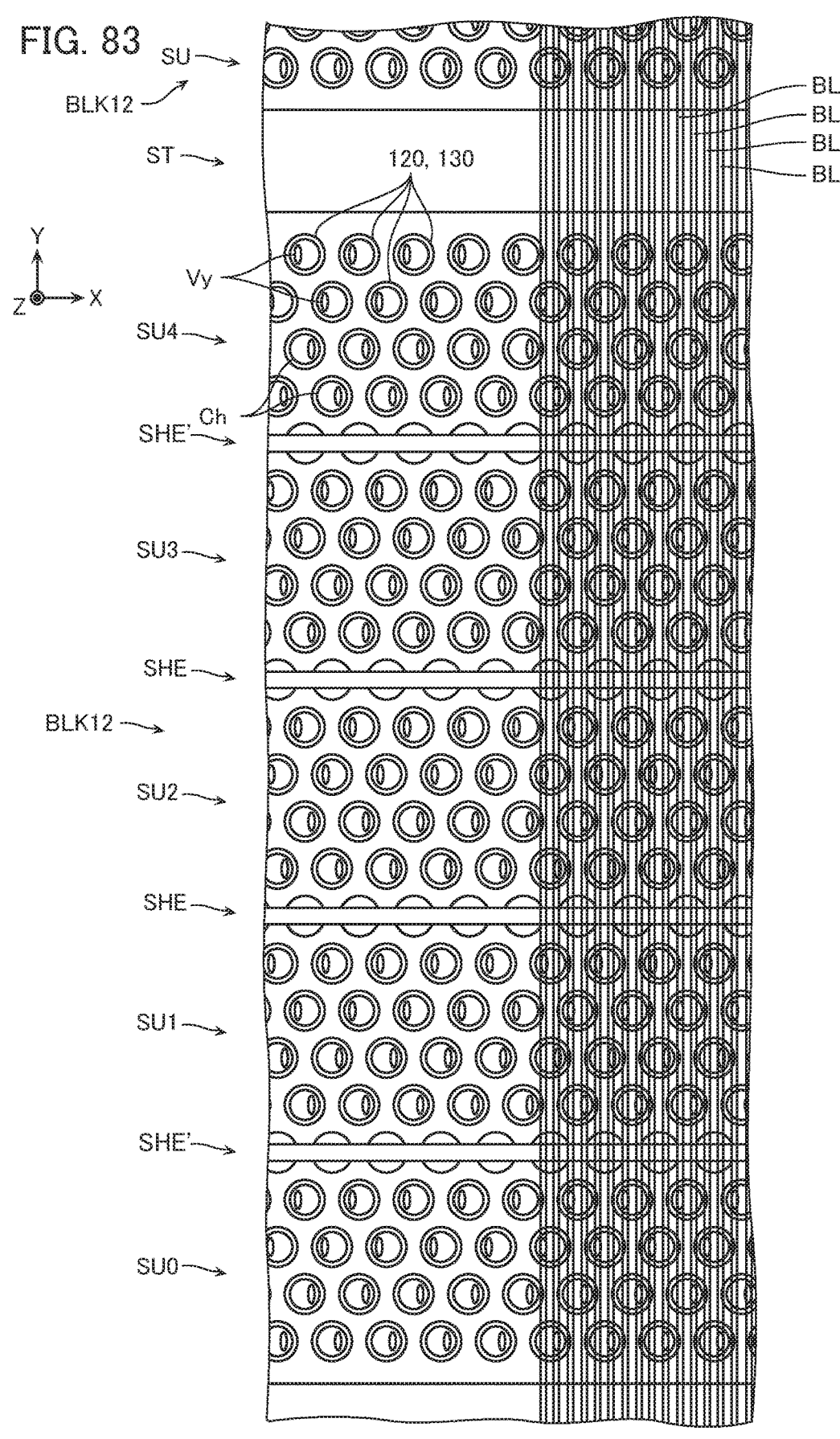
FIG. 83 is a schematic plan view illustrating a configuration of a part of a semiconductor memory device according to a twelfth embodiment.
Figure 84:
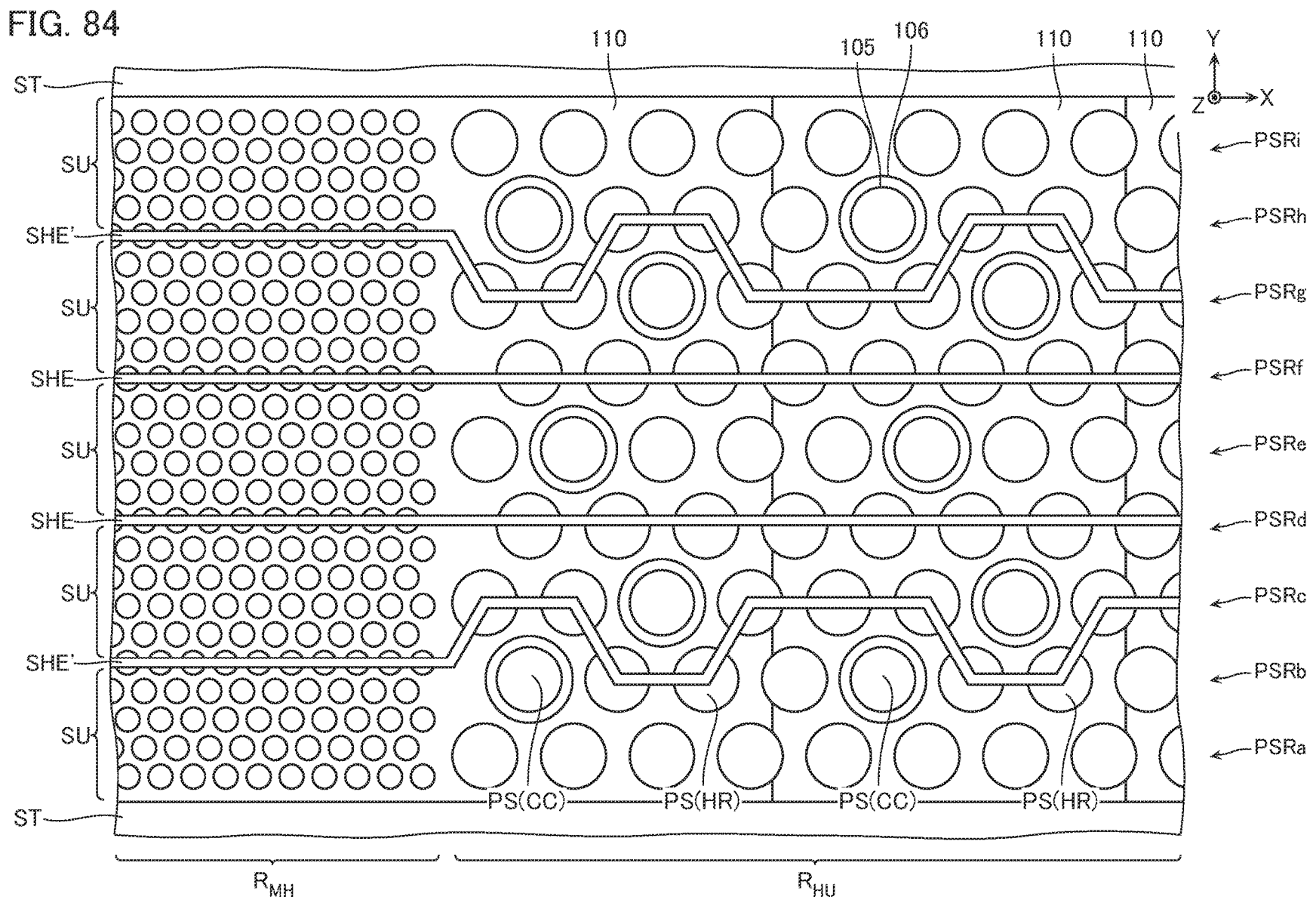

Next, with reference to FIG. 83 and FIG. 84, a semiconductor memory device according to the twelfth embodiment will be described. FIG. 83 and FIG. 84 are schematic plan views illustrating a configuration of a part of the semiconductor memory device according to the twelfth embodiment.

The semiconductor memory device according to the twelfth embodiment is basically configured similarly to the semiconductor memory device according to the first embodiment. However, the semiconductor memory device according to the twelfth embodiment includes memory blocks BLK12 instead of the memory blocks BLK.

The memory block BLK12 is basically configured similarly to the memory block BLK.

However, as described with reference to FIG. 2, the memory block BLK includes the two finger structures FS arranged in the Y-direction. The finger structure FS includes the two string units SU arranged in the Y-direction. Between the two finger structures FS adjacent in the Y-direction, the inter-finger structure insulating layer ST of, for example, silicon oxide ($SiO_2$) extending in the X-direction is disposed. Between the two string units SU adjacent in the Y-direction, the inter-string unit insulating layer SHE of, for example, silicon oxide ($SiO_2$) extending in the X-direction is disposed.

Meanwhile, as illustrated in FIG. 83, the memory block BLK12 includes the five string units SU arranged in the Y-direction. In the example of FIG. 83, these five string units SU are indicated as the string units SU0 to SU4 in the order of disposed at the negative side in the Y-direction. Between the two memory blocks BLK12 adjacent in the Y-direction, the inter-finger structure insulating layer ST of, for example, silicon oxide ($SiO_2$) extending in the X-direction is disposed. Additionally, between the second and third string units SU1 and SU2 and between the third and fourth string units SU2 and SU3 counted from one side in the Y-direction, the inter-string unit insulating layers SHE are disposed. Additionally, between the first and second string units SU0 and SU1 and between the fourth and fifth string units SU3 and SU4 counted from one side in the Y-direction, the inter-string unit insulating layers SHE' described with reference to FIG. 79 are disposed.

As described with reference to FIG. 3, in the semiconductor memory device according to the first embodiment, the hook-up region $R_{HU}$ in the finger structure FS includes the five columnar structure regions PSR arranged in the Y-direction. Additionally, the second and fourth columnar structure regions PSR1 and PSR3 counted from one side in the Y-direction include the contact electrodes CC.

Meanwhile, as illustrated in FIG. 84, in the semiconductor memory device according to the twelfth embodiment, the hook-up region $R_{HU}$ in the memory block BLK12 includes the nine columnar structure regions PSR arranged in the Y-direction. FIG. 84 indicates these nine columnar structure regions PSR as columnar structure regions PSRa to PSRi in the order of disposed at the negative side in the Y-direction. The second, third, fifth, seventh, and eighth columnar structure regions PSRb, PSRc, PSRe, PSRg, and PSRh counted from one side in the Y-direction include the contact electrodes CC.

Note that in the example of FIG. 84, the semiconductor memory device according to the twelfth embodiment includes the contact electrodes CC. However, the semiconductor memory device according to the twelfth embodiment may include the contact electrodes CC3 (FIG. 47), the contact electrodes CC4 (FIG. 55), or the contact electrodes CC5 (FIG. 68) instead of the contact electrodes CC.

In the example of FIG. 84, the semiconductor memory device according to the twelfth embodiment includes the conductive layers 110. However, the semiconductor memory device according to the twelfth embodiment may include the conductive layers 410 instead of the conductive layers 110.

Additionally, in the example of FIG. 84, the semiconductor memory device according to the twelfth embodiment includes the plurality of supporting structures HR. However, in the semiconductor memory device according to the twelfth embodiment, at least a part of the plurality of supporting structures HR may be exchanged for the supporting structure HR6 (FIG. 76) or the supporting structure HR7 (FIG. 77).

Thirteenth Embodiment

Figure 85:
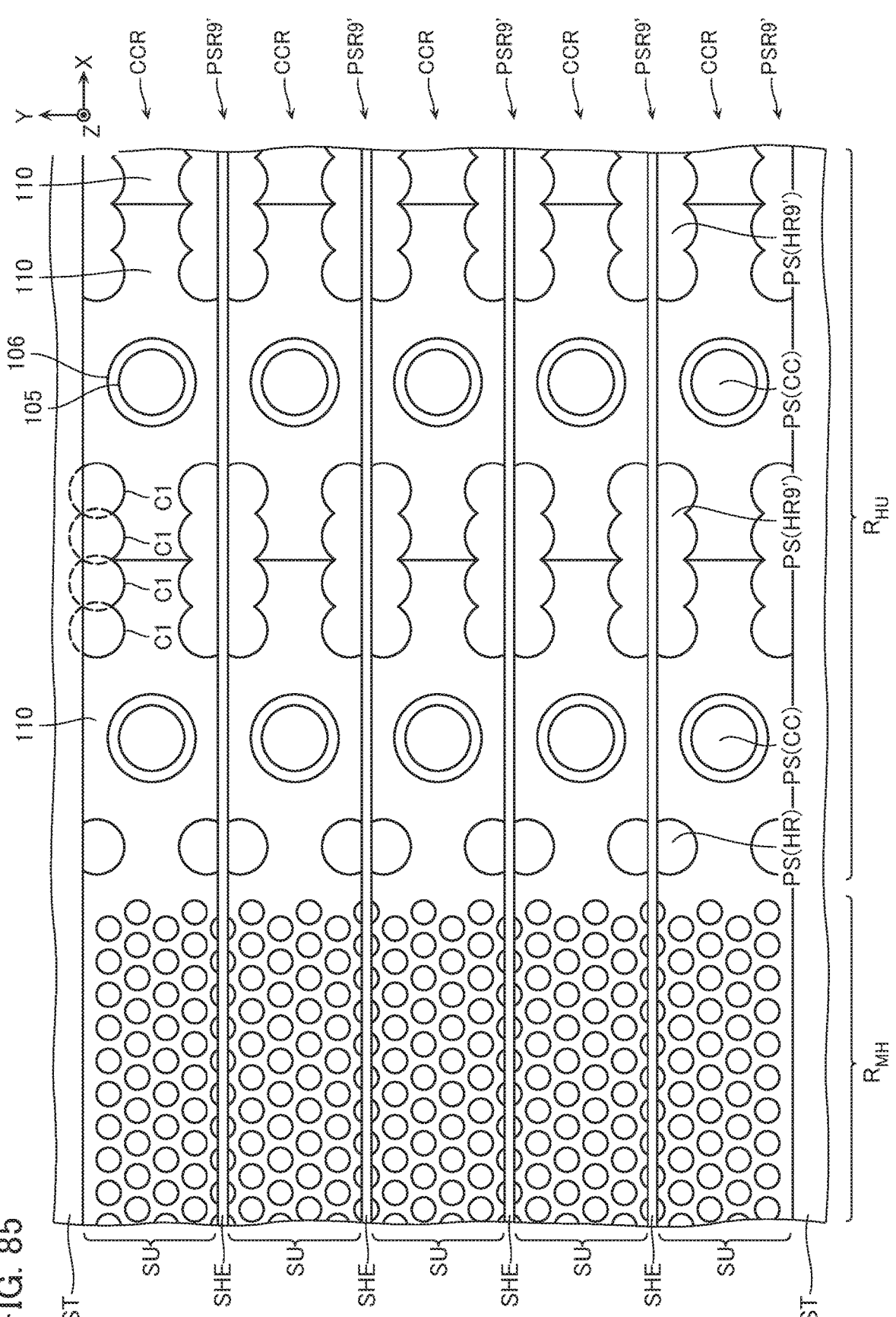
FIG. 85 is a schematic plan view illustrating a configuration of a part of a semiconductor memory device according to a thirteenth embodiment.

Next, with reference to FIG. 85, a semiconductor memory device according to the thirteenth embodiment will be described. FIG. 85 is a schematic plan view illustrating a configuration of a part of the semiconductor memory device according to the thirteenth embodiment.

The semiconductor memory device according to the thirteenth embodiment is basically configured similarly to the semiconductor memory device according to the twelfth embodiment.

However, as described with reference to FIG. 84, the semiconductor memory device according to the twelfth embodiment includes the plurality of columnar structure regions PSR arranged in the Y-direction corresponding to one finger structure FS. Meanwhile, as illustrated in FIG. 85, the semiconductor memory device according to the thirteenth embodiment includes the plurality of (five in the illustrated example) contact electrode regions CCR and a plurality of (six in the illustrated example) columnar structure regions PSR9' arranged in alternation in the Y-direction are disposed corresponding to one memory block BLK12.

Each of the columnar structure regions PSR9' includes a plurality of supporting structures HR9' arranged in the X-direction and the supporting structures HR disposed between these plurality of supporting structures HR9' and the memory hole region $R_{MH}$. The supporting structure HR9' is basically configured similarly to the supporting structure HR9 described with reference to FIG. 80. However, as described with reference to FIG. 80, the outer peripheral surface of the supporting structure HR9 is formed along the three circles C1 arranged in the X-direction. Meanwhile, the outer peripheral surface of the supporting structure HR9' is formed along the four circles C1 arranged in the X-direction.

Note that in the example of FIG. 85, the semiconductor memory device according to the thirteenth embodiment includes the contact electrodes CC. However, the semiconductor memory device according to the thirteenth embodiment may include the contact electrodes CC3 (FIG. 47), the contact electrodes CC4 (FIG. 55), or the contact electrodes CC5 (FIG. 68) instead of the contact electrodes CC.

In the example of FIG. 85, the semiconductor memory device according to the thirteenth embodiment includes the conductive layers 110. However, the semiconductor memory device according to the thirteenth embodiment may include the conductive layers 410 instead of the conductive layers 110.

In the example of FIG. 85, the semiconductor memory device according to the thirteenth embodiment includes the four inter-string unit insulating layers SHE. However, in the semiconductor memory device according to the thirteenth embodiment, at least apart of the inter-string unit insulating layer SHE among the plurality of inter-string unit insulating layers SHE may be exchanged for the inter-string unit insulating layer SHE'.

In the example of FIG. 85, the outer peripheral surface of the supporting structure HR9' is formed along the plurality of circles C1 arranged in the X-direction. However, like the supporting structure HR10 (FIG. 81), for example, the outer peripheral surface of the supporting structure HR9' may be formed along the plurality of circles C2 arranged in the X-direction and at least one circle C3 at the position in the Y-direction different from those of these plurality of circles C2. The outer peripheral surface of the supporting structure HR9' may be, for example, formed in the oval shape (the race track shape) like the supporting structure HR11 (FIG. 82) or may have any shape including the elliptical shape.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a source layer including a first surface provided at a first position in a first direction intersecting with the first surface of the source layer, the first surface extending in a second direction intersecting with the first direction and a third direction intersecting with the first direction and the second direction;
a semiconductor layer extending in the first direction;
a first conductive layer stacked above the source layer, extending in the second direction, and opposed to the semiconductor layer;
a second conductive layer stacked above the first conductive layer, extending in the second direction, and opposed to the semiconductor layer;
an electric charge accumulating layer disposed between the semiconductor layer and the first conductive layer, and between the semiconductor layer and the second conductive layer;
a first contact electrode extending in the first direction, including an end in the first direction provided under the first position in the first direction, and connected to the second conductive layer; and
an insulating layer provided between the end in the first direction of the first contact electrode and the source layer,
wherein:
the second conductive layer includes:
a first part opposed to the semiconductor layer; and a second part connected to the first contact electrode, and
a thickness of the second part in the first direction is greater than a thickness of the first part in the first direction.

2. The semiconductor memory device according to claim 1, wherein:
the first contact electrode includes:
a third part extending in the first direction and opposed to the first conductive layer; and
a fourth part connected to the second part of the second conductive layer,
in a first cross-sectional surface parallel to a plane extending in the second direction and the third direction and including the fourth part, the second conductive layer surrounds an outer peripheral surface of the fourth part and is connected to the outer peripheral surface of the fourth part, and
in a second cross-sectional surface parallel to a plane extending in the second direction and the third direction and including the third part, the first conductive layer surrounds an outer peripheral surface of the third part and is spaced apart from the outer peripheral surface of the third part.

3. The semiconductor memory device according to claim 2, wherein a width of the first contact electrode in the first cross-sectional surface is the same as or larger than a width of the first contact electrode in the second cross-sectional surface.

4. The semiconductor memory device according to claim 2, wherein a width of the first contact electrode in the first cross-sectional surface is smaller than a width of the first contact electrode in the second cross-sectional surface.

5. The semiconductor memory device according to claim 1, further comprising:
a second insulating layer extending in the first direction and connected to the first conductive layer,
wherein a width of the second insulating layer in the second direction is greater than a width of the second insulating layer in the third direction.

6. The semiconductor memory device according to claim 1, comprising:
a memory region comprising the semiconductor layer, the first conductive layer, and the electric charge accumulation layer; and
a contact region adjacent to the memory region in the second direction,
wherein:
the contact region includes a plurality of columnar structures arranged in the second direction at a predetermined pitch,
each of the plurality of columnar structures extends in the first direction, and
the first contact electrode is one of the plurality of columnar structures.

7. The semiconductor memory device according to claim 1, comprising:
a memory region comprising the semiconductor layer, the first conductive layer, and the electric charge accumulation layer; and
a plurality of contact regions adjacent to the memory region in the second direction and arranged in the third direction,
wherein:
each of the plurality of contact regions includes a plurality of columnar structures arranged in the second direction at a predetermined pitch, each of the plurality of columnar structures extends in the first direction, and in a first cross-sectional surface extending in the second direction and the third direction, the plurality of columnar structures include:

a first columnar structure;

a second columnar structure adjacent to the first columnar structure in the second direction;

a third columnar structure adjacent to the first columnar structure in a direction of +40° to +80° with respect to the second direction; and a fourth columnar structure adjacent to the first columnar structure in a direction of −40° to −80° with respect to the second direction.

8. The semiconductor memory device according to claim 1, further comprising:

a plurality of second regions and a plurality of third regions alternately arranged in the third direction, wherein:

the plurality of second regions include a plurality of second contact electrodes arranged in the second direction, each of the plurality of second contact electrodes extends in the first direction, the first contact electrode is one of the plurality of second contact electrodes, the plurality of third regions include a plurality of third insulating layers arranged in the second direction, and each of the plurality of third insulating layers extends in the first direction.

* * * * *